United States Patent
Kubota

(10) Patent No.: US 9,530,804 B2
(45) Date of Patent: Dec. 27, 2016

(54) DISPLAY DEVICE

(71) Applicant: SEMICONDUCTOR ENERGY LABORATORY CO., LTD., Atsugi-shi, Kanagawa-ken (JP)

(72) Inventor: Daisuke Kubota, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 138 days.

(21) Appl. No.: 14/517,986

(22) Filed: Oct. 20, 2014

(65) Prior Publication Data
US 2015/0109553 A1    Apr. 23, 2015

(30) Foreign Application Priority Data

Oct. 22, 2013 (JP) ................................ 2013-219516
Mar. 11, 2014 (JP) ................................ 2014-047260

(51) Int. Cl.
*G02F 1/1368* (2006.01)
*G02F 1/1333* (2006.01)
(Continued)

(52) U.S. Cl.
CPC ......... *H01L 27/1255* (2013.01); *G02F 1/1368* (2013.01); *H01L 27/1225* (2013.01);
(Continued)

(58) Field of Classification Search
CPC .............. G02F 1/1368; G02F 1/133345; G02F 1/133707; G02F 1/133711; H01L 29/786; H01L 29/78606; H01L 29/7869; H01L 27/3246; H01L 27/1255; H01L 27/1225
See application file for complete search history.

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

CN    101794821 A    8/2010
CN    102473731 A    5/2012
(Continued)

OTHER PUBLICATIONS

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
(Continued)

*Primary Examiner* — Paul Lee
*Assistant Examiner* — Jia Pan
(74) *Attorney, Agent, or Firm* — Nixon Peobody LLP.; Jeffrey L. Costellia

(57) ABSTRACT

A display device with excellent display quality is provided. The display device includes a transistor over a first substrate, an inorganic insulating film in contact with the transistor, and an organic insulating film in contact with the inorganic insulating film. The transistor includes a gate electrode over the first substrate, an oxide semiconductor film overlapping with the gate electrode, a gate insulating film in contact with one surface of the oxide semiconductor film, and a pair of electrodes in contact with the oxide semiconductor film. The inorganic insulating film is in contact with the other surface of the oxide semiconductor film. The organic insulating film overlaps with the oxide semiconductor film with the inorganic insulating film provided therebetween and is separated. Note that the thickness of the organic insulating film is preferably greater than or equal to 500 nm and less than or equal to 10 μm.

20 Claims, 35 Drawing Sheets

(51) Int. Cl.
  *H01L 29/786* (2006.01)
  *H01L 27/12* (2006.01)
  *G02F 1/1339* (2006.01)

(52) U.S. Cl.
  CPC .... *H01L 29/7869* (2013.01); *H01L 29/78606* (2013.01); *G02F 1/1339* (2013.01); *G02F 1/133345* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,247,811 B2 | 8/2012 | Morosawa et al. |
| 8,384,080 B2 | 2/2013 | Taniguchi et al. |
| 8,432,502 B2 | 4/2013 | Yamazaki et al. |
| 8,900,916 B2 | 12/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0185094 A1* | 7/2009 | Lee .................. G02F 1/13394 349/46 |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0193784 A1 | 8/2010 | Morosawa et al. |
| 2011/0008931 A1 | 1/2011 | Yamazaki et al. |
| 2011/0095288 A1 | 4/2011 | Morosawa et al. |
| 2011/0128491 A1* | 6/2011 | Kubota ............. G02F 1/133707 349/139 |
| 2011/0134350 A1* | 6/2011 | Yamazaki ............. G02F 1/1368 349/43 |
| 2011/0242468 A1* | 10/2011 | Choi ..................... C08G 8/12 349/129 |
| 2014/0034954 A1 | 2/2014 | Yamazaki et al. |
| 2014/0070209 A1 | 3/2014 | Yamazaki et al. |
| 2014/0110701 A1* | 4/2014 | Noh .................... H01L 27/3211 257/43 |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2010-016163 A | 1/2010 |
| JP | 2010-182818 A | 8/2010 |
| JP | 2011-035389 A | 2/2011 |

(56) References Cited

FOREIGN PATENT DOCUMENTS

| JP | 2011-138117 A | 7/2011 |
|---|---|---|
| JP | 2011-138934 A | 7/2011 |
| KR | 2012-0049880 A | 5/2012 |
| KR | 2012-0105501 A | 9/2012 |
| TW | 201130054 | 9/2011 |
| TW | 201207533 | 2/2012 |
| WO | WO-2004/114391 | 12/2004 |
| WO | WO-2011/004724 | 1/2011 |
| WO | WO-2011/068106 | 6/2011 |

OTHER PUBLICATIONS

Asaoka.Y et al., "29.1: Polarizer-Free Reflective LCD Combined With Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973,vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SId Digest '09 : SID International Stmposium Digest of Technical Papers, May 31, 2009, pp. 983-985.

Kanno.H et al., "White Stacked Electrophosphorecent Organic Light-Emitting Devices Emplying MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in The In2O3 and Sc2O3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMo3(ZnO)m (M=In, Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors with Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs with a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)_m$ (m<4):a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$-ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

International Search Report (Application No. PCT/JP2014/077625) Dated Jan. 20, 2015.

Written Opinion (Application No. PCT/JP2014/077625) Dated Jan. 20, 2015.

\* cited by examiner

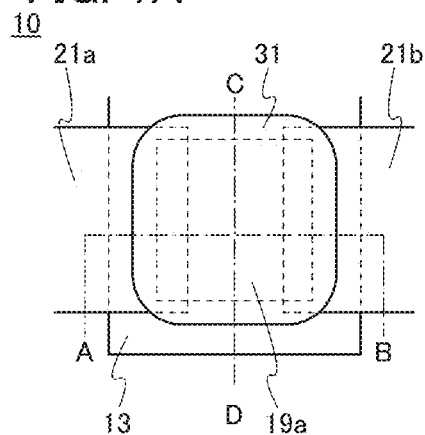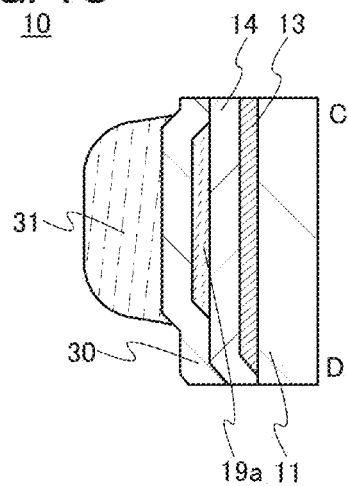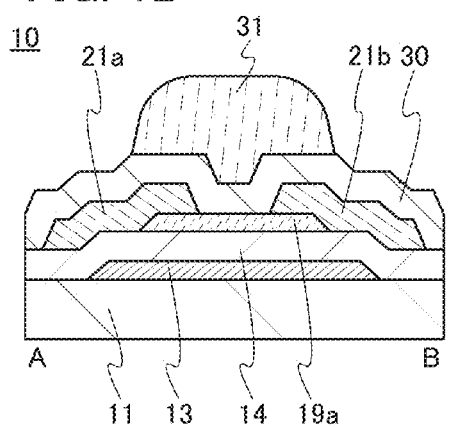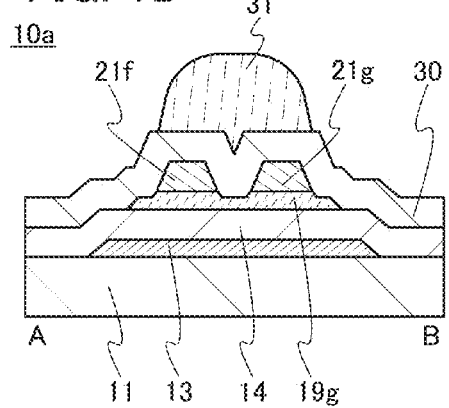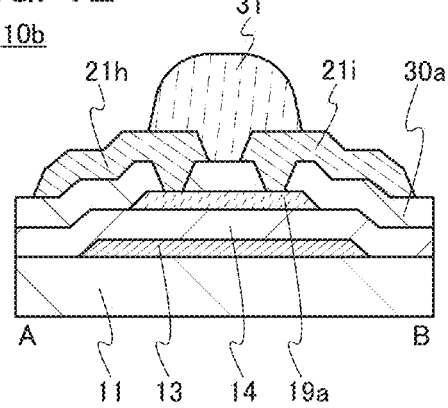

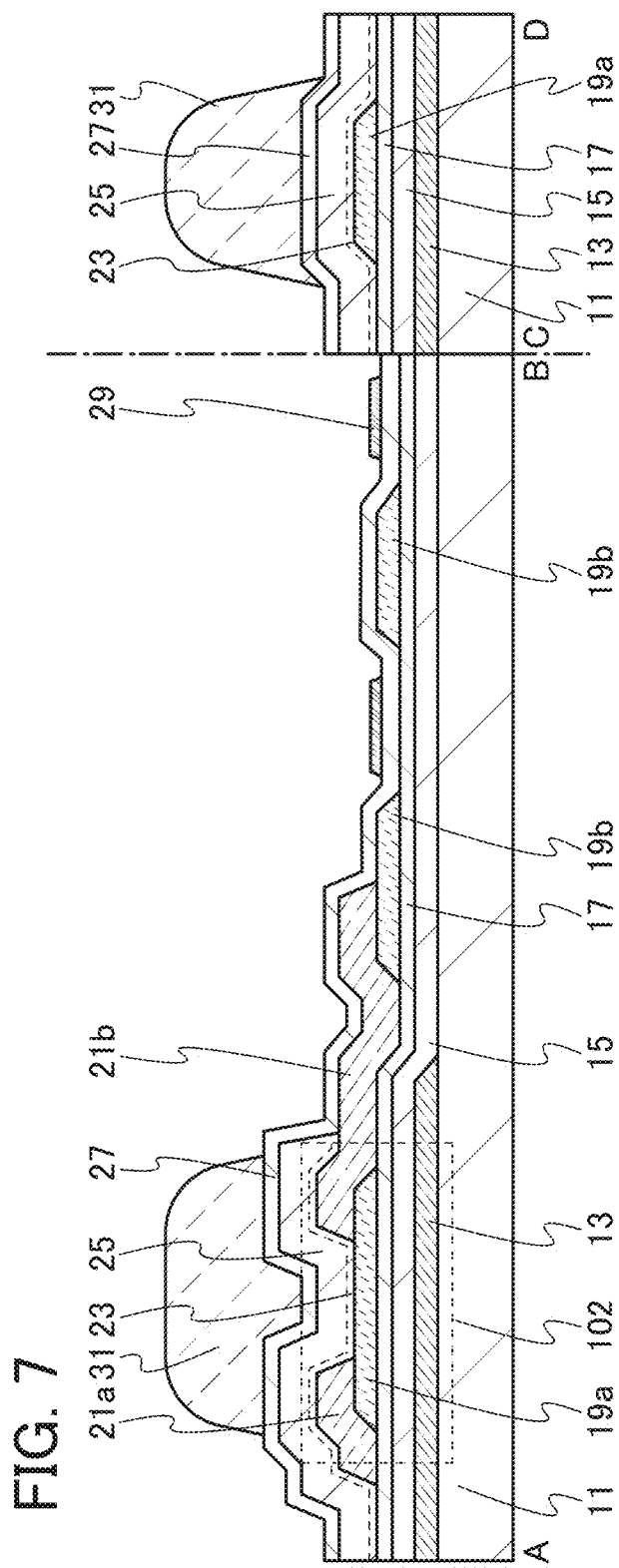

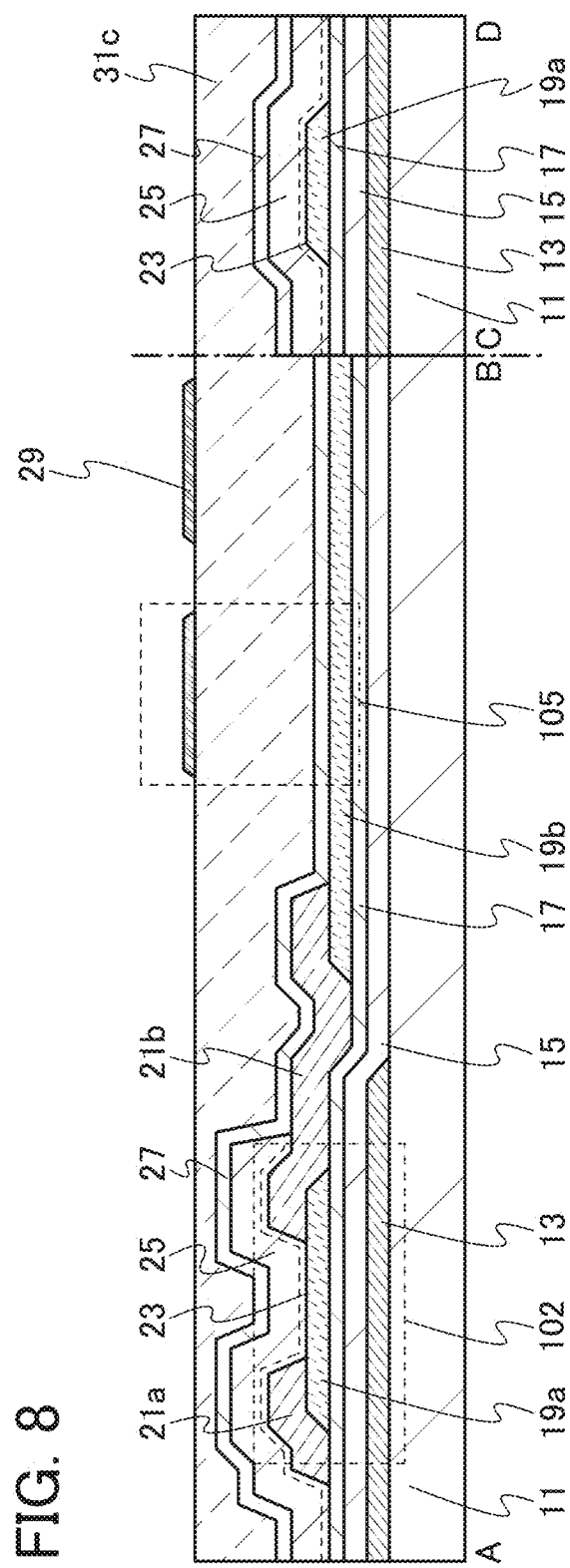

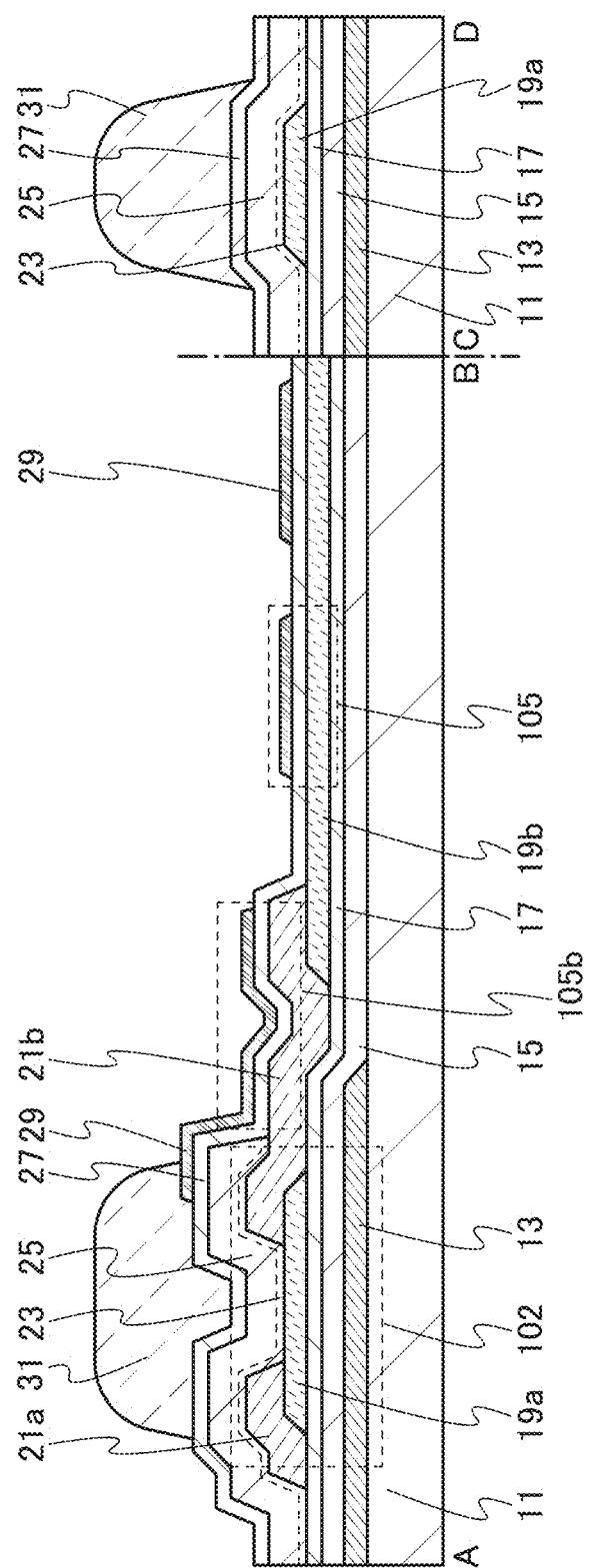

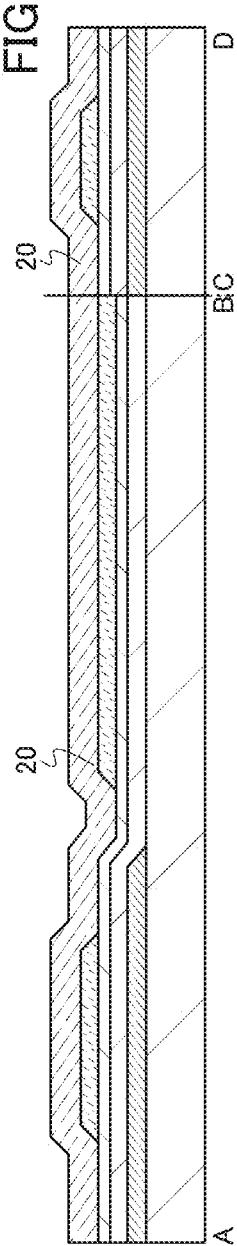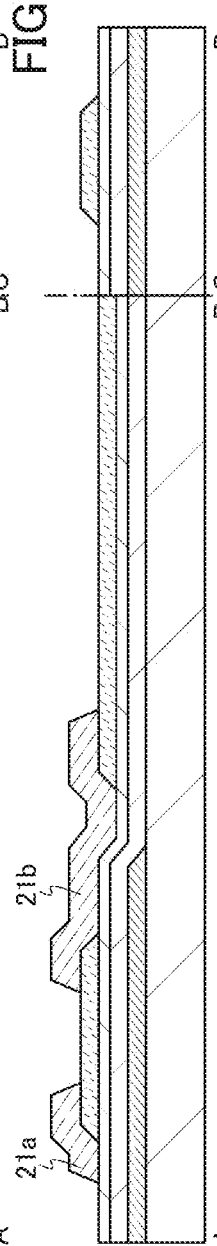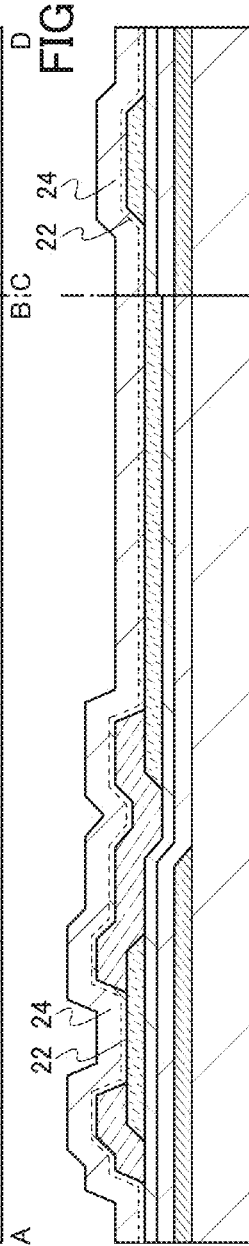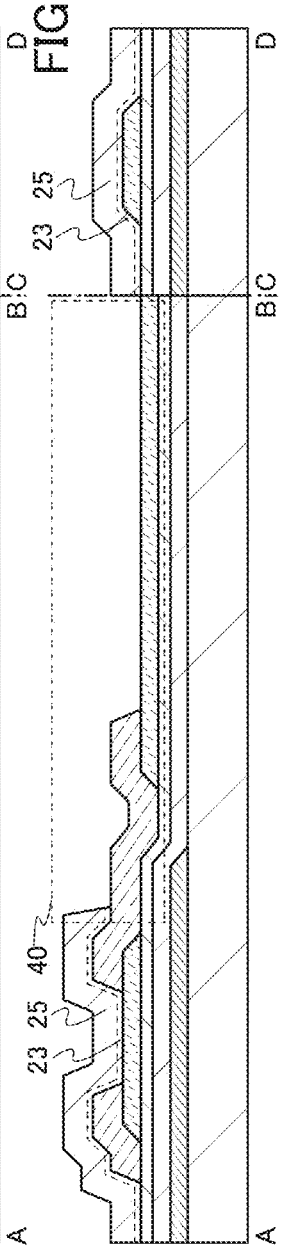

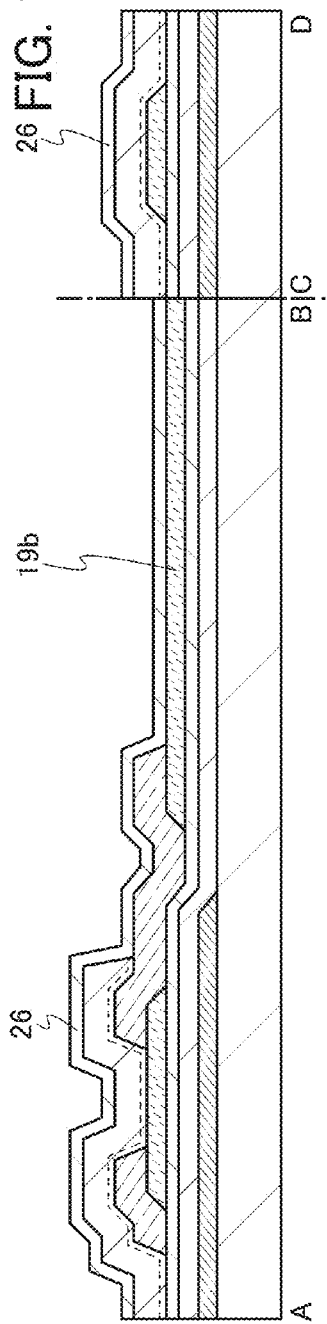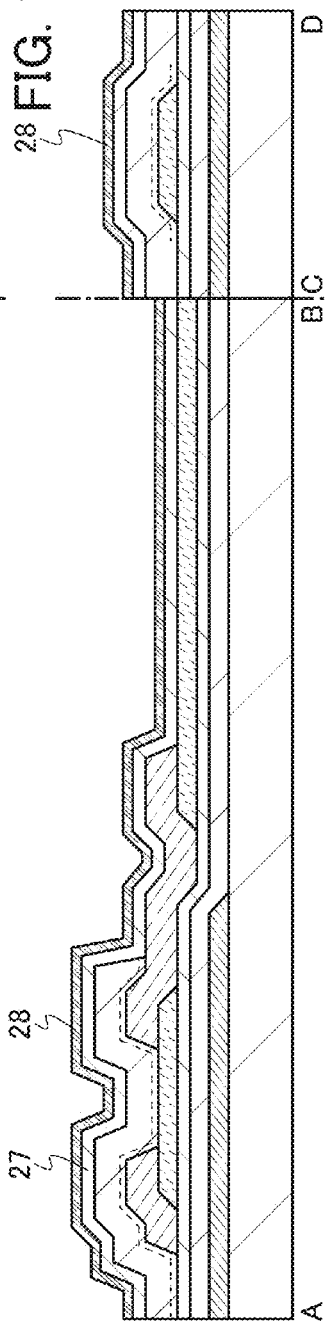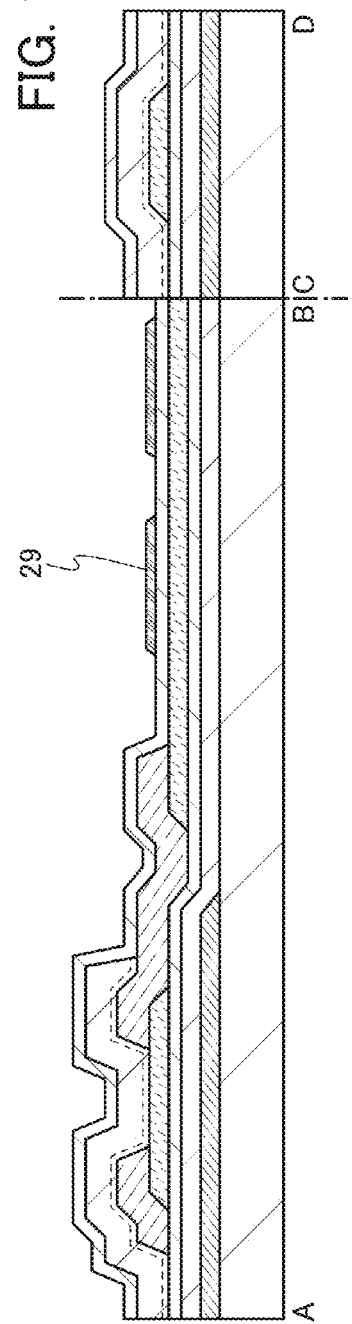

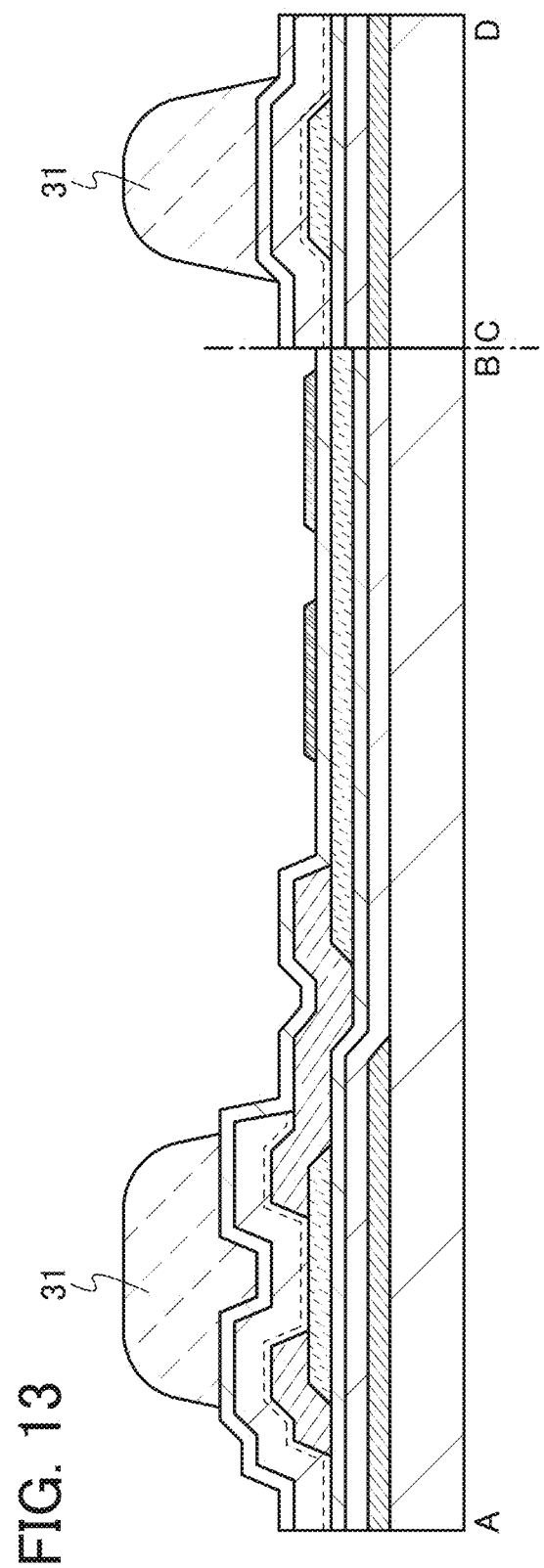

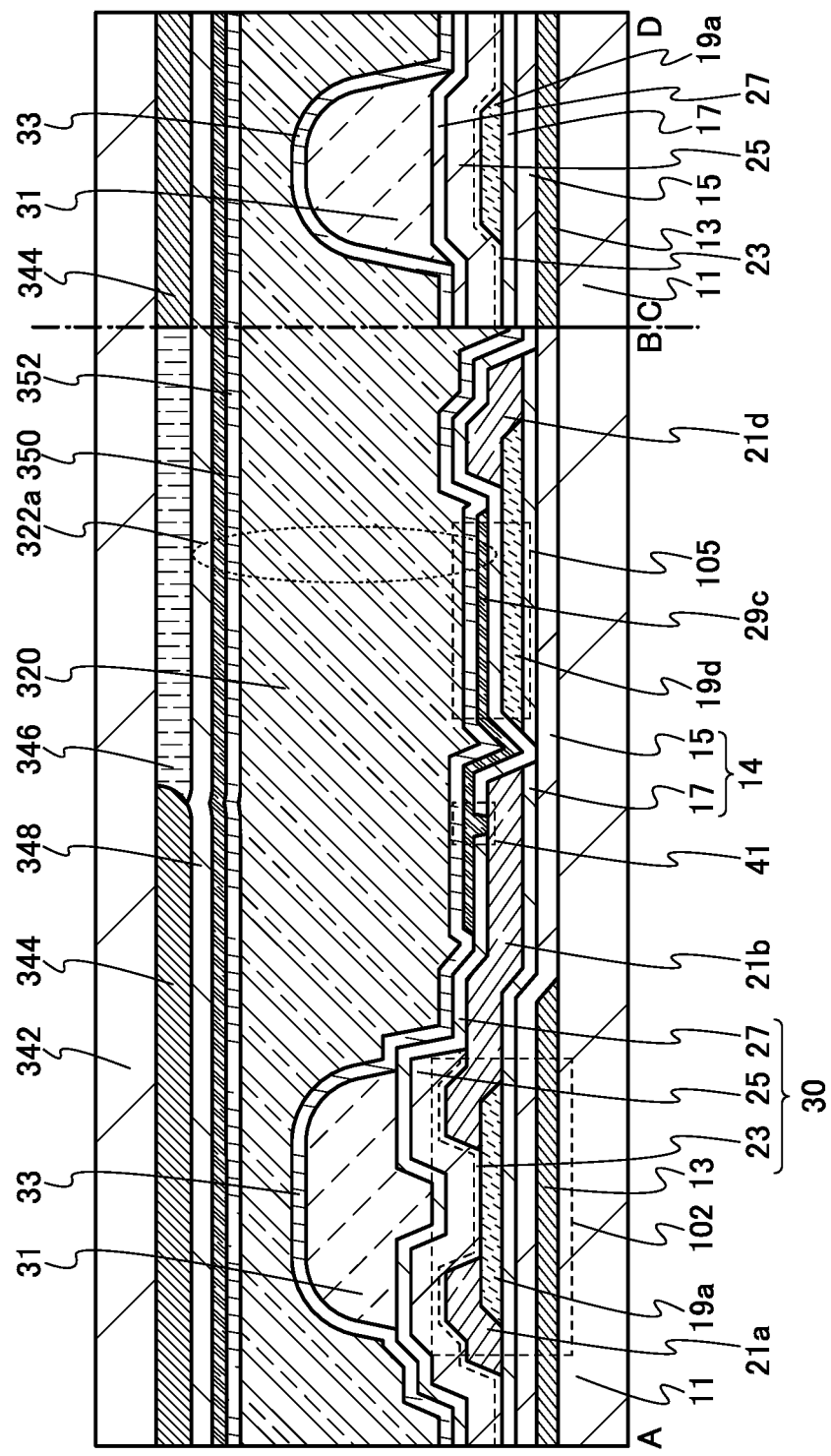

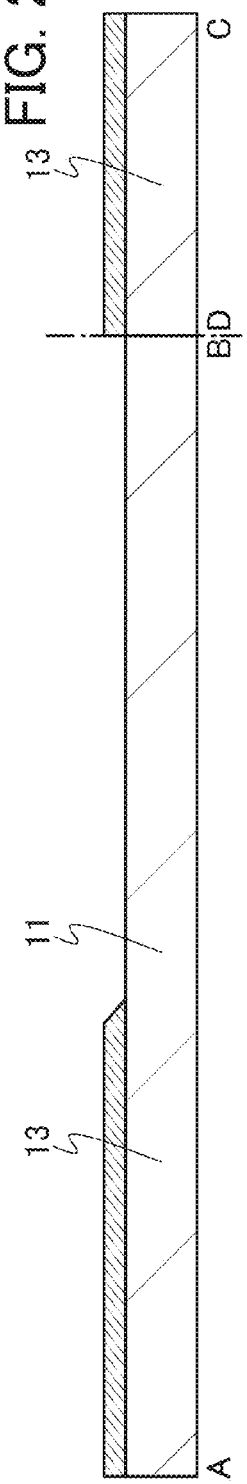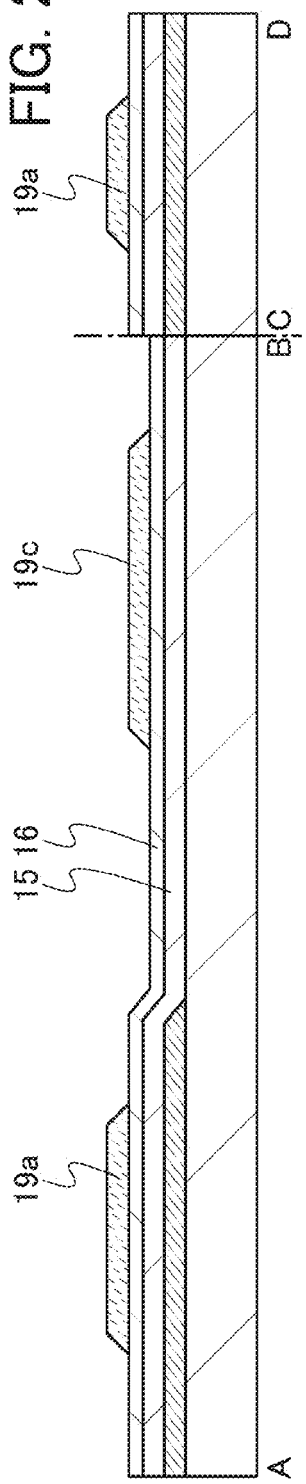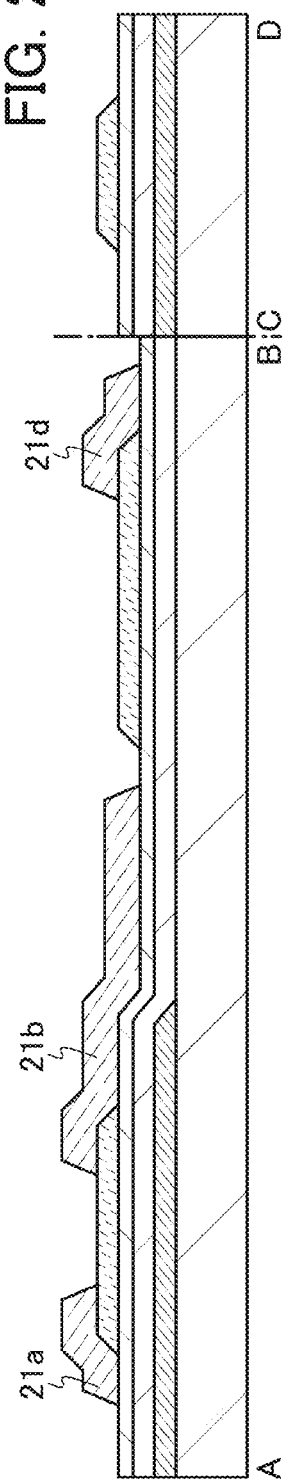

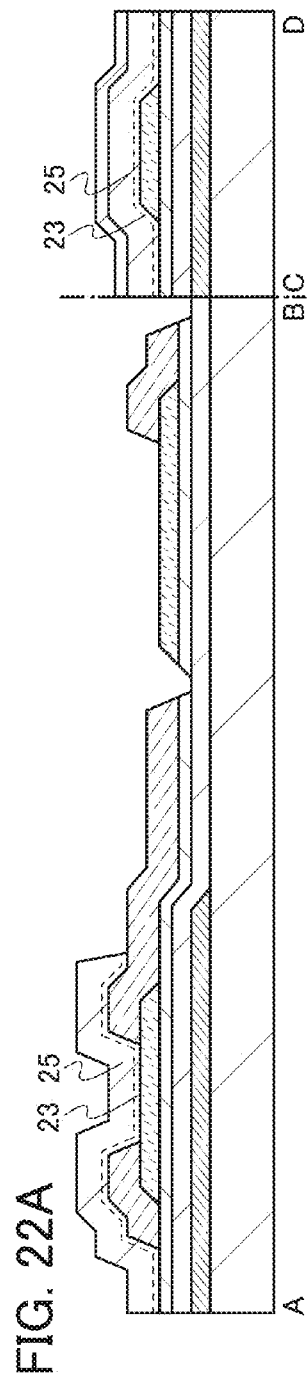
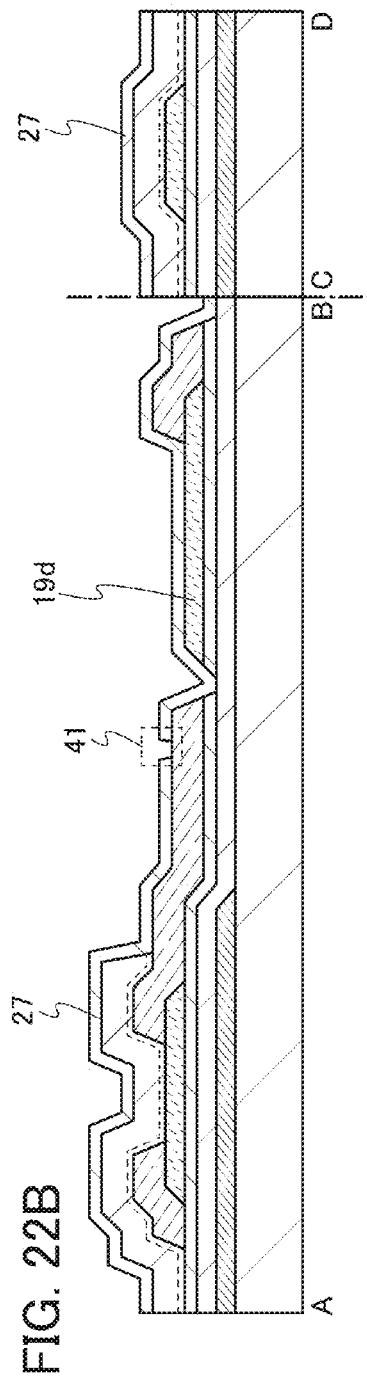
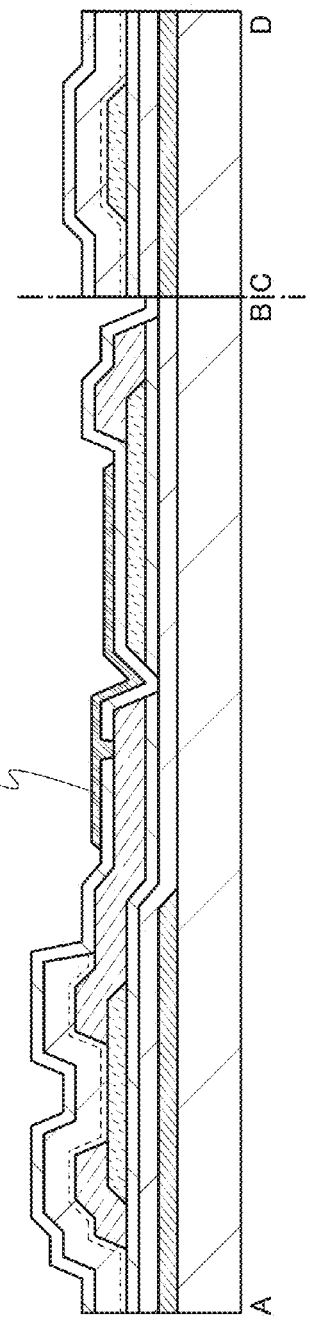

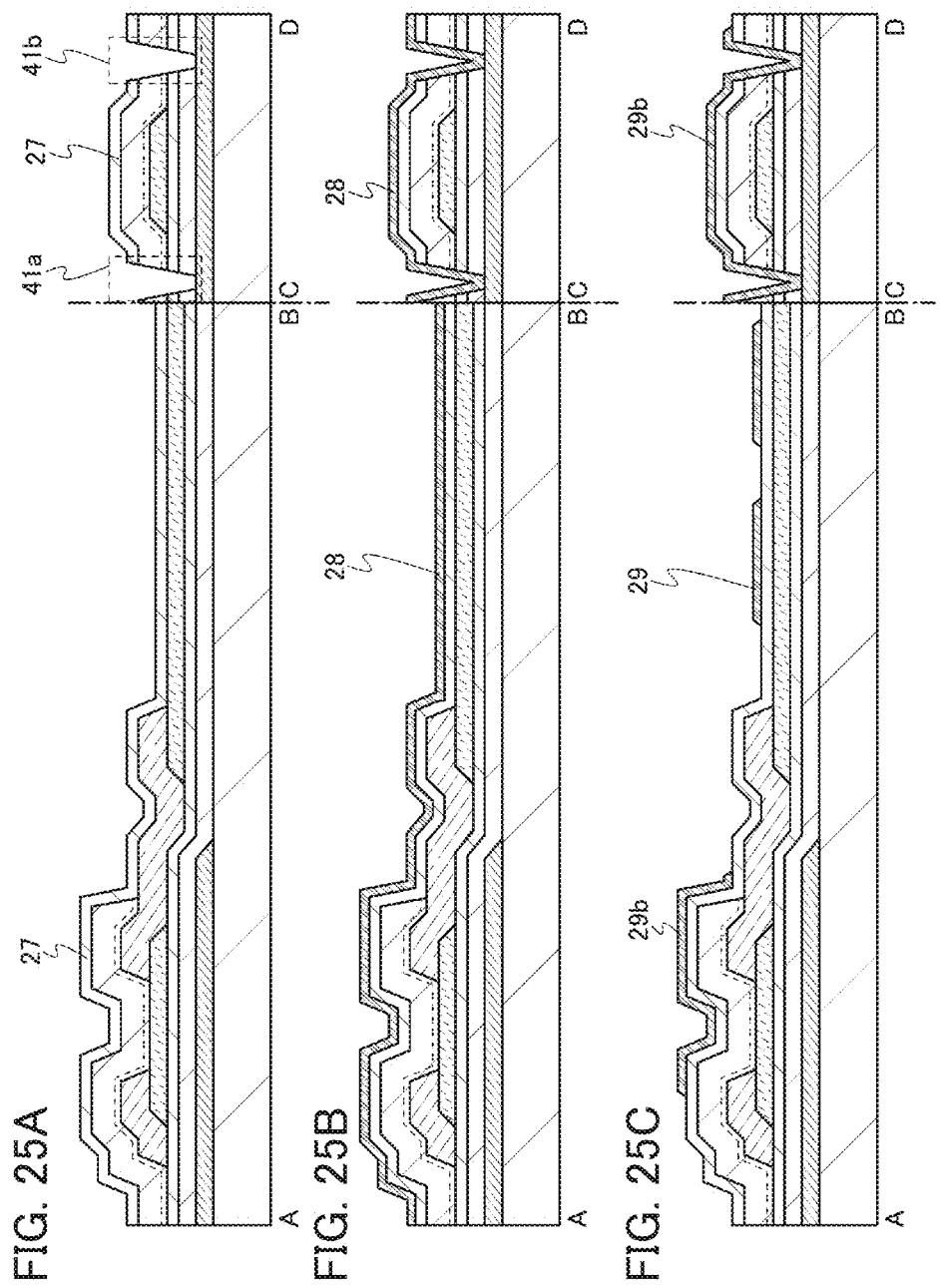

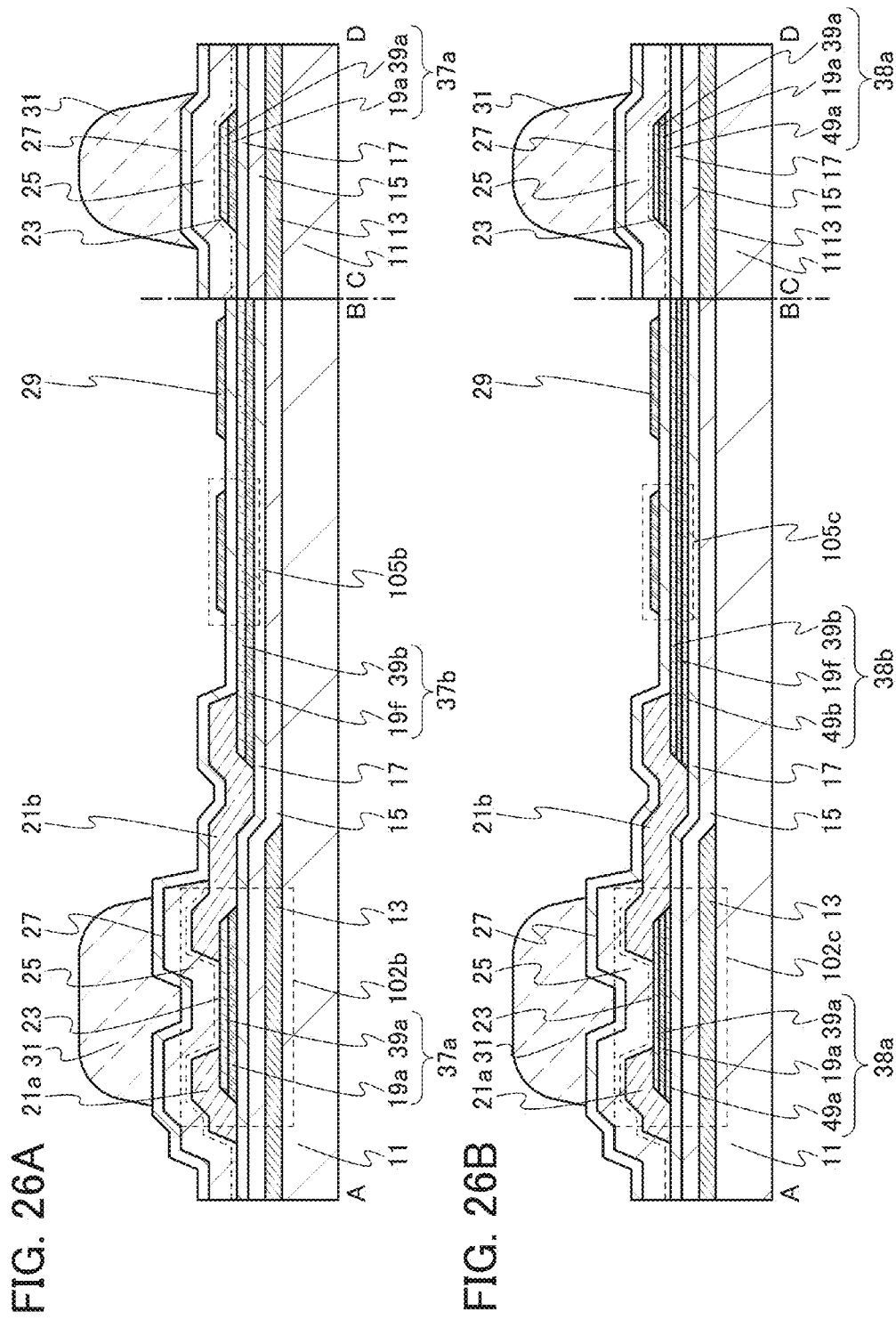

CAAC-OS nc-OS

☐ Proportion of non-CAAC   ☱ Proportion of CAAC

As-sputtered

After heat treatment at 450 °C

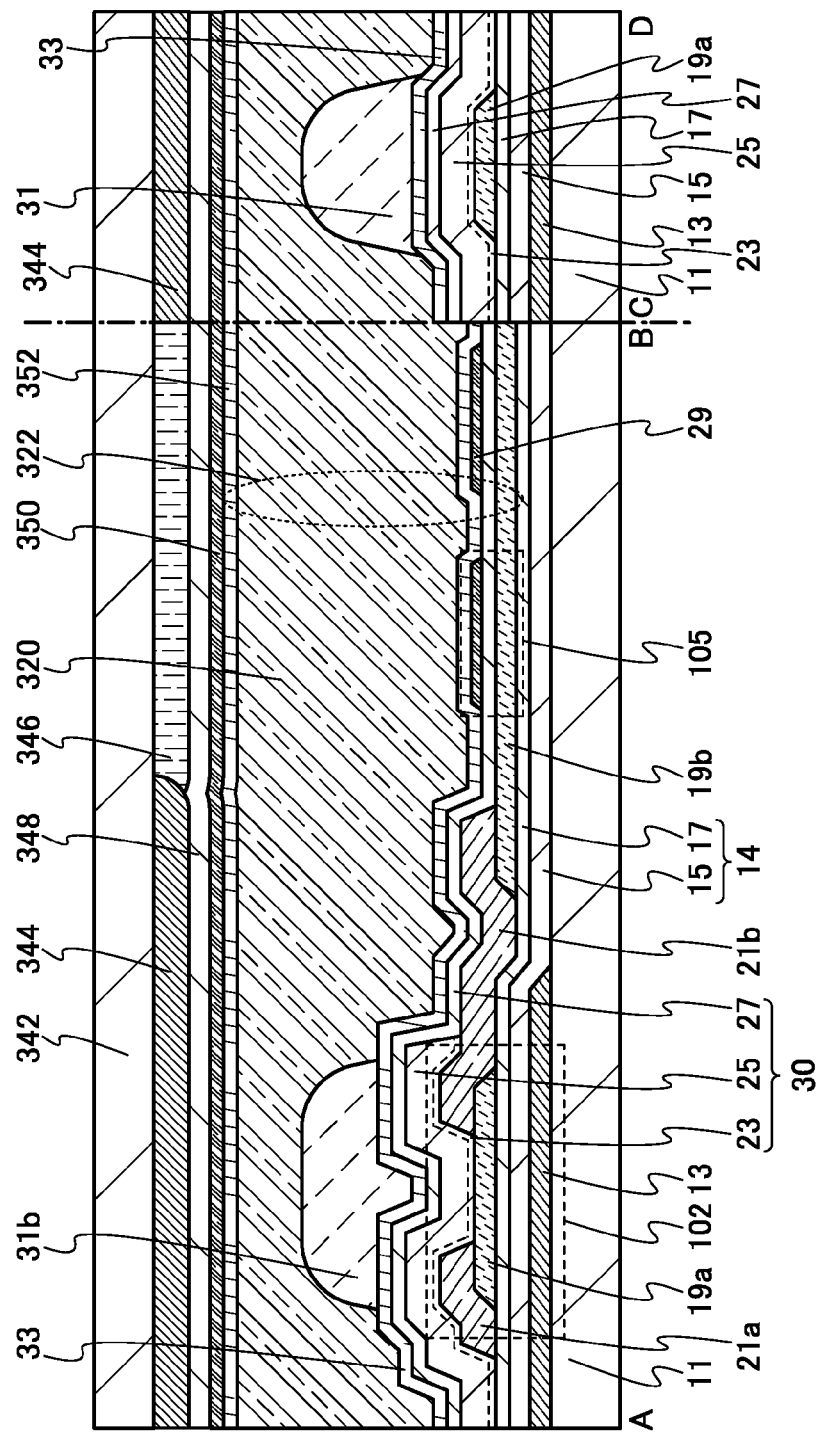

DISPLAY DEVICE

TECHNICAL FIELD

The present invention relates to an object, a method, or a manufacturing method. In addition, the present invention relates to a process, a machine, manufacture, or a composition of matter. One embodiment of the present invention particularly relates to a semiconductor device, a display device, a light-emitting device, a power storage device, a driving method thereof, or a manufacturing method thereof. Specifically, one embodiment of the present invention relates to a display device and a manufacturing method thereof

BACKGROUND ART

Attention has been focused on a technique for forming a transistor using a semiconductor thin film formed over a substrate (also referred to as a thin film transistor (TFT)). Such a transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor including an oxide semiconductor containing indium (In), gallium (Ga), and zinc (Zn) as an active layer is disclosed (see Patent Document 1).

In addition, a technique for improving carrier mobility by forming a stack of oxide semiconductor films that is used for an active layer of a transistor has been disclosed (see Patent Document 2).

It has been pointed out that by entry of impurities such as hydrogen, an electrically shallow donor level is formed and electrons to be carriers are generated in an oxide semiconductor. As a result, the threshold voltage of a transistor including an oxide semiconductor is shifted in the negative direction and the transistor becomes normally-on, so that leakage current in a state where voltage is not applied to the gate (that is, in the off state) is increased. Thus, the entry of hydrogen into an oxide semiconductor film is suppressed by providing an aluminum oxide film having a property of blocking hydrogen over the entire region of a substrate so as to cover a channel region in the oxide semiconductor film, a source electrode, and a drain electrode, so that generation of leakage current is suppressed (see Patent Document 3).

REFERENCE

Patent Document

[Patent Document 1] Japanese Published Patent Application No. 2006-165528
[Patent Document 2] Japanese Published Patent Application No. 2011-138934
[Patent Document 3] Japanese Published Patent Application No. 2010-016163

DISCLOSURE OF INVENTION

A transistor including an oxide semiconductor film has a problem in that the amount of change in electrical characteristics, typically threshold voltage, due to change over time or a stress test is increased. A transistor having normally-on characteristic causes various problems in that power consumption is increased when the transistor is not in operation or that display quality is reduced due to a decrease in contrast of a display device, for example.

Thus, an object of one embodiment of the present invention is to provide a display device with excellent display quality. Another object of one embodiment of the present invention is to provide a display device having a high aperture ratio and including a capacitor which can increase charge capacity. Another object of one embodiment of the present invention is to provide a display device with low power consumption. Another object of one embodiment of the present invention is to provide a display device including a transistor having excellent electrical characteristics. Another object of one embodiment of the present invention is to provide a novel display device. Another object of one embodiment of the present invention is to provide a method for manufacturing a display device having a high aperture ratio and a wide viewing angle in fewer steps. Another object of one embodiment of the present invention is to provide a novel method for manufacturing a display device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

According to one embodiment of the present invention, a display device includes a transistor over a first substrate, an inorganic insulating film in contact with the transistor, and an organic insulating film in contact with the inorganic insulating film. The transistor includes a gate electrode over the first substrate, an oxide semiconductor film overlapping with the gate electrode, a gate insulating film in contact with one surface of the oxide semiconductor film, and a pair of electrodes in contact with the oxide semiconductor film. The inorganic insulating film is in contact with the other surface of the oxide semiconductor film. Note that the other surface of the oxide semiconductor film may be an upper surface of the oxide semiconductor film. The organic insulating film overlaps with the oxide semiconductor film with the inorganic insulating film provided therebetween and is isolated. Note that the thickness of the organic insulating film is preferably greater than or equal to 500 nm and less than or equal to 10 μm. Moreover, an end portion of the gate electrode is preferably positioned on an outer side of an end portion of the organic insulating film. Alternatively, an end portion of the gate electrode does not preferably overlap with the organic insulating film. Moreover, in a plan view, the organic insulating film may completely overlap with the oxide semiconductor film.

Note that the display device may further include a second substrate overlapping with the first substrate, the transistor and the organic insulating film between the first substrate and the second substrate, and a liquid crystal layer between the organic insulating film and the second substrate.

Alternatively, the display device may further include the second substrate overlapping with the first substrate, the transistor and the organic insulating film between the first substrate and the second substrate, and liquid crystal layer is not provided between the organic insulating film and the second substrate. In this case, the organic insulating film functions as a spacer for holding space between the first substrate and the second substrate.

The inorganic insulating film may include an oxide insulating film in contact with the other surface of the oxide semiconductor film and a nitride insulating film in contact with the oxide insulating film.

The display device may further include a pixel electrode connected to one of a pair of electrodes. In this case, the pixel electrode is formed using a light-transmitting conductive film. The display device may further include a metal oxide film formed in contact with the gate insulating film and the inorganic insulating film and overlapping with the pixel electrode with the inorganic insulating film provided therebetween. Note that an upper surface of the metal oxide film may be in contact with the inorganic insulating film. Note that the metal oxide film contains the same metal element as the oxide semiconductor film. Furthermore, the pixel electrode, the inorganic insulating film, and the metal oxide film function as a capacitor.

Alternatively, the pixel electrode may be a metal oxide film formed over the gate insulating film and containing the same metal element as the oxide semiconductor film. In this case, the display device further includes a light-transmitting conductive film overlapping with the pixel electrode with the inorganic insulating film provided therebetween, and the light-transmitting conductive film functions as a common electrode. Furthermore, the pixel electrode, the inorganic insulating film, and the light-transmitting conductive film function as a capacitor.

The oxide semiconductor film may contain an In—Ga oxide, In—Zn oxide, or an In-M-Zn oxide (M is Al, Ga, Y, Zr, Sn, La, Ce, or Nd). Alternatively, the oxide semiconductor film may have a multilayer structure of a first film and a second film, and the first film may differ from the second film in atomic ratio of metal elements.

According to one embodiment of the present invention, a display device with excellent display quality can be provided. A display device having a high aperture ratio and including a capacitor which can increase charge capacity can be provided. A display device with low power consumption can be provided. A display device including a transistor having excellent electrical characteristics can be provided. A display device having a high aperture ratio and a wide viewing angle in fewer steps can be manufactured. A novel display device can be provided. Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF DRAWINGS

FIGS. 1A to 1E are a top view and cross-sectional views illustrating one embodiment of a semiconductor device.

FIG. 7 is a cross-sectional view illustrating one embodiment of a display device.

FIG. 8 is a cross-sectional view illustrating one embodiment of a display device.

FIG. 9 is a cross-sectional view illustrating one embodiment of a display device.

FIGS. 11A to 11D are cross-sectional views illustrating one embodiment of a method for manufacturing a display device.

FIGS. 12A to 12C are cross-sectional views illustrating one embodiment of a method for manufacturing a display device.

FIG. 13 is a cross-sectional view illustrating one embodiment of a method for manufacturing a display device.

FIG. 20 is a cross-sectional view illustrating one embodiment of a display device.

FIGS. 21A to 21C are cross-sectional views illustrating one embodiment of a method for manufacturing a display device.

FIGS. 22A to 22C are cross-sectional views illustrating one embodiment of a method for manufacturing a display device.

FIGS. 25A to 25C are cross-sectional views illustrating one embodiment of a method for manufacturing a display device.

FIGS. 26A and 26B are each a cross-sectional view illustrating one embodiment of a display device.

FIG. 33 is a cross-sectional view illustrating one embodiment of a display device.

BEST MODE FOR CARRYING OUT THE INVENTION

Figure 2A:
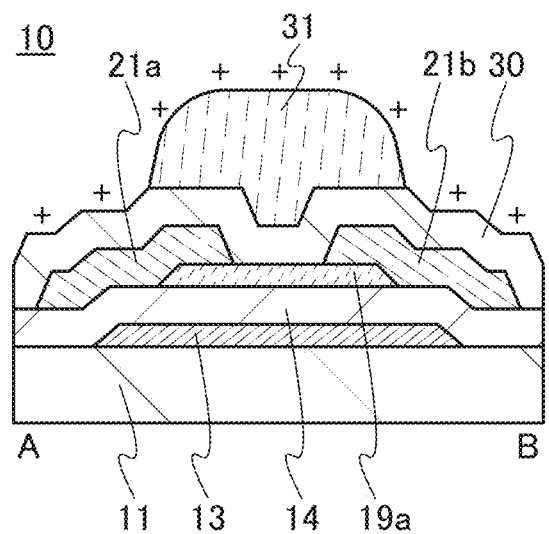
FIGS. 2A and 2B are cross-sectional views illustrating one embodiment of a semiconductor device.

Embodiments of the present invention will be described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description in the following embodiments. In addition, in the following embodiments, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, embodiments of the present invention are not limited to such a scale.

In addition, terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be used to denote the drain and the source, respectively, in this specification.

Note that a voltage refers to a difference between potentials of two points, and a potential refers to electrostatic energy (electric potential energy) of a unit charge at a given point in an electrostatic field. Note that in general, a difference between a potential of one point and a reference potential is merely called a potential or a voltage, and a potential and a voltage are used as synonymous words in many cases. Thus, in this specification, a potential may be rephrased as a voltage and a voltage may be rephrased as a potential unless otherwise specified.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

[Embodiment 1]

In this embodiment, a semiconductor device which is one embodiment of the present invention is described with reference to drawings.

FIGS. 1A to 1C are a top view and cross-sectional views of a transistor 10 included in a semiconductor device. FIG. 1A is a top view of the transistor 10, FIG. 1B is a cross-sectional view taken along dashed-dotted line A-B in FIG. 1A, and FIG. 1C is a cross-sectional view taken along dashed-dotted line C-D in FIG. 1A. Note that in FIG. 1A, a first substrate 11, a gate insulating film 14, an inorganic insulating film 30, and the like are omitted for simplicity.

The transistor 10 illustrated in FIGS. 1A to 1C is a channel-etched transistor and includes a conductive film 13 functioning as a gate electrode provided over the first substrate 11, the gate insulating film 14 formed over the first substrate 11 and the conductive film 13 functioning as a gate electrode, an oxide semiconductor film 19a overlapping with the conductive film 13 functioning as a gate electrode with the gate insulating film 14 provided therebetween, and conductive films 21a and 21b functioning as a source electrode and a drain electrode in contact with the oxide semiconductor film 19a. A first insulating film is provided over the gate insulating film 14, the oxide semiconductor film 19a, and the conductive films 21a and 21b, and a second insulating film overlapping with the oxide semiconductor film 19a is provided over the first insulating film.

The total thickness of the first insulating film and the second insulating film is preferably a thickness at which electric charges are not generated on the surface of the second insulating film when a voltage is applied to the conductive film 13 functioning as a gate electrode, typically a thickness greater than or equal to 600 nm. Note that in order to reduce the amount of defects at an interface with the oxide semiconductor film 19a, the first insulating film is preferably an inorganic insulating film, typically an oxide insulating film is included. In order to shorten the process time, the second insulating film is preferably an organic insulating film. In the following description, the inorganic insulating film 30 is used as the first insulating film, and an organic insulating film 31 is used as the second insulating film. Moreover, an end portion of the gate electrode is positioned on an outer side of an end portion of the organic insulating film. Alternatively, an end portion of the gate electrode does not overlap with the organic insulating film.

The inorganic insulating film 30 includes at least an oxide insulating film, and the oxide insulating film is preferably stacked with a nitride insulating film. The oxide insulating film is formed in a region of the inorganic insulating film 30 which is in contact with the oxide semiconductor film 19a, whereby the amount of defects at an interface between the oxide semiconductor film 19a and the inorganic insulating film 30 can be reduced.

The nitride insulating film functions as a barrier film against water, hydrogen, or the like. When water, hydrogen, or the like enters the oxide semiconductor film 19a, oxygen contained in the oxide semiconductor film 19a reacts with water, hydrogen, or the like and therefore an oxygen vacancy is formed in the oxide semiconductor film 19a. Furthermore, when carriers are generated in the oxide semiconductor film 19a by oxygen vacancies, the threshold voltage of the transistor shifts in the negative direction; accordingly, the transistor has normally-on characteristic. Therefore, by providing a nitride insulating film as a portion of the inorganic insulating film 30, the diffusion amount of water, hydrogen, or the like from the outside to the oxide semiconductor film 19a can be reduced and thus the amount of defects in the oxide semiconductor film 19a can be reduced. Accordingly, an oxide insulating film and a nitride insulating film are stacked in this order on the oxide semiconductor film 19a side in the inorganic insulating film 30, whereby the amount of defects at the interface between the oxide semiconductor film 19a and the inorganic insulating film 30 and the amount of oxygen vacancies in the oxide semiconductor film 19a can be reduced and therefore a transistor having normally-off characteristic can be manufactured.

Furthermore, in the transistor 10 shown in this embodiment, the isolated organic insulating film 31 overlaps with the oxide semiconductor film 19a over the inorganic insulating film 30.

The thickness of the organic insulating film 31 is preferably greater than or equal to 500 nm and less than or equal to 10 μm.

The organic insulating film 31 is formed using an organic resin such as an acrylic resin, a polyimide resin, or an epoxy resin.

Here, the case where a negative voltage is applied to the conductive film 13 functioning as a gate electrode when the organic insulating film 31 is not formed over the inorganic insulating film 30 is described with reference to FIG. 2B.

When a negative voltage is applied to the conductive film 13 functioning as a gate electrode, an electric field is generated. The electric field is not blocked with the oxide semiconductor film 19*a* and affects the inorganic insulating film 30; therefore, the surface of the inorganic insulating film 30 is weakly positively charged. Moreover, when a negative voltage is applied to the conductive film 13 functioning as a gate electrode, positively charged particles contained in the air are adsorbed on the surface of the inorganic insulating film 30 and weak positive electric charges are generated on the surface of the inorganic insulating film 30.

The surface of the inorganic insulating film 30 is positively charged, so that an electric field is generated and the electric field affects the interface between the oxide semiconductor film 19*a* and the inorganic insulating film 30. Thus, the interface between the oxide semiconductor film 19*a* and the inorganic insulating film 30 is substantially in a state to which a positive bias is applied and therefore the threshold voltage of the transistor shifts in the negative direction.

Figure 2B:
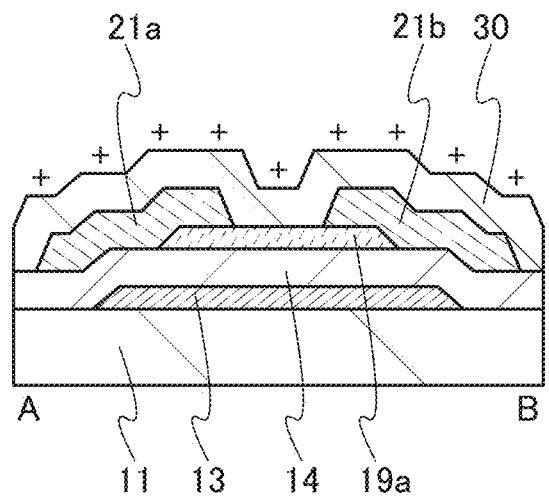

On the other hand, the transistor 10 illustrated in FIG. 2A in this embodiment includes the organic insulating film 31 over the inorganic insulating film 30. Since the thickness of the organic insulating film 31 is as large as 500 nm or more, the electric field generated by application of a negative voltage to the conductive film 13 functioning as a gate electrode does not affect the surface of the organic insulating film 31 and the surface of the organic insulating film 31 is not positively charged easily. Moreover, since the thickness is as large as 500 nm or more, electric fields of positively charged particles contained in the air does not affect the interface between the oxide semiconductor film 19*a* and the inorganic insulating film 30 even when the positively charged particles are adsorbed on the surface of the organic insulating film 31. Thus, the interface between the oxide semiconductor film 19*a* and the inorganic insulating film 30 is not substantially a state to which a positive bias is applied and therefore the amount of change in threshold voltage of the transistor is small.

Although water or the like diffuses easily in the organic insulating film 31, water from the outside does not diffuse to a semiconductor device through the organic insulating film 31 because the organic insulating film is isolated in each transistor 10. In addition, a nitride insulating film is included in the inorganic insulating film 30, whereby water diffused from the outside to the organic insulating film 31 can be prevented from diffusing to the oxide semiconductor film 19*a*.

As described above, the variation in electrical characteristics of the transistors can be reduced by providing the isolated organic insulating films 31 over the transistors. In addition, a transistor having normally-off characteristic and high reliability can be manufactured. Moreover, the organic insulating film can be formed by a printing method, a coating method, or the like; therefore, the manufacturing time can be shortened.

MODIFICATION EXAMPLE 1

A modification example of the transistor described in this embodiment is described with reference to FIG. 1D. A transistor 10*a* shown in this modification example includes an oxide semiconductor film 19*g* and a pair of conductive films 21*f* and 21*g* which are formed with a multi-tone photomask.

With the use of a multi-tone photomask, a resist mask having a plurality of thicknesses can be formed. After the oxide semiconductor film 19*g* is formed with the resist mask, the resist mask is exposed to oxygen plasma or the like and is partly removed; accordingly, a resist mask for forming a pair of conductive films is formed. Therefore, the number of steps in the photolithography process in the process of forming the oxide semiconductor film 19*g* and the pair of conductive films 21*f* and 21*g* can be reduced.

Note that outside the pair of conductive films 21*f* and 21*g*, the oxide semiconductor film 19*g* formed with a multi-tone photomask is partly exposed in the planar shape.

MODIFICATION EXAMPLE 2

A modification example of the transistor described in this embodiment is described with reference to FIG. 1E. A transistor 10*b* described in this modification example is a channel-protective transistor.

The transistor 10*b* illustrated in FIG. 1E includes the conductive film 13 functioning as a gate electrode provided over the first substrate 11, the gate insulating film 14 formed over the first substrate 11 and the conductive film 13 functioning as a gate electrode, the oxide semiconductor film 19*a* overlapping with the conductive film 13 functioning as a gate electrode with the gate insulating film 14 provided therebetween, an inorganic insulating film 30*a* covering a channel region and side surfaces of the oxide semiconductor film 19*a*, and conductive films 21*h* and 21*i* functioning as a source electrode and a drain electrode in contact with the oxide semiconductor film 19*a* in an opening of the inorganic insulating film 30*a*. In addition, the organic insulating film 31 overlapping with the oxide semiconductor film 19*a* with the inorganic insulating film 30*a* provided therebetween is included. The organic insulating film 31 is provided over the conductive films 21*h* and 21*i* and the inorganic insulating film 30*a*.

In the channel-protective transistor, the oxide semiconductor film 19*a* is not damaged by etching for forming the conductive films 21*h* and 21*i* because the oxide semiconductor film 19*a* is covered with the inorganic insulating film 30*a*. Therefore, defects in the oxide semiconductor film 19*a* can be reduced.

Note that the structures, methods, and the like described in this embodiment can be used as appropriate in combination with any of the structures, methods, and the like described in the other embodiments.

[Embodiment 2]

In this embodiment, a display device which is one embodiment of the present invention is described with reference to drawings.

Figure 3A:
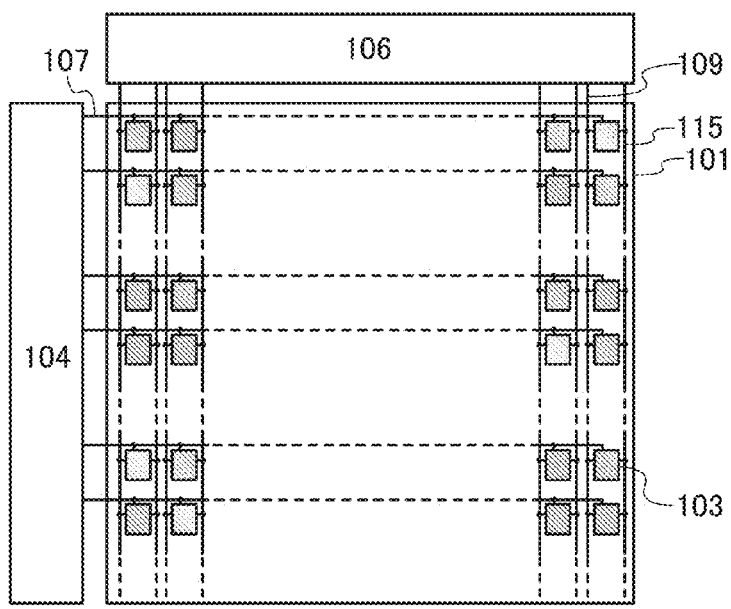
FIGS. 3A to 3C are a block diagram and circuit diagrams illustrating one embodiment of a display device.

FIG. 3A illustrates an example of a display device. A display device illustrated in FIG. 3A includes a pixel portion 101; a scan line driver circuit 104; a signal line driver circuit 106; m scan lines 107 which are arranged parallel or substantially parallel to each other and whose potentials are controlled by the scan line driver circuit 104; and n signal lines 109 which are arranged parallel or substantially parallel to each other and whose potentials are controlled by the signal line driver circuit 106. The pixel portion 101 further includes a plurality of pixels 103 arranged in a matrix. Furthermore, capacitor lines 115 arranged parallel or substantially parallel are provided along the signal lines 109. Note that the capacitor lines 115 may be arranged parallel or substantially parallel along the scan lines 107. The scan line driver circuit 104 and the signal line driver circuit 106 are collectively referred to as a driver circuit portion in some cases.

In addition, the display device also includes a driver circuit for driving a plurality of pixels, and the like. The display device may also be referred to as a liquid crystal module including a control circuit, a power supply circuit, a signal generation circuit, a backlight module, and the like provided over another substrate.

Each scan line 107 is electrically connected to the n pixels 103 in the corresponding row among the pixels 103 arranged in m rows and n columns in the pixel portion 101. Each signal line 109 is electrically connected to the m pixels 103 in the corresponding column among the pixels 103 arranged in m rows and n columns. Note that m and n are each an integer of 1 or more. Each capacitor line 115 is electrically connected to the m pixels 103 in the corresponding columns among the pixels 103 arranged in m rows and n columns. Note that in the case where the capacitor lines 115 are arranged parallel or substantially parallel along the scan lines 107, each capacitor line 115 is electrically connected to the n pixels 103 in the corresponding rows among the pixels 103 arranged in m rows and n columns.

Note that here, a pixel refers to a region surrounded by scan lines and signal lines and exhibiting one color. Therefore, in the case of a color display device having color elements of R (red), G (green), and B (blue), a minimum unit of an image is composed of three pixels of an R pixel, a G pixel, and a B pixel. Note that color reproducibility can be improved by adding a yellow pixel, a cyan pixel, a magenta pixel, or the like to the R pixel, the G pixel, and the B pixel. Moreover, power consumption of the display device can be reduced by adding a W (white) pixel to the R pixel, the G pixel, and the B pixel. In the case of a liquid crystal display device, brightness of the liquid crystal display device can be improved by adding a W pixel to each of the R pixel, the G pixel, and the B pixel. As a result, the power consumption of the liquid crystal display device can be reduced.

Figure 3B:
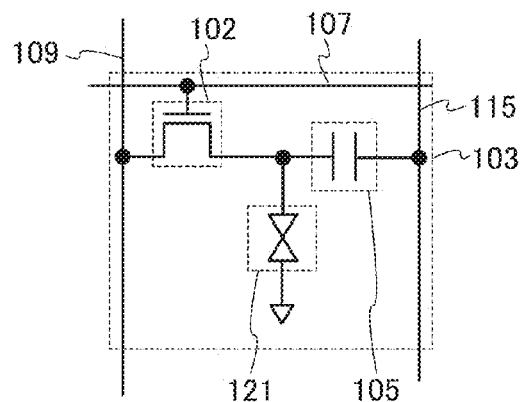
Figure 3C:
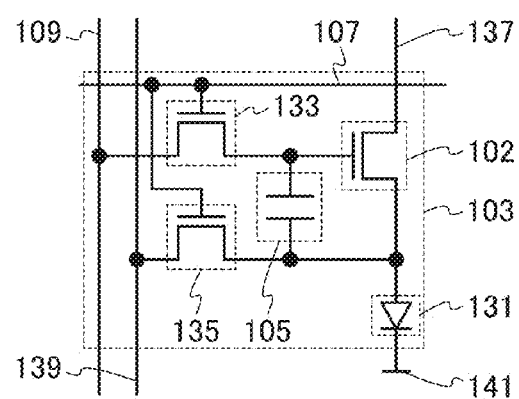

FIGS. 3B and 3C illustrate examples of a circuit configuration that can be used for the pixels 103 in the display device illustrated in FIG. 3A.

The pixel 103 in FIG. 3B includes a liquid crystal element 121, a transistor 102, and a capacitor 105.

The potential of one of a pair of electrodes of the liquid crystal element 121 is set as appropriate according to the specifications of the pixel 103. The alignment state of the liquid crystal element 121 depends on written data. A common potential may be supplied to one of the pair of electrodes of the liquid crystal element 121 included in each of a plurality of pixels 103. Furthermore, the potential supplied to the one of the pair of electrodes of the liquid crystal element 121 in the pixel 103 in one row may be different from the potential supplied to the one of the pair of electrodes of the liquid crystal element 121 in the pixel 103 in another row.

The liquid crystal element 121 is an element that controls transmission or non-transmission of light utilizing an optical modulation action of liquid crystal. Note that the optical modulation action of the liquid crystal is controlled by an electric field applied to the liquid crystal (including a horizontal electric field, a vertical electric field, and a diagonal electric field). Examples of the liquid crystal element 121 are a nematic liquid crystal, a cholesteric liquid crystal, a smectic liquid crystal, a thermotropic liquid crystal, a lyotropic liquid crystal, a ferroelectric liquid crystal, and an anti-ferroelectric liquid crystal.

As examples of a driving method of the display device including the liquid crystal element 121, any of the following modes can be given: a TN mode, a VA mode, an ASM (axially symmetric aligned micro-cell) mode, an OCB (optically compensated birefringence) mode, an MVA mode, a PVA (patterned vertical alignment) mode, an IPS mode, an FFS mode, a TBA (transverse bend alignment) mode, and the like. Note that one embodiment of the present invention is not limited to this, and various liquid crystal elements and driving methods can be used as a liquid crystal element and a driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the structure of the pixel 103 illustrated in FIG. 3B, one of a source electrode and a drain electrode of the transistor 102 is electrically connected to the signal line 109, and the other is electrically connected to the other of the pair of electrodes of the liquid crystal element 121. A gate electrode of the transistor 102 is electrically connected to the scan line 107. The transistor 102 has a function of controlling whether to write a data signal by being turned on or off.

In the pixel 103 in FIG. 3B, one of a pair of electrodes of the capacitor 105 is electrically connected to the capacitor line 115 to which a potential is supplied, and the other thereof is electrically connected to the other of the pair of electrodes of the liquid crystal element 121. The potential of the capacitor line 115 is set as appropriate in accordance with the specifications of the pixel 103. The capacitor 105 functions as a storage capacitor for storing written data.

For example, in the display device including the pixel 103 in FIG. 3B, the pixels 103 are sequentially selected row by row by the scan line driver circuit 104, whereby the transistors 102 are turned on and data of a data signal is written.

When the transistors 102 are turned off, the pixels 103 in which the data has been written are brought into a holding state. This operation is sequentially performed row by row; thus, an image is displayed.

The pixel 103 in FIG. 3C includes a transistor 133 performing switching of a display element, the transistor 102 controlling pixel driving, a transistor 135, the capacitor 105, and a light-emitting element 131.

One of a source electrode and a drain electrode of the transistor 133 is electrically connected to the signal line 109 to which a data signal is supplied. A gate electrode of the transistor 133 is electrically connected to a scan line 107 to which a gate signal is supplied.

The transistor 133 has a function of controlling whether to write a data signal by being turned on or off.

One of a source electrode and a drain electrode of the transistor 102 is electrically connected to a wiring 137 serving as an anode line, and the other is electrically connected to one electrode of the light-emitting element 131. The gate electrode of the transistor 102 is electrically connected to the other of the source electrode and the drain electrode of the transistor 133 and one electrode of the capacitor 105.

The transistor 102 has a function of controlling current flowing through the light-emitting element 131 by being turned on or off.

One of a source electrode and a drain electrode of the transistor 135 is connected to a wiring 139 to which a reference potential of data is supplied, and the other thereof is electrically connected to the one electrode of the light-emitting element 131 and the other electrode of the capacitor 105. Moreover, a gate electrode of the transistor 135 is electrically connected to the scan line 107 to which the gate signal is supplied.

The transistor 135 has a function of adjusting the current flowing through the light-emitting element 131. For example, when the internal resistance of the light-emitting element 131 increases because of deterioration or the like of the light-emitting element 131, the current flowing through the light-emitting element 131 can be corrected by monitoring current flowing through the wiring 139 to which the one of the source electrode and the drain electrode of the transistor 135 is connected. The potential supplied to the wiring 139 can be set to 0 V, for example.

The one electrode of the capacitor 105 is electrically connected to the gate electrode of the transistor 102 and the other of the source electrode and the drain electrode of the transistor 133, and the other electrode of the capacitor 105 is electrically connected to the other of the source electrode and the drain electrode of the transistor 135 and the one electrode of the light-emitting element 131.

In the pixel 103 in FIG. 3C, the capacitor 105 functions as a storage capacitor for storing written data.

The one electrode of the light-emitting element 131 is electrically connected to the other of the source electrode and the drain electrode of the transistor 135, the other electrode of the capacitor 105, and the other of the source electrode and the drain electrode of the transistor 102. Furthermore, the other electrode of the light-emitting element 131 is electrically connected to a wiring 141 serving as a cathode.

As the light-emitting element 131, an organic electroluminescent element (also referred to as an organic EL element) or the like can be used, for example. Note that the light-emitting element 131 is not limited to an organic EL element; an inorganic EL element including an inorganic material may be used.

A high power supply potential VDD is supplied to one of the wiring 137 and the wiring 141, and a low power supply potential VSS is supplied to the other. In the structure of FIG. 3C, the high power supply potential VDD is supplied to the wiring 137, and the low power supply potential VSS is supplied to the wiring 141.

For example, in the display device including the pixel 103 in FIG. 3C, the pixels 103 are sequentially selected row by row by the scan line driver circuit 104, whereby the transistors 102 are turned on and data of a data signal is written.

When the transistors 133 are turned off, the pixels 103 in which the data has been written are brought into a holding state. The transistor 133 is connected to the capacitor 105, and thus written data can be stored for a long period. The amount of current flowing between the source and drain electrodes is controlled by the transistor 133. The light-emitting element 131 emits light with a luminance corresponding to the amount of flowing current. This operation is sequentially performed row by row; thus, an image is displayed.

Note that although FIGS. 3B and 3C each illustrate an example where the liquid crystal element 121 and the light-emitting element 131 are used as a display element, one embodiment of the present invention is not limited thereto. Any of a variety of display elements may be used. Examples of display elements include elements including a display medium whose contrast, luminance, reflectance, transmittance, or the like is changed by electromagnetic action, such as an EL (electroluminescent) element (e.g., an EL element including organic and inorganic materials, an organic EL element, and an inorganic EL element), an LED (e.g., a white LED, a red LED, a green LED, and a blue LED), a transistor (a transistor that emits light depending on a current), an electron emitter, electronic ink, an electrophoretic element, a grating light valve (GLV), a plasma display panel (PDP), a micro electro mechanical system (MEMS), a digital micromirror device (DMD), a digital micro shutter (DMS), an interferometric modulator display (IMOD), an electrowetting element, a piezoelectric ceramic display, and a carbon nanotube. Note that examples of display devices including EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display) and the like. An example of a display device including electronic ink or electrophoretic elements is electronic paper.

Figure 4:
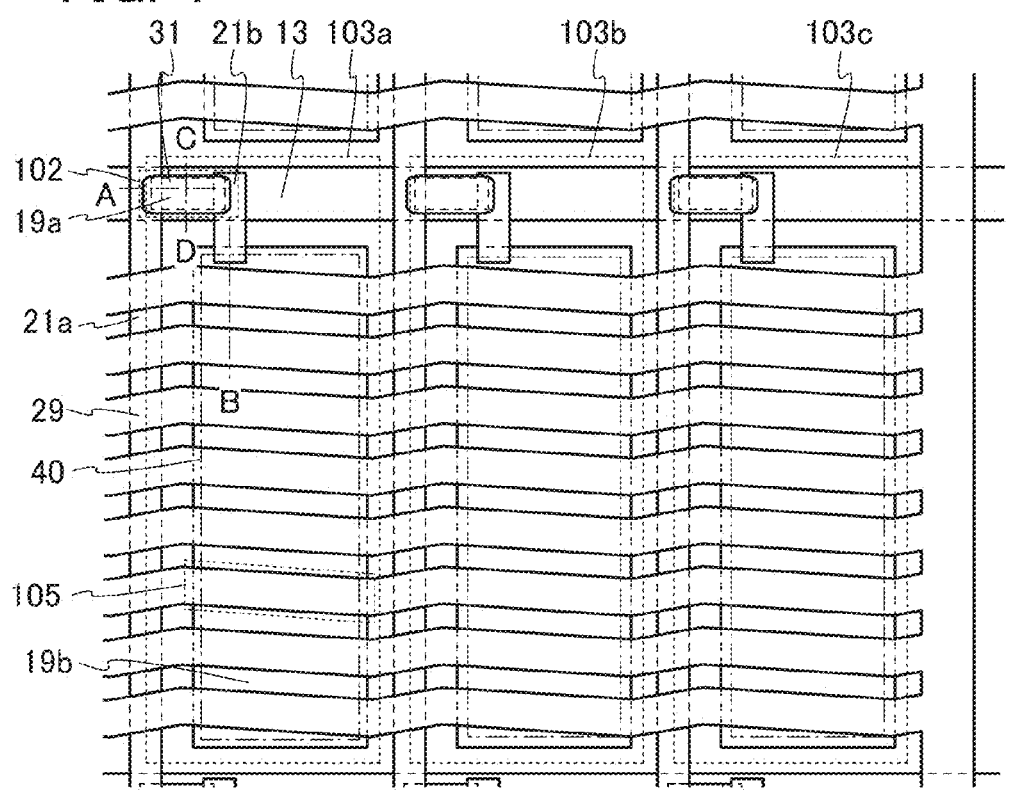
FIG. 4 is a top view illustrating one embodiment of a display device.

Next, a specific structure of an element substrate included in the display device is described. Here, a specific example of a liquid crystal display device including a liquid crystal element in the pixel 103 is described. FIG. 4 is a top view of the pixel 103 shown in FIG. 3B.

Here, a liquid crystal display device driven in an FFS mode is used as the display device, and FIG. 4 is a top view of a plurality of pixels 103a, 103b, and 103c included in the liquid crystal display device.

In FIG. 4, a conductive film 13 functioning as a scan line extends in a direction substantially perpendicularly to a conductive film functioning as a signal line (in the lateral direction in the drawing). The conductive film 21a functioning as a signal line extend in a direction substantially perpendicularly to the conductive film functioning as a scan line (in the vertical direction in the drawing). Note that the conductive film 13 functioning as a scan line is electrically connected to the scan line driver circuit 104 (see FIG. 3A), and the conductive film 21a functioning as a signal line is electrically connected to the signal line driver circuit 106 (see FIG. 3A).

The transistor 102 is provided in a region where the conductive film functioning as a scan line and the conductive film functioning as a signal line intersect with each other. The transistor 102 includes the conductive film 13 functioning as a gate electrode; a gate insulating film (not illustrated in FIG. 4); the oxide semiconductor film 19a where a channel region is formed, over the gate insulating film; and the conductive film 21a and a conductive film 21b functioning as a source electrode and a drain electrode. The conductive film 13 also functions as a conductive film functioning as a scan line, and a region of the conductive film 13 that overlaps with the oxide semiconductor film 19a serves as the gate electrode of the transistor 102. In addition, the conductive film 21a also functions as a conductive film functioning as a signal line, and a region of the conductive film 21a that overlaps with the oxide semiconductor film 19a functions as the source electrode or the drain electrode of the transistor 102. Furthermore, in the top view of FIG. 4, an end portion of the conductive film functioning as a scan line is positioned on an outer side of an end portion of the oxide semiconductor film 19a. Thus, the conductive film functioning as a scan line functions as a light-blocking film for blocking light from a light source such as a backlight. For this reason, the oxide semiconductor film 19a included in the transistor is not irradiated with light, so that a variation in the electrical characteristics of the transistor can be suppressed.

In addition, the transistor 102 includes the organic insulating film 31 overlapping with the oxide semiconductor film 19a. The organic insulating film 31 overlaps with the oxide semiconductor film 19a (in particular, a region of the oxide semiconductor film 19a which is between the conductive films 21a and 21b) with an inorganic insulating film (not illustrated in FIG. 4) provided therebetween.

Water from the outside does not diffuse to the liquid crystal display device through the organic insulating film 31 because the organic insulating film 31 is isolated in each transistor 10; therefore, the variation in electrical characteristics of the transistors provided in the liquid crystal display device can be reduced.

The conductive film 21b is electrically connected to a pixel electrode 19b. A common electrode 29 is provided over the pixel electrode 19b with an insulating film provided therebetween. An opening 40 indicated by a dashed-dotted line is provided in the insulating film provided over the pixel electrode 19b. The pixel electrode 19b is in contact with a nitride insulating film (not illustrated in FIG. 4) in the opening 40.

The common electrode 29 includes stripe regions extending in a direction intersecting with the conductive film 21a functioning as a signal line. The stripe regions are connected to a region extending in a direction parallel or substantially parallel to the conductive film 21a functioning as a signal line. Accordingly, the stripe regions of the common electrode 29 are at the same potential in pixels.

The capacitor 105 is formed in a region where the pixel electrode 19b and the common electrode 29 overlap with each other. The pixel electrode 19b and the common electrode 29 each have a light-transmitting property. That is, the capacitor 105 has a light-transmitting property.

As illustrated in FIG. 4, an FFS mode liquid crystal display device is provided with the common electrode including the stripe regions extending in a direction intersecting with the conductive film functioning as a signal line. Thus, the display device can have excellent contrast.

Owing to the light-transmitting property of the capacitor 105, the capacitor 105 can be formed large (in a large area) in the pixel 103. Thus, a display device with a large-capacitance capacitor as well as an aperture ratio increased to typically 50% or more, preferably 60% or more can be provided. For example, in a high-resolution display device such as a liquid crystal display device, the area of a pixel is small and accordingly the area of a capacitor is also small. For this reason, the amount of charges accumulated in the capacitor is small in the high-resolution display device. However, since the capacitor 105 of this embodiment has a light-transmitting property, when the capacitor 105 is provided in a pixel, sufficient capacitance can be obtained in the pixel and the aperture ratio can be improved. Typically, the capacitor 105 can be favorably used for a high-resolution display device with a pixel density of 200 pixels per inch (ppi) or more, 300 ppi or more, or furthermore, 500 ppi or more.

In a liquid crystal display device, as the capacitance value of a capacitor is increased, a period during which the alignment of liquid crystal molecules of a liquid crystal element can be kept constant in the state where an electric field is applied can be made longer. When the period can be made longer in a display device which displays a still image, the number of times of rewriting image data can be reduced, leading to a reduction in power consumption. Furthermore, according to the structure of this embodiment, the aperture ratio can be improved even in a high-resolution display device, which makes it possible to use light from a light source such as a backlight efficiently, so that power consumption of the display device can be reduced.

Figure 5:
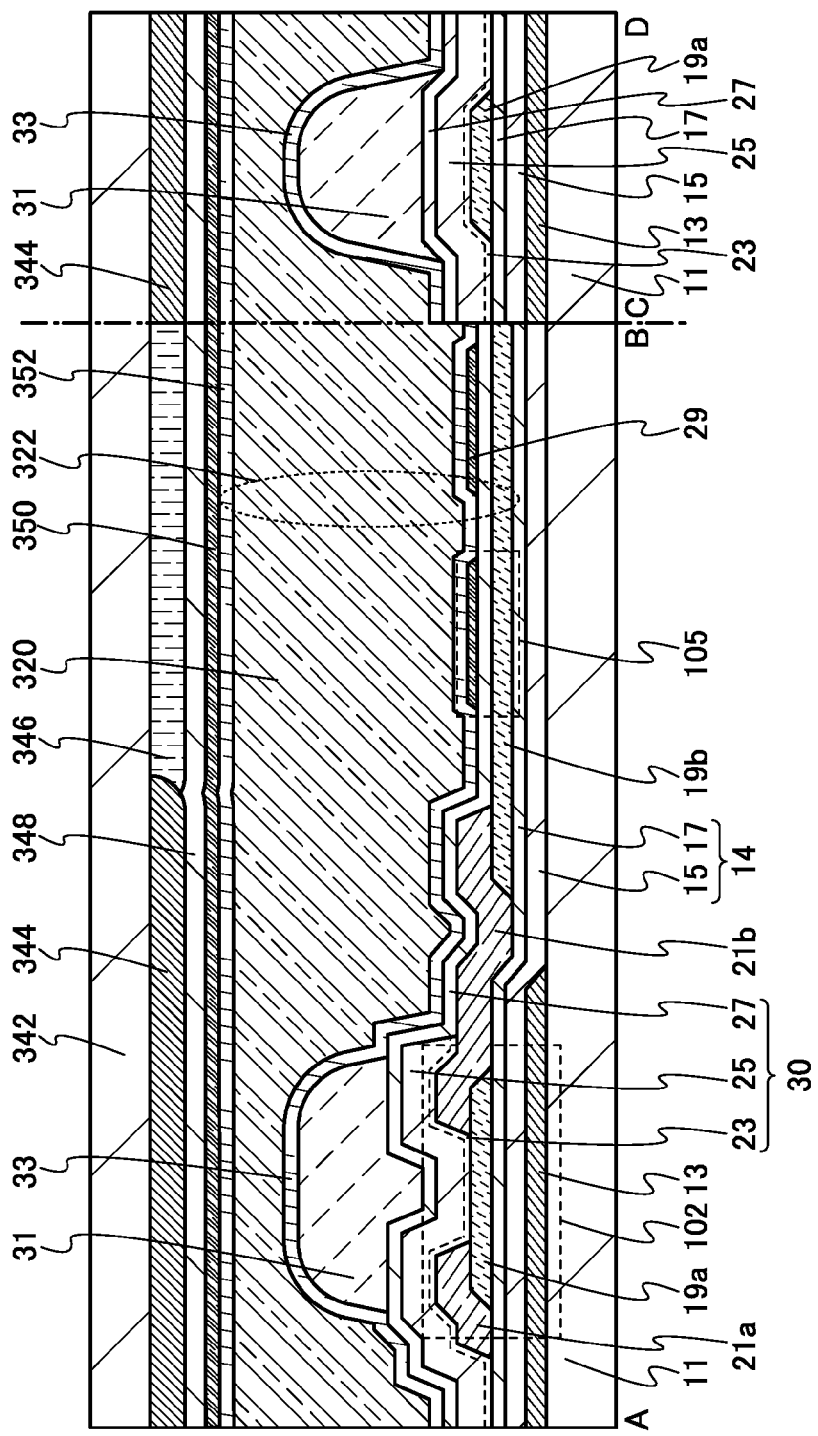
FIG. 5 is a cross-sectional view illustrating one embodiment of a display device.

Next, FIG. 5 is a cross-sectional view taken along dashed-dotted lines A-B and C-D in FIG. 4. The transistor 102 illustrated in FIG. 5 is a channel-etched transistor. Note that the transistor 102 in the channel length direction and the capacitor 105 are illustrated in the cross-sectional view taken along dashed-dotted line A-B, and the transistor 102 in the channel width direction is illustrated in the cross-sectional view taken along dashed-dotted line C-D.

The liquid crystal display device described in this embodiment includes a pair of substrates (the first substrate 11 and a second substrate 342), an element layer in contact with the first substrate 11, an element layer in contact with the second substrate 342, and a liquid crystal element 320 provided between the element layers. Note that the element layer is a generic term used to refer to layers interposed between the substrate and the liquid crystal layer. A liquid crystal element 322 is provided between a pair of substrates (the first substrate 11 and the second substrate 342).

The liquid crystal element 322 includes the pixel electrode 19b over the first substrate 11, the common electrode 29, a nitride insulating film 27, a film controlling alignment (hereinafter referred to as an alignment film 33), and the liquid crystal layer 320. The pixel electrode 19b functions as one electrode of the liquid crystal element 322, and the common electrode 29 functions as the other electrode of the liquid crystal element 322.

First, the element layer formed over the first substrate 11 is described. The transistor 102 in FIG. 5 has a single-gate structure and includes the conductive film 13 functioning as a gate electrode over the first substrate 11. In addition, the transistor 102 includes a nitride insulating film 15 formed over the first substrate 11 and the conductive film 13 functioning as a gate electrode, an oxide insulating film 17 formed over the nitride insulating film 15, the oxide semiconductor film 19a overlapping with the conductive film 13 functioning as a gate electrode with the nitride insulating film 15 and the oxide insulating film 17 provided therebetween, and the conductive films 21a and 21b functioning as a source electrode and a drain electrode which are in contact with the oxide semiconductor film 19a. The nitride insulating film 15 and the oxide insulating film 17 function as the gate insulating film 14. Moreover, an oxide insulating film 23 is formed over the oxide insulating film 17, the oxide semiconductor film 19a, and the conductive films 21a and 21b functioning as a source electrode and a drain electrode, and an oxide insulating film 25 is formed over the oxide insulating film 23. The nitride insulating film 27 is formed over the oxide insulating film 23, the oxide insulating film 25, and the conductive film 21b. The oxide insulating film 23, the oxide insulating film 25, and the nitride insulating film 27 function as the inorganic insulating film 30. The pixel electrode 19b is formed over the oxide insulating film 17. The pixel electrode 19b is connected to one of the conductive films 21a and 21b functioning as a source electrode and a drain electrode, here, connected to the conductive film 21b. The common electrode 29 is formed over the nitride insulating film 27. In addition, the organic insulating film 31 overlapping with the oxide semiconductor film 19a of the transistor 102 with the inorganic insulating film 30 provided therebetween is included.

A region where the pixel electrode 19b, the nitride insulating film 27, and the common electrode 29 overlap with one another functions as the capacitor 105.

The thickness of the organic insulating film 31 is preferably greater than or equal to 500 nm and less than or equal to 10 μm. The thickness of the organic insulating film 31 in FIG. 5 is smaller than a gap between the inorganic insulating film 30 formed over the first substrate 11 and the element layer formed on the second substrate 342. Therefore, the liquid crystal layer 320 is provided between the organic insulating film 31 and the element layer formed on the second substrate 342. In other words, the liquid crystal layer 320 is provided between the alignment film 33 over the organic insulating film 31 and an alignment film 352 included in the element layer on the second substrate 342.

Figure 6:
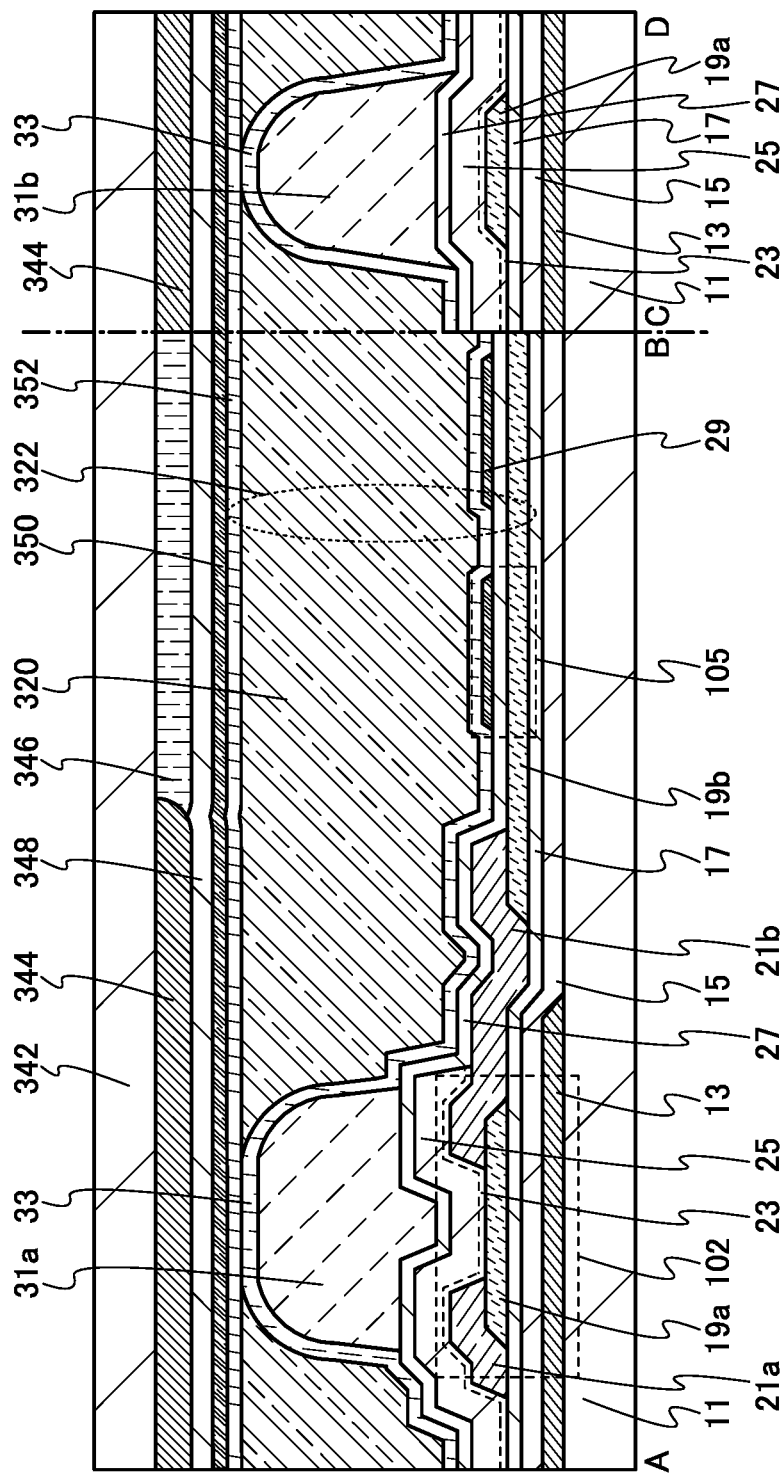
FIG. 6 is a cross-sectional view illustrating one embodiment of a display device.

Note that as illustrated in FIG. 6, the alignment film 33 over the organic insulating film 31a and the alignment film 352 included in the element layer on the second substrate 342 may be in contact with each other. In this case, the organic insulating film 31a functions as a spacer; therefore, the cell gap of the liquid crystal display device can be maintained with the organic insulating film 31a.

Although the alignment film 33 is provided over the organic insulating film 31, the organic insulating film 31a, or the like in FIG. 5, FIG. 6, or the like, one embodiment of the present invention is not limited thereto. As illustrated in FIG. 33, an organic insulating film 31b may be provided over the alignment film 33 in some cases or depending on circumstances. In this case, a rubbing step may be performed after the formation of the organic insulating film 31b or the like over the alignment film 33 instead of directly after the formation of the alignment film 33, for example.

The organic insulating film 31, 31a, or 31b overlapping with the oxide semiconductor film 19a is provided over the transistor 102, whereby the surface of the oxide semiconductor film 19a can be made apart from the surface of the organic insulating film 31, 31a, or 31b. Thus, the surface of the oxide semiconductor film 19a is not affected by the electric field of positively charged particles adsorbed on the surface of the organic insulating film 31, 31a, or 31b and therefore the reliability of the transistor 102 can be improved.

Note that a cross-sectional view of one embodiment of the present invention is not limited to FIG. 5, FIG. 6, and FIG. 33. The display device can have a variety of different structures. For example, the pixel electrode 19b may have a slit. The pixel electrode 19b may have a comb-like shape. An example of a cross-sectional view in this case is shown in FIG. 7. Alternatively, an organic insulating film 31c which is not isolated may be provided over the nitride insulating film 27 as illustrated in FIG. 8. For example, the organic insulating film 31c which is not isolated is provided, whereby the surface of the organic insulating film 31c can be made flat. In other words, as an example, the organic insulating film 31c can function as a planarization film. Alternatively, a capacitor 105b may be formed so that the common electrode 29 and the conductive film 21b overlap with each other as illustrated in FIG. 9. Such a structure enables the capacitor 105b to function as a capacitor holding the potential of the pixel electrode. Therefore, with such a structure, capacitance of the capacitor can be increased.

A structure of the display device is described below in detail.

There is no particular limitation on the property of a material and the like of the first substrate 11 as long as the material has heat resistance enough to withstand at least later heat treatment. For example, a glass substrate, a ceramic substrate, a quartz substrate, or a sapphire substrate may be used as the first substrate 11. Alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used as the first substrate 11. Furthermore, any of these substrates further provided with a semiconductor element may be used as the first substrate 11. In the case where a glass substrate is used as the first substrate 11, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the first substrate 11, and the transistor 102 may be provided directly on the flexible substrate. Alternatively, a separation layer may be provided between the first substrate 11 and the transistor 102. The separation layer can be used when part or the whole of a display device formed over the separation layer is separated from the first substrate 11 and transferred onto another substrate. In such a case, the transistor 102 can be transferred to a substrate having low heat resistance or a flexible substrate as well.

The conductive film 13 functioning as a gate electrode can be formed using a metal element selected from aluminum, chromium, copper, tantalum, titanium, molybdenum, and tungsten; an alloy containing any of these metal elements as a component; an alloy containing any of these metal elements in combination; or the like. Furthermore, one or more metal elements selected from manganese and zirconium may be used. The conductive film 13 functioning as a gate electrode may have a single-layer structure or a stacked-layer structure of two or more layers. For example, a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a two-layer structure in which a copper film is stacked over a molybdenum film, and a three-layer structure in which a titanium film, an aluminum film, and a titanium film are stacked in this order can be given. Alternatively, an alloy film or a nitride film which contains aluminum and one or more elements selected from titanium, tantalum, tungsten, molybdenum, chromium, neodymium, and scandium may be used.

The conductive film 13 functioning as a gate electrode can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

The nitride insulating film 15 can be a nitride insulating film that is hardly permeated by oxygen. Furthermore, a nitride insulating film which is hardly permeated by oxygen, hydrogen, and water can be used. As the nitride insulating film that is hardly permeated by oxygen and the nitride insulating film that is hardly permeated by oxygen, hydrogen, and water, a silicon nitride film, a silicon nitride oxide film, an aluminum nitride film, an aluminum nitride oxide film, or the like is given. Instead of the nitride insulating film that is hardly permeated by oxygen and the nitride insulating film that is hardly permeated by oxygen, hydrogen, and water, an oxide insulating film such as an aluminum oxide film, an aluminum oxynitride film, a gallium oxide film, a gallium oxynitride film, an yttrium oxide film, an yttrium oxynitride film, a hafnium oxide film, or a hafnium oxynitride film can be used.

The thickness of the nitride insulating film 15 is preferably greater than or equal to 5 nm and less than or equal to 100 nm, further preferably greater than or equal to 20 nm and less than or equal to 80 nm.

The oxide insulating film 17 may be formed to have a single-layer structure or a stacked-layer structure using, for example, one or more of a silicon oxide film, a silicon oxynitride film, a silicon nitride oxide film, a silicon nitride film, an aluminum oxide film, a hafnium oxide film, a gallium oxide film, a Ga—Zn-based metal oxide film, and a silicon nitride film.

The oxide insulating film 17 may also be formed using a material having a high relative dielectric constant such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The thickness of the oxide insulating film 17 is preferably greater than or equal to 5 nm and less than or equal to 400 nm, further preferably greater than or equal to 10 nm and less than or equal to 300 nm, still further preferably greater than or equal to 50 nm and less than or equal to 250 nm.

The oxide semiconductor film 19a is typically formed using an In—Ga oxide, an In—Zn oxide, or an In-M-Zn oxide (M represents Al, Ga, Y, Zr, Sn, La, Ce, or Nd).

In the case where the oxide semiconductor film 19a contains an In-M-Zn oxide, the proportions of In and M when summation of In and M is assumed to be 100 atomic % are preferably as follows: the atomic percentage of In is greater than 25 atomic % and the atomic percentage of M is less than 75 atomic %, or further preferably, the atomic percentage of In is greater than 34 atomic % and the atomic percentage of M is less than 66 atomic %.

The energy gap of the oxide semiconductor film 19a is 2 eV or more, preferably 2.5 eV or more, further preferably 3 eV or more. The off-state current of the transistor 102 can be reduced by using an oxide semiconductor having such a wide energy gap.

The thickness of the oxide semiconductor film 19a is greater than or equal to 3 nm and less than or equal to 200 nm, preferably greater than or equal to 3 nm and less than or equal to 100 nm, further preferably greater than or equal to 3 nm and less than or equal to 50 nm.

In the case where the oxide semiconductor film 19a is an In-M-Zn oxide film (M represents Al, Ga, Y, Zr, Sn, La, Ce, or Nd), it is preferable that the atomic ratio of metal elements of a sputtering target used for forming the In-M-Zn oxide film satisfy In≥M and Zn≥M. As the atomic ratio of metal elements of such a sputtering target, In:M:Zn=1:1:1, In:M:Zn=1:1:1.2, and In:M:Zn=3:1:2 are preferable. Note that the proportion of each metal element in the atomic ratio of the oxide semiconductor film 19a to be formed varies within a range of ±40% of that in the above atomic ratio of the sputtering target as an error.

An oxide semiconductor film with low carrier density is used as the oxide semiconductor film 19a. For example, an oxide semiconductor film whose carrier density is $1\times10^{17}/cm^3$ or lower, preferably $1\times10^{15}/cm^3$ or lower, further preferably $1\times10^{13}/cm^3$ or lower, still further preferably $1\times10^{11}/cm^3$ or lower is used as the oxide semiconductor film 19a.

Note that, without limitation to the compositions described above, a material with an appropriate composition may be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 19a be set to be appropriate.

Note that it is preferable to use, as the oxide semiconductor film 19a, an oxide semiconductor film in which the impurity concentration is low and density of defect states is low, in which case the transistor can have more excellent electrical characteristics. Here, the state in which impurity concentration is low and density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has few carrier traps in some cases. Furthermore, the highly purified intrinsic or substantially highly purified intrinsic oxide semiconductor film has an extremely low off-state current; even when an element has a channel width of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor in which a channel region is formed in the oxide semiconductor film has a small variation in electrical characteristics and high reliability in some cases. As examples of the impurities, hydrogen, nitrogen, alkali metal, and alkaline earth metal are given.

Hydrogen contained in the oxide semiconductor film reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor which contains hydrogen is likely to be normally on.

Accordingly, it is preferable that hydrogen be reduced as much as possible as well as the oxygen vacancies in the oxide semiconductor film 19a. Specifically, in the oxide semiconductor film 19a, the concentration of hydrogen which is measured by secondary ion mass spectrometry (SIMS) is set to be lower than or equal to $5\times10^{19}$ atoms/cm$^3$, preferably lower than or equal to $1\times10^{19}$ atoms/cm$^3$, further preferably lower than $5\times10^{18}$ atoms/cm$^3$, still further preferably lower than or equal to $1\times10^{18}$ atoms/cm$^3$, yet still further preferably lower than or equal to $5\times10^{17}$ atoms/cm$^3$, yet still furthermore preferably lower than or equal to $1\times10^{16}$ atoms/cm$^3$.

When silicon or carbon which is one of elements belonging to Group 14 is contained in the oxide semiconductor film 19a, oxygen vacancies are increased, and the oxide semiconductor film 19a becomes an n-type film. Thus, the concentration of silicon or carbon (the concentration is measured by SIMS) of the oxide semiconductor film 19a is set to be lower than or equal to $2 \times 10^{18}$ atoms/cm$^3$, preferably lower than or equal to $2 \times 10^{17}$ atoms/cm$^3$.

The concentration of alkali metal or alkaline earth metal in the oxide semiconductor film 19a, which is measured by SIMS, is set to be lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the oxide semiconductor film 19a.

Furthermore, when containing nitrogen, the oxide semiconductor film 19a easily has n-type conductivity by generation of electrons serving as carriers and an increase of carrier density. Thus, a transistor including an oxide semiconductor which contains nitrogen is likely to be normally on. For this reason, nitrogen in the oxide semiconductor film is preferably reduced as much as possible; the concentration of nitrogen which is measured by SIMS is preferably set to be, for example, lower than or equal to $5 \times 10^{18}$ atoms/cm$^3$.

The oxide semiconductor film 19a may have a non-single-crystal structure, for example. The non-single-crystal structure includes a c-axis aligned crystalline oxide semiconductor (CAAC-OS) which is described later, a polycrystalline structure, a microcrystalline structure which is described later, or an amorphous structure, for example. Among the non-single-crystal structures, the amorphous structure has the highest density of defect states, whereas CAAC-OS has the lowest density of defect states.

The oxide semiconductor film 19a may have a non-single-crystal structure, for example. The oxide semiconductor films having the amorphous structure each have disordered atomic arrangement and no crystalline component, for example.

Note that the oxide semiconductor film 19a may be a mixed film including two or more regions of the following: a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, the mixed film has a stacked-layer structure of two or more of a region having an amorphous structure, a region having a microcrystalline structure, a region having a polycrystalline structure, a CAAC-OS region, and a region having a single-crystal structure in some cases.

The pixel electrode 19b is formed by processing an oxide semiconductor film formed at the same time as the oxide semiconductor film 19a. Thus, the pixel electrode 19b contains a metal element similar to that in the oxide semiconductor film 19a. Furthermore, the pixel electrode 19b has a crystal structure similar to or different from that of the oxide semiconductor film 19a. By adding impurities or oxygen vacancies to the oxide semiconductor film formed at the same time as the oxide semiconductor film 19a, the oxide semiconductor film has conductivity and thus functions as the pixel electrode 19b. An example of the impurities contained in the oxide semiconductor film is hydrogen. Instead of hydrogen, as the impurity, boron, phosphorus, tin, antimony, a rare gas element, an alkali metal, an alkaline earth metal, or the like may be included. Alternatively, the pixel electrode 19b is formed at the same time as the oxide semiconductor film 19a, and has increased conductivity by containing oxygen vacancies generated by plasma damage or the like. Alternatively, the pixel electrode 19b is formed at the same time as the oxide semiconductor film 19a, and has increased conductivity by containing impurities and oxygen vacancies generated by plasma damage or the like.

The oxide semiconductor film 19a and the pixel electrode 19b are both formed over the oxide insulating film 17, but differ in impurity concentration. Specifically, the pixel electrode 19b has a higher impurity concentration than the oxide semiconductor film 19a. For example, the concentration of hydrogen contained in the oxide semiconductor film 19a is lower than or equal to $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$, yet further preferably lower than or equal to $1 \times 10^{16}$ atoms/cm$^3$. The concentration of hydrogen contained in the pixel electrode 19b is higher than or equal to $8 \times 10^{19}$ atoms/cm$^3$, preferably higher than or equal to $1 \times 10^{20}$ atoms/cm$^3$, further preferably higher than or equal to $5 \times 10^{20}$ atoms/cm$^3$. The concentration of hydrogen contained in the pixel electrode 19b is greater than or equal to 2 times, preferably greater than or equal to 10 times that in the oxide semiconductor film 19a.

When the oxide semiconductor film formed at the same time as the oxide semiconductor film 19a is exposed to plasma, the oxide semiconductor film is damaged, and oxygen vacancies can be generated. For example, when a film is formed over the oxide semiconductor film by a plasma CVD method or a sputtering method, the oxide semiconductor film is exposed to plasma and oxygen vacancies are generated. Alternatively, when the oxide semiconductor film is exposed to plasma in etching treatment for formation of the oxide insulating film 23 and the oxide insulating film 25, oxygen vacancies are generated. Alternatively, when the oxide semiconductor film is exposed to plasma of a mixed gas of oxygen and hydrogen, hydrogen, a rare gas, ammonia, and the like, oxygen vacancies are generated. As a result, the conductivity of the oxide semiconductor film is increased, so that the oxide semiconductor film has conductivity and functions as the pixel electrode 19b.

In other words, the pixel electrode 19b is formed using an oxide semiconductor film having high conductivity. It can also be said that the pixel electrode 19b is formed using a metal oxide film having high conductivity.

In the case where a silicon nitride film is used as the nitride insulating film 27, the silicon nitride film contains hydrogen. When hydrogen in the nitride insulating film 27 is diffused to the oxide semiconductor film formed at the same time as the oxide semiconductor film 19a, hydrogen is bonded to oxygen and electrons serving as carriers are generated in the oxide semiconductor film. When the silicon nitride film is formed by a plasma CVD method or a sputtering method, the oxide semiconductor film is exposed to plasma and oxygen vacancies are generated in the oxide semiconductor film. When hydrogen contained in the silicon nitride film enters the oxygen vacancies, electrons serving as carriers are generated. As a result, the conductivity of the oxide semiconductor film is increased, so that the oxide semiconductor film functions as the pixel electrode 19b.

When hydrogen is added to an oxide semiconductor including oxygen vacancies, hydrogen enters oxygen vacant sites and forms a donor level in the vicinity of the conduction band. As a result, the conductivity of the oxide semiconductor is increased, so that the oxide semiconductor becomes a conductor. An oxide semiconductor having become a conductor can be referred to as an oxide conductor. In other words, the pixel electrode 19b is formed using an oxide conductor film. Oxide semiconductors generally have a visible light transmitting property because of their large energy gap. An oxide conductor is an oxide semiconductor having a donor level in the vicinity of the conduction band. Therefore, the influence of absorption due to the donor level is small, and an oxide conductor has a visible light transmitting property comparable to that of an oxide semiconductor.

The pixel electrode 19b has lower resistivity than the oxide semiconductor film 19a. The resistivity of the pixel electrode 19b is preferably greater than or equal to $1\times10^{-8}$ times and less than $1\times10^{-1}$ times the resistivity of the oxide semiconductor film 19a. The resistivity of the pixel electrode 19b is typically greater than or equal to $1\times10^{-3}$ $\Omega$cm and less than $1\times10^{4}$ $\Omega$cm, preferably greater than or equal to $1\times10^{-3}$ $\Omega$cm and less than $1\times10^{-1}$ $\Omega$cm.

The conductive films 21a and 21b functioning as a source electrode and a drain electrode are each formed to have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order can be given. Note that a transparent conductive material containing indium oxide, tin oxide, or zinc oxide may be used.

As the oxide insulating film 23 or the oxide insulating film 25, an oxide insulating film which contains more oxygen than that in the stoichiometric composition is preferably used. Here, as the oxide insulating film 23, an oxide insulating film which permeates oxygen is formed, and as the oxide insulating film 25, an oxide insulating film which contains more oxygen than that in the stoichiometric composition is formed.

The oxide insulating film 23 is an oxide insulating film through which oxygen is permeated. Thus, oxygen released from the oxide insulating film 25 provided over the oxide insulating film 23 can be moved to the oxide semiconductor film 19a through the oxide insulating film 23. Moreover, the oxide insulating film 23 also serves as a film which relieves damage to the oxide semiconductor film 19a at the time of forming the oxide insulating film 25 later.

A silicon oxide film, a silicon oxynitride film, or the like with a thickness greater than or equal to 5 nm and less than or equal to 150 nm, preferably greater than or equal to 5 nm and less than or equal to 50 nm can be used as the oxide insulating film 23. Note that in this specification, "silicon oxynitride film" refers to a film that contains more oxygen than nitrogen, and "silicon nitride oxide film" refers to a film that contains more nitrogen than oxygen.

Furthermore, the oxide insulating film 23 is preferably an oxide insulating film containing nitrogen and having a small number of defects.

Typical examples of the oxide insulating film containing nitrogen and having a small number of defects include a silicon oxynitride film and an aluminum oxynitride film.

In an ESR spectrum at 100 K or lower of the oxide insulating film with a small number of defects, a first signal that appears at a g-factor of greater than or equal to 2.037 and smaller than or equal to 2.039, a second signal that appears at a g-factor of greater than or equal to 2.001 and smaller than or equal to 2.003, and a third signal that appears at a g-factor of greater than or equal to 1.964 and smaller than or equal to 1.966 are observed. The split width between the first and second signals and the split width between the second and third signals that are obtained by ESR measurement using an X-band are each approximately 5 mT. The sum of the spin densities of the first signal that appears at a g-factor of greater than or equal to 2.037 and smaller than or equal to 2.039, the second signal that appears at a g-factor of greater than or equal to 2.001 and smaller than or equal to 2.003, and the third signal that appears at a g-factor of greater than or equal to 1.964 and smaller than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the first signal that appears at a g-factor of greater than or equal to 2.037 and smaller than or equal to 2.039, the second signal that appears at a g-factor of greater than or equal to 2.001 and smaller than or equal to 2.003, and the third signal that appears at a g-factor of greater than or equal to 1.964 and smaller than or equal to 1.966 correspond to signals attributed to nitrogen oxide ($NO_x$; x is greater than or equal to 0 and smaller than or equal to 2, preferably greater than or equal to 1 and smaller than or equal to 2). Typical examples of nitrogen oxide include nitrogen monoxide and nitrogen dioxide. In other words, when the spin densities of signals that appear at a g-factor of greater than or equal to 1.964 and smaller than or equal to 1.966 to a g-factor of greater than or equal to 2.037 and smaller than or equal to 2.039 are lower, the nitrogen oxide content in an oxide insulating film is lower.

When the oxide insulating film 23 contains a small amount of nitrogen oxide as described above, the carrier trap at the interface between the oxide insulating film 23 and the oxide semiconductor film can be reduced. Thus, a change in the threshold voltage of the transistor included in the semiconductor device can be reduced, which leads to a reduced change in the electrical characteristics of the transistor.

The oxide insulating film 23 preferably has a nitrogen concentration measured by secondary ion mass spectrometry (SIMS) of lower than or equal to $6\times10^{20}$ atoms/cm$^3$. In that case, nitrogen oxide is unlikely to be generated in the oxide insulating film 23, so that the carrier trap at the interface between the oxide insulating film 23 and the oxide semiconductor film 19a can be reduced. Furthermore, a change in the threshold voltage of the transistor included in the semiconductor device can be reduced, which leads to a reduced change in the electrical characteristics of the transistor.

Note that when nitride oxide and ammonia are contained in the oxide insulating film 23, the nitride oxide and ammonia react with each other in heat treatment in the manufacturing process; accordingly, the nitride oxide is released as a nitrogen gas. Thus, the nitrogen concentration of the oxide insulating film 23 and the amount of nitrogen oxide therein can be reduced. Moreover, the carrier trap at the interface between the oxide insulating film 23 and the oxide semiconductor film 19*a* can be reduced. Furthermore, the amount of change in threshold voltage of the transistor included in the semiconductor device can be reduced, which leads to a reduced change in the electrical characteristics of the transistor.

Note that in the oxide insulating film 23, all oxygen entering the oxide insulating film 23 from the outside does not move to the outside of the oxide insulating film 23 and some oxygen remains in the oxide insulating film 23. Furthermore, movement of oxygen occurs in the oxide insulating film 23 in some cases in such a manner that oxygen enters the oxide insulating film 23 and oxygen contained in the oxide insulating film 23 is moved to the outside of the oxide insulating film 23.

When the oxide insulating film through which oxygen passes is formed as the oxide insulating film 23, oxygen released from the oxide insulating film 25 provided over the oxide insulating film 23 can be moved to the oxide semiconductor film 19*a* through the oxide insulating film 23.

The oxide insulating film 25 is formed in contact with the oxide insulating film 23. The oxide insulating film 25 is formed using an oxide insulating film which contains oxygen at a higher proportion than the stoichiometric composition. Part of oxygen is released by heating from the oxide insulating film which contains oxygen at a higher proportion than the stoichiometric composition. The oxide insulating film which contains oxygen at a higher proportion than the stoichiometric composition is an oxide insulating film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the oxide insulating film 25.

It is preferable that the amount of defects in the oxide insulating film 25 be small and typically, the spin density of a signal that appears at g=2.001 be lower than $1.5 \times 10^{18}$ spins/cm$^3$, further preferably lower than or equal to $1 \times 10^{18}$ spins/cm$^3$ by ESR measurement. Note that the oxide insulating film 25 is provided more apart from the oxide semiconductor film 19*a* than the oxide insulating film 23 is; thus, the oxide insulating film 25 may have higher defect density than the oxide insulating film 23.

Like the nitride insulating film 15, the nitride insulating film 27 can be a nitride insulating film which is hardly permeated by oxygen. Furthermore, a nitride insulating film which is hardly permeated by oxygen, hydrogen, and water can be used.

The nitride insulating film 27 is formed using a silicon nitride film, a silicon nitride oxide film, an aluminum nitride film, an aluminum nitride oxide film, or the like with a thickness greater than or equal to 50 nm and less than or equal to 300 nm, preferably greater than or equal to 100 nm and less than or equal to 200 nm.

In the case where the oxide insulating film which contains oxygen at a higher proportion than the stoichiometric composition is included in the oxide insulating film 23 or the oxide insulating film 25, part of oxygen contained in the oxide insulating film 23 or the oxide insulating film 25 can be moved to the oxide semiconductor film 19*a*, so that the amount of oxygen vacancies contained in the oxide semiconductor film 19*a* can be reduced.

The threshold voltage of a transistor using an oxide semiconductor film with oxygen vacancies shifts negatively with ease, and such a transistor tends to be normally on. This is because charges are generated owing to oxygen vacancies in the oxide semiconductor film and the resistance is thus reduced. The transistor having normally-on characteristic causes various problems in that malfunction is likely to be caused when in operation and that power consumption is increased when not in operation, for example. Furthermore, there is a problem in that the amount of change in electrical characteristics, typically in threshold voltage, of the transistor is increased by change over time or due to a stress test.

However, in the transistor 102 in this embodiment, the oxide insulating film 23 or the oxide insulating film 25 provided over the oxide semiconductor film 19*a* contains oxygen at a higher proportion than the stoichiometric composition. Furthermore, the oxide semiconductor film 19*a*, the oxide insulating film 23, and the oxide insulating film 25 are surrounded by the nitride insulating film 15 and the oxide insulating film 17. As a result, oxygen contained in the oxide insulating film 23 or the oxide insulating film 25 is moved to the oxide semiconductor film 19*a* efficiently, so that the amount of oxygen vacancies in the oxide semiconductor film 19*a* can be reduced. Accordingly, a transistor having normally-off characteristic is obtained. Furthermore, the amount of change in electrical characteristics, typically in threshold voltage, of the transistor over time or due to a stress test can be reduced.

The common electrode 29 is formed using a light-transmitting film, preferably a light-transmitting conductive film. As the light-transmitting conductive film, an indium oxide film containing tungsten oxide, an indium zinc oxide film containing tungsten oxide, an indium oxide film containing titanium oxide, an indium tin oxide film containing titanium oxide, an indium tin oxide (hereinafter referred to as ITO) film, an indium zinc oxide film, an indium tin oxide film to which silicon oxide is added, and the like are given.

The extending direction of the conductive film 21*a* functioning as a signal line and the extending direction of the common electrode 29 intersect with each other. Therefore, differences in directions between the electric field between the conductive film 21*a* functioning as a signal line and the common electrode 29 and the electric field between the pixel electrode 19*b* and the common electrode 29 arise and the differences form a large angle. Accordingly, in the case where negative liquid crystal molecules are used, the alignment state of the liquid crystal molecules in the vicinity of the conductive film functioning as a signal line and the alignment state of the liquid crystal molecules in the vicinity of the pixel electrode which is generated by an electric field between the pixel electrodes provided in adjacent pixels and the common electrode are less likely to be affected by each other. Thus, a change in the transmittance of the pixels is suppressed. Accordingly, flickers in an image can be reduced.

In the liquid crystal display device having a low refresh rate, alignment of liquid crystal molecules in the vicinity of the conductive film 21*a* functioning as a signal line is less likely to affect alignment state of liquid crystal molecules in the vicinity of the pixel electrode due to the electric field between the pixel electrodes in the adjacent pixels and the common electrode 29 even during the retention period. Thus, the transmittance of the pixels in the retention period can be held and flickers can be reduced.

The common electrode 29 includes the stripe regions extending in a direction intersecting with the conductive film 21a functioning as a signal line. Accordingly, in the vicinity of the pixel electrode 19b and the conductive film 21a, unintended alignment of liquid crystal molecules can be prevented and thus light leakage can be suppressed. As a result, a display device with excellent contrast can be manufactured.

Note that the shape of the common electrode 29 is not limited to that illustrated in FIG. 4, and may be stripe. In the case of a stripe shape, the extending direction may be parallel to the conductive film functioning as a signal line. The common electrode 29 may have a comb shape. Alternatively, the common electrode may be formed over the entire surface of the first substrate 11. Further alternatively, a light-transmitting conductive film different from the pixel electrode 19b may be formed over the common electrode 29 with an insulating film provided therebetween.

The alignment film 33 is formed over the common electrode 29, the nitride insulating film 27, and the organic insulating film 31.

Next, a method for manufacturing the transistor 102 and the capacitor 105 in FIG. 5 is described with reference to FIGS. 10A to 10D, FIGS. 11A to 11D, and FIGS. 12A to 12C.

Figure 10A:
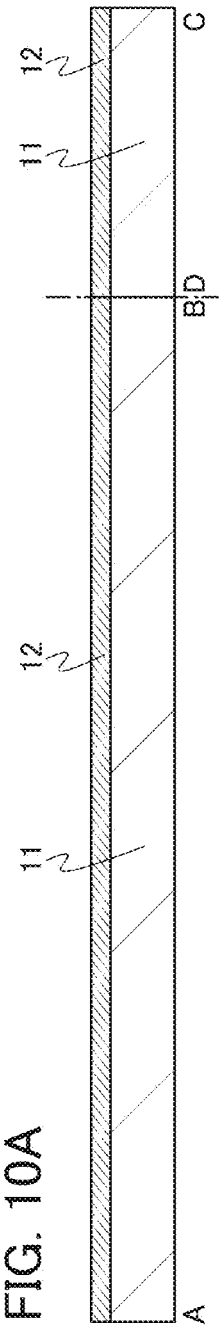
FIGS. 10A to 10D are cross-sectional views illustrating one embodiment of a method for manufacturing a display device.

As illustrated in FIG. 10A, a conductive film 12 to be the conductive film 13 is formed over the first substrate 11. The conductive film 12 is formed by a sputtering method, a chemical vapor deposition (CVD) method such as a metal organic chemical vapor deposition (MOCVD) method, a metal chemical deposition method, an atomic layer deposition (ALD) method, or a plasma-enhanced chemical vapor deposition (PECVD) method, an evaporation method, a pulsed laser deposition (PLD) method, or the like. When a metal organic chemical vapor deposition (MOCVD) method, a metal chemical deposition method, or an atomic layer deposition (ALD) method is employed, the conductive film is less damaged by plasma.

Here, a glass substrate is used as the first substrate 11. Furthermore, as the conductive film 12, a 100-nm-thick tungsten film is formed by a sputtering method.

Figure 10B:
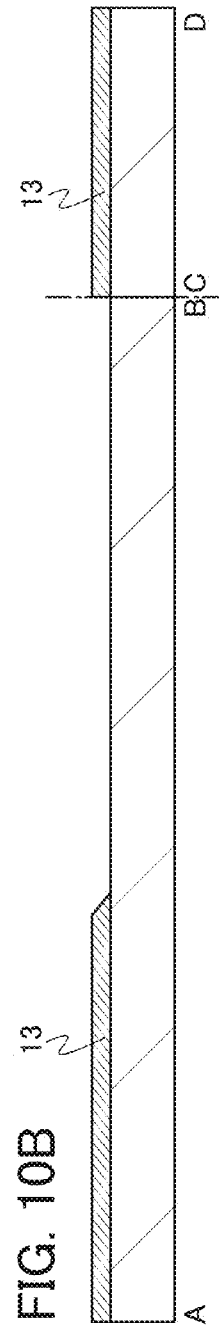

Next, a mask is formed over the conductive film 12 by a photolithography process using a first photomask. Then, as illustrated in FIG. 10B, part of the conductive film 12 is etched with the use of the mask to form the conductive film 13 functioning as a gate electrode. After that, the mask is removed.

Note that the conductive film 13 functioning as a gate electrode may be formed by an electrolytic plating method, a printing method, an ink jet method, or the like instead of the above formation method.

Here, the tungsten film is etched by a dry etching method to form the conductive film 13 functioning as a gate electrode.

Figure 10C:
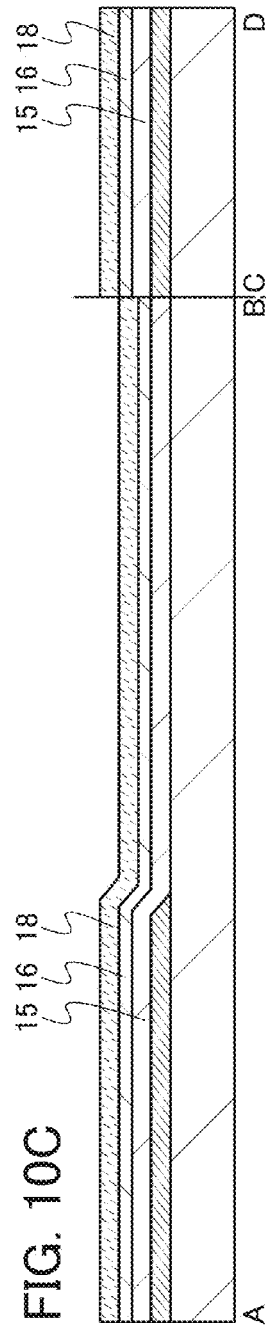

Next, as illustrated in FIG. 10C, over the conductive film 13 functioning as a gate electrode, the nitride insulating film 15 and an oxide insulating film 16 to be the oxide insulating film 17 later are formed. Then, over the oxide insulating film 16, an oxide semiconductor film 18 to be the oxide semiconductor film 19a and the pixel electrode 19b later is formed.

The nitride insulating film 15 and the oxide insulating film 16 are each formed by a sputtering method, a chemical vapor deposition (CVD) method such as a metal organic chemical vapor deposition (MOCVD) method, a metal chemical deposition method, an atomic layer deposition (ALD) method, or a plasma-enhanced chemical vapor deposition (PECVD) method, an evaporation method, a pulsed laser deposition (PLD) method, a coating method, a printing method, or the like. When a metal organic chemical vapor deposition (MOCVD) method, a metal chemical deposition method, or an atomic layer deposition (ALD) method is employed, the nitride insulating film 15 and the oxide insulating film 16 are less damaged by plasma. When an atomic layer deposition (ALD) method is employed, coverage of the nitride insulating film 15 and the oxide insulating film 16 can be increased.

Here, as the nitride insulating film 15, a 300-nm-thick silicon nitride film is formed by a plasma CVD method in which silane, nitrogen, and ammonia are used as a source gas.

In the case where a silicon oxide film, a silicon oxynitride film, or a silicon nitride oxide film is formed as the oxide insulating film 16, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples.

Moreover, in the case of forming a gallium oxide film as the oxide insulating film 16, a metal organic chemical vapor deposition (MOCVD) method can be employed.

Here, as the oxide insulating film 16, a 50-nm-thick silicon oxynitride film is formed by a plasma CVD method in which silane and dinitrogen monoxide are used as a source gas.

The oxide semiconductor film 18 can be formed by a sputtering method, a chemical vapor deposition (CVD) method such as a metal organic chemical vapor deposition (MOCVD) method, an atomic layer deposition (ALD) method, or a plasma-enhanced chemical vapor deposition (PECVD) method, a pulsed laser deposition method, a laser ablation method, a coating method, or the like. When a metal organic chemical vapor deposition (MOCVD) method, a metal chemical deposition method, or an atomic layer deposition (ALD) method is employed, the oxide semiconductor film 18 is less damaged by plasma and the oxide insulating film 16 is less damaged. When an atomic layer deposition (ALD) method is employed, coverage of the oxide semiconductor film 18 can be increased.

As a power supply device for generating plasma in the case of forming the oxide semiconductor film by a sputtering method, an RF power supply device, an AC power supply device, a DC power supply device, or the like can be used as appropriate.

As a sputtering gas, a rare gas (typically argon), an oxygen gas, or a mixed gas of a rare gas and oxygen is used as appropriate. In the case of using the mixed gas of a rare gas and oxygen, the proportion of oxygen to a rare gas is preferably increased.

Furthermore, a target may be selected as appropriate in accordance with the composition of the oxide semiconductor film to be formed.

In order to obtain a highly purified intrinsic or substantially highly purified intrinsic oxide semiconductor film, it is necessary to highly purify a sputtering gas as well as to evacuate a chamber to a high vacuum. As an oxygen gas or an argon gas used for a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film can be prevented as much as possible.

Here, a 35-nm-thick In—Ga—Zn oxide film is formed as the oxide semiconductor film by a sputtering method using an In—Ga—Zn oxide target (In:Ga:Zn=1:1:1).

Figure 10D:
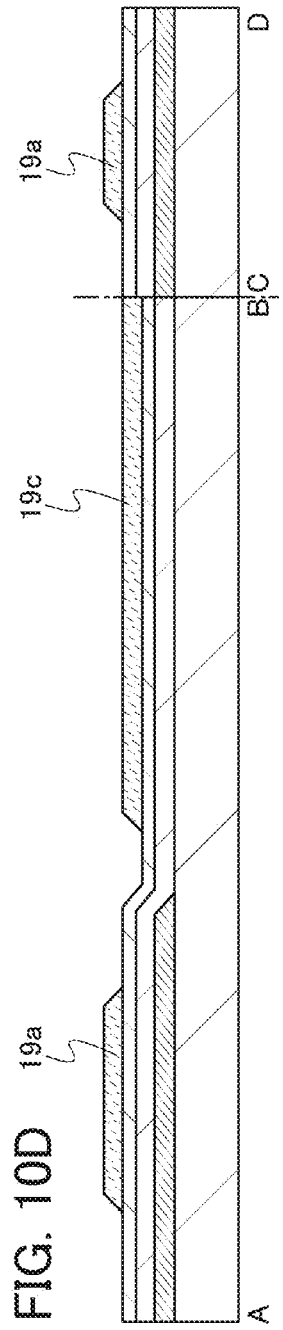

Then, after a mask is formed over the oxide semiconductor film 18 by a photolithography process using a second photomask, the oxide semiconductor film is partly etched using the mask. Thus, the oxide semiconductor film 19a and an oxide semiconductor film 19c which are isolated from each other as illustrated in FIG. 10D are formed. After that, the mask is removed.

Here, the oxide semiconductor films 19a and 19c are formed in such a manner that a mask is formed over the oxide semiconductor film 18 and part of the oxide semiconductor film 18 is selectively etched by a wet etching method.

Next, as illustrated in FIG. 11A, a conductive film 20 to be the conductive films 21a and 21b later is formed.

The conductive film 20 can be formed by a method similar to that of the conductive film 12 as appropriate.

Here, a 50-nm-thick tungsten film and a 300-nm-thick copper film are sequentially stacked by a sputtering method.

Next, a mask is formed over the conductive film 20 by a photolithography process using a third photomask. Then, the conductive film 20 is etched using the mask, so that the conductive films 21a and 21b functioning as a source electrode and a drain electrode are formed as illustrated in FIG. 11B. After that, the mask is removed.

Here, the mask is formed over the copper film by a photolithography process. Then, the tungsten film and the copper film are etched with the use of the mask, so that the conductive films 21a and 21b are formed. Note that the copper film is etched by a wet etching method. Next, the tungsten film is etched by a dry etching method using $SF_6$, whereby fluoride is formed on the surface of the copper film. By the fluoride, diffusion of copper elements from the copper film is reduced and thus the copper concentration in the oxide semiconductor film 19a can be reduced.

Next, as illustrated in FIG. 11C, an oxide insulating film 22 to be the oxide insulating film 23 later and an oxide insulating film 24 to be the oxide insulating film 25 later are formed over the oxide semiconductor films 19a and 19c and the conductive films 21a and 21b. The oxide insulating film 22 and the oxide insulating film 24 can each be formed by a method similar to those of the nitride insulating film 15 and the oxide insulating film 16 as appropriate.

Note that after the oxide insulating film 22 is formed, the oxide insulating film 24 is preferably formed in succession without exposure to the air. After the oxide insulating film 22 is formed, the oxide insulating film 24 is formed in succession by adjusting at least one of the flow rate of a source gas, pressure, a high-frequency power, and a substrate temperature without exposure to the air, whereby the concentration of impurities attributed to the atmospheric component at the interface between the oxide insulating film 22 and the oxide insulating film 24 can be reduced and oxygen in the oxide insulating film 24 can be moved to the oxide semiconductor film 19a; accordingly, the amount of oxygen vacancies in the oxide semiconductor film 19a can be reduced.

The oxide insulating film 22 can be formed using an oxide insulating film containing nitrogen and having a small number of defects which is formed by a CVD method under the conditions where the ratio of an oxidizing gas to a deposition gas is higher than 20 times and lower than 100 times, preferably higher than or equal to 40 times and lower than or equal to 80 times and the pressure in a treatment chamber is lower than 100 Pa, preferably lower than or equal to 50 Pa.

A deposition gas containing silicon and an oxidizing gas are preferably used as the source gas of the oxide insulating film 22. Typical examples of the deposition gas containing silicon include silane, disilane, trisilane, and silane fluoride. As the oxidizing gas, oxygen, ozone, dinitrogen monoxide, and nitrogen dioxide can be given as examples.

With the use of the above conditions, an oxide insulating film which permeates oxygen can be formed as the oxide insulating film 22. Furthermore, by providing the oxide insulating film 22, damage to the oxide semiconductor film 19a can be reduced in the step of forming the oxide insulating film 24.

Here, as the oxide insulating film 22, a 50-nm-thick silicon oxynitride film is formed by a plasma CVD method in which silane with a flow rate of 50 sccm and dinitrogen monoxide with a flow rate of 2000 sccm are used as a source gas, the pressure in the treatment chamber is 20 Pa, the substrate temperature is 220° C., and a high-frequency power of 100 W is supplied to parallel-plate electrodes with the use of a 27.12 MHz high-frequency power source. Under the above conditions, a silicon oxynitride film containing nitrogen and having a small number of defects can be formed.

As the oxide insulating film 24, a silicon oxide film or a silicon oxynitride film is formed under the following conditions: the substrate placed in a treatment chamber of a plasma CVD apparatus that is vacuum-evacuated is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of a source gas into the treatment chamber, and a high-frequency power of greater than or equal to 0.17 $W/cm^2$ and less than or equal to 0.5 $W/cm^2$, preferably greater than or equal to 0.25 $W/cm^2$ and less than or equal to 0.35 $W/cm^2$ is supplied to an electrode provided in the treatment chamber.

A deposition gas containing silicon and an oxidizing gas are preferably used as the source gas of the oxide insulating film 24. Typical examples of the deposition gas containing silicon include silane, disilane, trisilane, and silane fluoride. As the oxidizing gas, oxygen, ozone, dinitrogen monoxide, and nitrogen dioxide can be given as examples.

As the film formation conditions of the oxide insulating film 24, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content in the oxide insulating film 24 becomes higher than that in the stoichiometric composition. On the other hand, in the film formed at a substrate temperature within the above temperature range, the bond between silicon and oxygen is weak, and accordingly, part of oxygen in the film is released by heat treatment in a later step. Thus, it is possible to form an oxide insulating film which contains oxygen at a higher proportion than the stoichiometric composition and from which part of oxygen is released by heating. Furthermore, the oxide insulating film 22 is provided over the oxide semiconductor film 19a. Accordingly, in the step of forming the oxide insulating film 24, the oxide insulating film 22 serves as a protective film of the oxide semiconductor film 19a. Consequently, the oxide insulating film 24 can be formed using the high-frequency power having a high power density while damage to the oxide semiconductor film 19a is reduced.

Here, as the oxide insulating film 24, a 400-nm-thick silicon oxynitride film is formed by a plasma CVD method in which silane with a flow rate of 200 sccm and dinitrogen monoxide with a flow rate of 4000 sccm are used as the source gas, the pressure in the treatment chamber is 200 Pa, the substrate temperature is 220° C., and a high-frequency power of 1500 W is supplied to the parallel-plate electrodes with the use of a 27.12 MHz high-frequency power source. Note that the plasma CVD apparatus is a parallel-plate plasma CVD apparatus in which the electrode area is 6000 $cm^2$, and the power per unit area (power density) into which the supplied power is converted is 0.25 $W/cm^2$.

Furthermore, when the conductive films 21a and 21b functioning as a source electrode and a drain electrode is formed, the oxide semiconductor film 19a is damaged by the etching of the conductive film, so that oxygen vacancies are generated on the back channel side of the oxide semiconductor film 19a (the side of the oxide semiconductor film 19a which is opposite to the side facing the conductive film 13 functioning as a gate electrode). However, with the use of the oxide insulating film which contains oxygen at a higher proportion than the stoichiometric composition as the oxide insulating film 24, the oxygen vacancies generated on the back channel side can be repaired by heat treatment. By this, defects contained in the oxide semiconductor film 19a can be reduced, and thus, the reliability of the transistor 102 can be improved.

Then, a mask is formed over the oxide insulating film 24 by a photolithography process using a fourth photomask. Next, as illustrated in FIG. 11D, part of the oxide insulating film 22 and part of the oxide insulating film 24 are etched with the use of the mask to form the oxide insulating film 23 and the oxide insulating film 25 having the opening 40. After that, the mask is removed.

In the process, the oxide insulating films 22 and 24 are preferably etched by a dry etching method. As a result, the oxide semiconductor film 19c is exposed to plasma in the etching treatment; thus, the amount of oxygen vacancies in the oxide semiconductor film 19c can be increased.

Next, heat treatment is performed. The heat treatment is performed typically at a temperature higher than or equal to 150° C. and lower than or equal to 400° C., preferably higher than or equal to 300° C. and lower than or equal to 400° C., further preferably higher than or equal to 320° C. and lower than or equal to 370° C.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

The heat treatment may be performed under an atmosphere of nitrogen, oxygen, ultra-dry air (air in which a water content is 20 ppm or less, preferably 1 ppm or less, further preferably 10 ppb or less), or a rare gas (argon, helium, or the like). The atmosphere of nitrogen, oxygen, ultra-dry air, or a rare gas preferably does not contain hydrogen, water, and the like.

By the heat treatment, part of oxygen contained in the oxide insulating film 25 can be moved to the oxide semiconductor film 19a, so that the amount of oxygen vacancies contained in the oxide semiconductor film 19a can be further reduced.

In the case where water, hydrogen, or the like enters the oxide insulating film 23 and the oxide insulating film 25 and the nitride insulating film 26 has a barrier property against water, hydrogen, or the like, when the nitride insulating film 26 is formed later and heat treatment is performed, water, hydrogen, or the like contained in the oxide insulating film 23 and the oxide insulating film 25 are moved to the oxide semiconductor film 19a, so that defects are generated in the oxide semiconductor film 19a. However, by the heating, water, hydrogen, or the like contained in the oxide insulating film 23 and the oxide insulating film 25 can be released; thus, variation in electrical characteristics of the transistor 102 can be reduced, and a change in threshold voltage can be suppressed.

Note that when the oxide insulating film 24 is formed over the oxide insulating film 22 while being heated, oxygen can be moved to the oxide semiconductor film 19a to reduce the amount of oxygen vacancies in the oxide semiconductor film 19a; thus, the heat treatment is not necessarily performed.

The heat treatment may be performed after the formation of the oxide insulating films 22 and 24. However, the heat treatment is preferably performed after the formation of the oxide insulating films 23 and 25 because a film having higher conductivity can be formed in such a manner that oxygen is not moved to the oxide semiconductor film 19c and oxygen is released from the oxide semiconductor film 19c because of exposure of the oxide semiconductor film 19c and then oxygen vacancies are generated.

Here, the heat treatment is performed at 350° C. in a mixed atmosphere of nitrogen and oxygen for one hour.

Then, as illustrated in FIG. 12A, the nitride insulating film 26 is formed.

The nitride insulating film 26 can be formed by a method similar to those of the nitride insulating film 15 and the oxide insulating film 16 as appropriate. By forming the nitride insulating film 26 by a sputtering method, a CVD method, or the like, the oxide semiconductor film 19c is exposed to plasma; thus, the amount of oxygen vacancies in the oxide semiconductor film 19c can be increased.

The oxide semiconductor film 19c has improved conductivity and functions as the pixel electrode 19b. When a silicon nitride film is formed by a plasma CVD method as the nitride insulating film 26, hydrogen contained in the silicon nitride film is diffused to the oxide semiconductor film 19c; thus, the conductivity of the pixel electrode 19b can be enhanced.

In the case where a silicon nitride film is formed by a plasma CVD method as the nitride insulating film 26, the substrate placed in the treatment chamber of the plasma CVD apparatus that is vacuum-evacuated is preferably held at a temperature higher than or equal to 300° C. and lower than or equal to 400° C., further preferably higher than or equal to 320° C. and lower than or equal to 370° C., so that a dense silicon nitride film can be formed.

In the case where a silicon nitride film is formed, a deposition gas containing silicon, nitrogen, and ammonia are preferably used as a source gas. As the source gas, a small amount of ammonia compared to the amount of nitrogen is used, whereby ammonia is dissociated in the plasma and activated species are generated. The activated species cleave a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia is larger than the amount of nitrogen in the source gas, cleavage of a deposition gas containing silicon and cleavage of nitrogen are not promoted, so that a sparse silicon nitride film in which bonds between silicon and hydrogen remain and defects are increased is formed. Therefore, in a source gas, the flow ratio of the nitrogen to the ammonia is set to be preferably greater than or equal to 5 and less than or equal to 50, further preferably greater than or equal to 10 and less than or equal to 50.

Here, in the treatment chamber of a plasma CVD apparatus, a 50-nm-thick silicon nitride film is formed as the nitride insulating film 26 by a plasma CVD method in which silane with a flow rate of 50 sccm, nitrogen with a flow rate of 5000 sccm, and ammonia with a flow rate of 100 sccm are used as the source gas, the pressure in the treatment chamber is 100 Pa, the substrate temperature is 350° C., and a high-frequency power of 1000 W is supplied to parallel-plate electrodes with a high-frequency power supply of 27.12 MHz. Note that the plasma CVD apparatus is a parallel-plate plasma CVD apparatus in which the electrode area is 6000 cm$^2$, and the power per unit area (power density) into which the supplied power is converted is $1.7 \times 10^{-1}$ W/cm$^2$.

Next, heat treatment may be performed. The heat treatment is performed typically at a temperature higher than or equal to 150° C. and lower than or equal to 400° C., preferably higher than or equal to 300° C. and lower than or equal to 400° C., further preferably higher than or equal to 320° C. and lower than or equal to 370° C. As a result, the negative shift of the threshold voltage can be reduced. Moreover, the amount of change in the threshold voltage can be reduced.

Next, although not illustrated, a mask is formed by a photolithography process using a fifth photomask. Then, part of each of the nitride insulating film 15, the oxide insulating film 16, the oxide insulating film 23, the oxide insulating film 25, and the nitride insulating film 26 is etched using the mask to form the nitride insulating film 27 and an opening through which part of a connection terminal formed at the same time as the conductive film 13 is exposed. Alternatively, part of each of the oxide insulating film 23, the oxide insulating film 25, and the nitride insulating film 26 is etched to form the nitride insulating film 27 and an opening through which part of a connection terminal formed at the same time as the conductive films 21a and 21b is exposed.

Next, as illustrated in FIG. 12B, a conductive film 28 to be the common electrode 29 later is formed over the nitride insulating film 27.

The conductive film 28 is formed by a sputtering method, a CVD method, an evaporation method, or the like.

Then, a mask is formed over the conductive film 28 by a photolithography process using a sixth photomask. Next, as illustrated in FIG. 12C, part of the conductive film 28 is etched with the use of the mask to form the common electrode 29. Although not illustrated, the common electrode 29 is connected to the connection terminal formed at the same time as the conductive film 13 or the connection terminal formed at the same time as the conductive films 21a and 21b. After that, the mask is removed.

Next, as illustrated in FIG. 13, the organic insulating film 31 is formed over the nitride insulating film 27. An organic insulating film can be formed by a coating method, a printing method, or the like as appropriate.

In the case where the organic insulating film is formed by a coating method, a photosensitive composition, with which the upper surfaces of the nitride insulating film 27 and the common electrode 29 are coated, is exposed to light and developed by photolithography process using a seventh photomask, and is then subjected to heat treatment. Note that in the case where the upper surfaces of the nitride insulating film 27 and the common electrode 29 are coated with a non-photosensitive composition, a resist, with which the upper surface of the non-photosensitive composition is coated, is processed by a photolithography process using a seventh mask to form a mask, and then the non-photosensitive composition is etched using the mask, whereby the organic insulating film 31 can be formed.

Through the above process, the transistor 102 is manufactured and the capacitor 105 can be manufactured.

The element substrate of the display device described in this embodiment includes an organic insulating film overlapping with a transistor with an inorganic insulating film provided therebetween. Therefore, a display device in which reliability of the transistor can be improved and whose display quality is maintained can be manufactured.

The element substrate of the display device of this embodiment is provided with a common electrode whose upper surface has a zigzag shape and which includes stripe regions extending in a direction intersecting with the conductive film functioning as a signal line. Therefore, the display device can have excellent contrast. In addition, flickers can be reduced in a liquid crystal display device having a low refresh rate.

In the element substrate of the display device of this embodiment, the pixel electrode is formed at the same time as the oxide semiconductor film of the transistor; therefore, the transistor 102 and the capacitor 105 can be formed using six photomasks. The pixel electrode functions as the one of electrodes of the capacitor. The common electrode also functions as the other of electrodes of the capacitor. Thus, a step of forming another conductive film is not needed to form the capacitor, and the number of steps of manufacturing the display device can be reduced. The capacitor has a light-transmitting property. As a result, the area occupied by the capacitor can be increased and the aperture ratio in a pixel can be increased. Moreover, power consumption of the display device can be reduced.

Next, the element layer formed on the second substrate 342 is described. A film having a colored property (hereinafter referred to as a coloring film 346) is formed on the second substrate 342. The coloring film 346 functions as a color filter. Furthermore, a light-blocking film 344 adjacent to the coloring film 346 is formed on the second substrate 342. The light-blocking film 344 functions as a black matrix. The coloring film 346 is not necessarily provided in the case where the liquid crystal display device is a monochrome display device, for example.

The coloring film 346 is a coloring film that transmits light in a specific wavelength range. For example, a red (R) film for transmitting light in a red wavelength range, a green (G) film for transmitting light in a green wavelength range, a blue (B) film for transmitting light in a blue wavelength range, or the like can be used.

The light-blocking film 344 preferably has a function of blocking light in a specific wavelength range, and can be a metal film or an organic insulating film including a black pigment or the like, for example.

An insulating film 348 is formed on the coloring film 346. The insulating film 348 functions as a planarization layer or suppresses diffusion of impurities in the coloring film 346 to the liquid crystal element side.

A conductive film 350 is formed on the insulating film 348. The conductive film 350 is formed using a light-transmitting conductive film. The potential of the conductive film 350 is preferably the same as that of the common electrode 29. In other words, a common potential is preferably applied to the conductive film 350.

When a voltage for driving the liquid crystal molecules is applied to the conductive film 21b, an electric field is generated between the conductive film 21b and the common electrode 29. Liquid crystal molecules between the conductive film 21b and the common electrode 29 align due to the effect of the electric field and thus a flicker is generated.

However, it is possible to suppress an alignment change of liquid crystal molecules in a direction perpendicular to the substrate due to an electric field between the conductive film 21b and the common electrode 29 in such a manner that the conductive film 350 is provided to face the common electrode 29 through the liquid crystal layer 320 so that the common electrode 29 and the conductive film 350 have the same potential. Accordingly, the alignment state of the liquid crystal molecules in the region is stabilized. Thus, flickers can be reduced.

Note that the alignment film 352 is formed on the conductive film 350.

In addition, the liquid crystal layer 320 is formed between the alignment films 33 and 352. The liquid crystal layer 320 is sealed between the first substrate 11 and the second substrate 342 with the use of a sealant (not illustrated). The sealant is preferably in contact with an inorganic material to prevent entry of moisture and the like from the outside.

A spacer may be provided between the alignment films 33 and 352 to maintain the thickness of the liquid crystal layer 320 (also referred to as a cell gap).

Note that the structures, methods, and the like described in this embodiment can be used as appropriate in combination with any of the structures, methods, and the like described in the other embodiments.

MODIFICATION EXAMPLE 1

A structure in which a common line connected to the common electrode is provided in the display device described in Embodiment 1 is described with reference to FIGS. 14A and 14B.

Figure 14A:
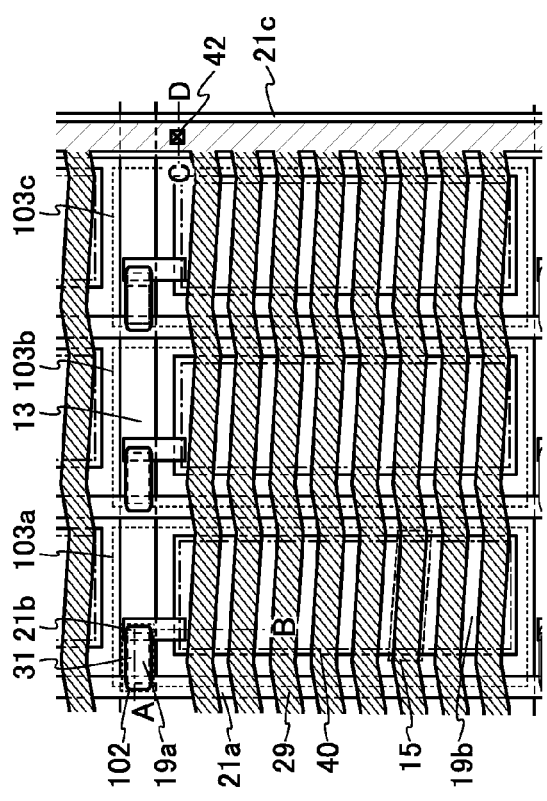
FIGS. 14A and 14B are a top view and a cross-sectional view illustrating one embodiment of a display device.
Figure 14B:
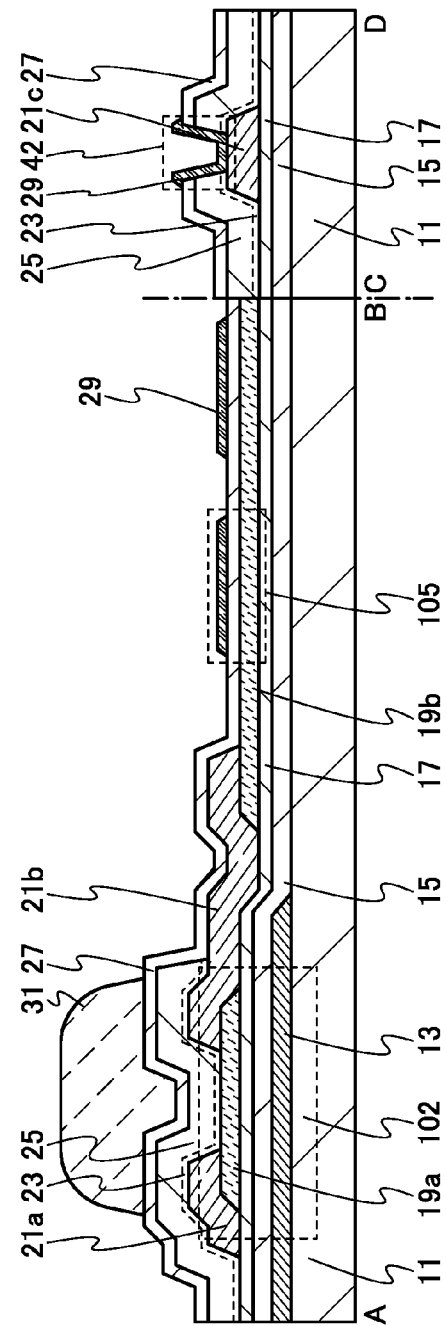

FIG. 14A is a top view of the pixels 103a, 103b, and 103c included in a display device, and FIG. 14B is a cross-sectional view taken along dashed-dotted lines A-B and C-D in FIG. 14A.

As illustrated in FIG. 14A, the upper surface of the common electrode 29 has a zigzag shape, and the extending direction of the conductive film 21a functioning as a signal line intersects with the extending direction of the common electrode 29.

For easy understanding of the structure of the common electrode 29, the common electrode 29 is hatched in FIG. 14A to explain its shape. The common electrode 29 includes regions hatched diagonally left down and a region hatched diagonally right down. The regions hatched diagonally left down are stripe regions (first regions) having a zigzag shape, and the extending direction of the conductive film 21a functioning as a signal line intersects with the extending direction of the common electrode 29. The region hatched diagonally right down is a connection region (second region) connected to the stripe regions (first regions) and extending in a direction parallel or substantially parallel to the conductive film 21a functioning as a signal line.

A common line 21c overlaps with the connection region (second region) of the common electrode 29.

Alternatively, the common line 21c may be provided every plurality of pixels. Alternatively, the common line 21c may be provided every plurality of pixels. For example, as illustrated in FIG. 14A, one common line 21c is provided for every three pixels, so that the area occupied by the common line in the flat plane of the display device can be reduced. As a result, the area of the pixel and the aperture ratio of the pixel can be increased.

In a region where the pixel electrode 19b and the common electrode 29 overlap with each other, a liquid crystal molecule is less likely to be driven by an electric field generated between the pixel electrode 19b and the connection region (second region) of the common electrode 29. Therefore, the area of a region overlapping with the pixel electrode 19b in the connection region (second region) of the common electrode 29 is reduced, so that a region where a liquid crystal molecule is driven can be increased, leading to an increase in the aperture ratio. For example, as illustrated in FIG. 14A, the connection region (second region) of the common electrode 29 is provided so as not to overlap with the pixel electrode 19b, whereby the area of a region where the pixel electrode 19b and the common electrode 29 overlap with each other can be reduced and thus the aperture ratio of the pixel can be increased.

Although one common line 21c is provided for the three pixels 103a, 103b, and 103c in FIG. 14A, one common line 21c may be provided for every two pixels. Alternatively, one common line 21c may be provided for every four or more pixels.

As illustrated in FIG. 14B, the common line 21c can be formed at the same time as the conductive film 21a functioning as a signal line. The common electrode 29 is connected to the common line 21c in an opening 42 formed in the oxide insulating film 23, the oxide insulating film 25, and the nitride insulating film 27.

Since a material of the conductive film 21a has resistivity lower than that of the common electrode 29, resistance of the common electrode 29 and the common line 21c can be reduced.

MODIFICATION EXAMPLE 2

This modification example is different from Embodiment 2 in that a transistor included in a high resolution display device includes a source electrode and a drain electrode capable of reducing light leakage.

Figure 15:
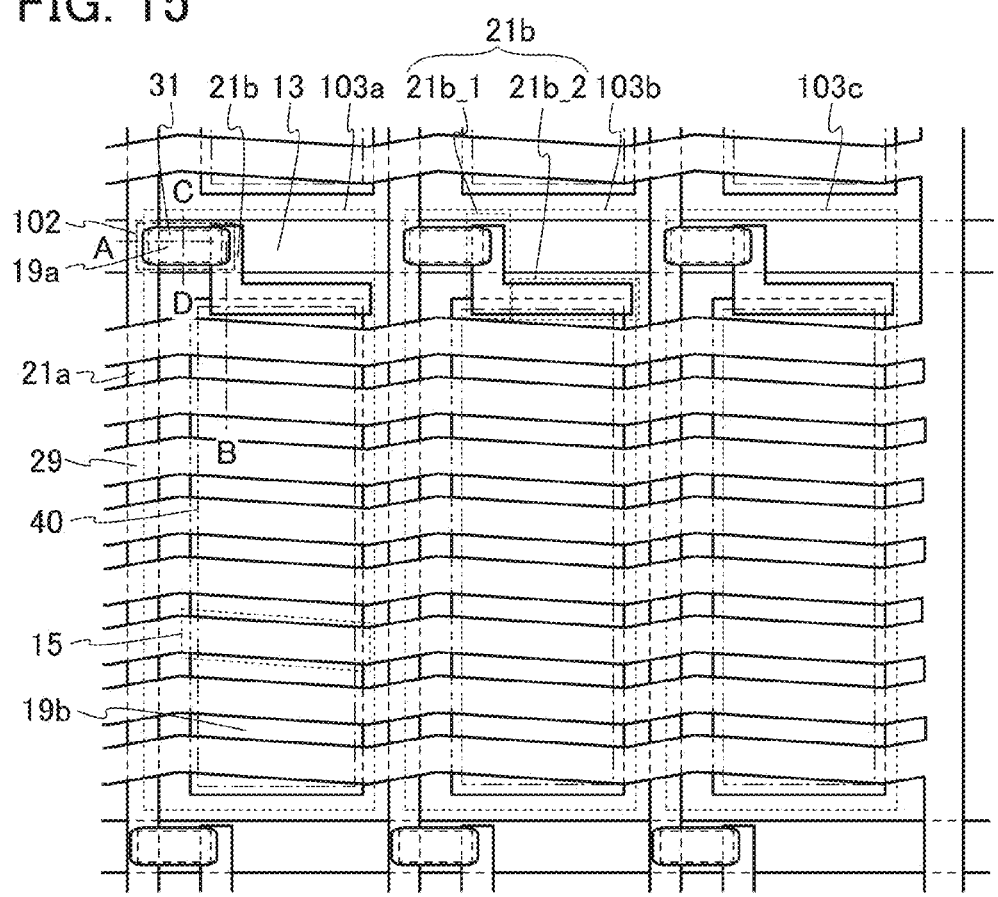
FIG. 15 is a top view illustrating one embodiment of a display device.

FIG. 15 is a top view of the display device described in this embodiment. One of features of the display device is that the conductive film 21b functioning as one of a source electrode and a drain electrode has an L shape in the top view. In other words, the conductive film 21b has a shape in which a region 21b_1 extending in a direction perpendicular or substantially perpendicular to the extending direction of the conductive film 13 functioning as a scan line and a region 21b_2 extending in a direction parallel or substantially parallel to the extending direction of the conductive film 13 are connected to each other in the top view. The region 21b_2 overlaps with at least one of the conductive film 13, the pixel electrode 19b, and the common electrode 29 in the top view. Alternatively, the conductive film 21b includes the region 21b_2 extending in a direction parallel or substantially parallel to the extending direction of the conductive film 13 and the region 21b_2 is placed between the conductive film 13 and the pixel electrode 19b or the common electrode 29 in the top view.

Since the area of the pixel in a high resolution display device is reduced, the distance between the common electrode 29 and the conductive film 13 functioning as a scan line is reduced. In a pixel performing black display, when voltage at which a transistor is turned on is applied to the conductive film 13 functioning as a scan line, an electric field is generated between the pixel electrode 19b in a black display state and the conductive film 13 functioning as a scan line. As a result, a liquid crystal molecule rotates in an unintended direction, causing light leakage.

However, in the transistor included in the display device of this embodiment, the conductive film 21b functioning as one of a source electrode and a drain electrode includes the region 21b_2 overlapping with at least one of the conductive film 13, the pixel electrode 19b, and the common electrode 29, or the region 21b_2 placed between the conductive film 13 and the pixel electrode 19b or the common electrode 29 in the top view. As a result, the region 21b_2 blocks the electric field of the conductive film 13 functioning as a scan line and an electric field generated between the conductive film 13 and the pixel electrode 19b can be suppressed, leading to a reduction in light leakage.

Figure 16:
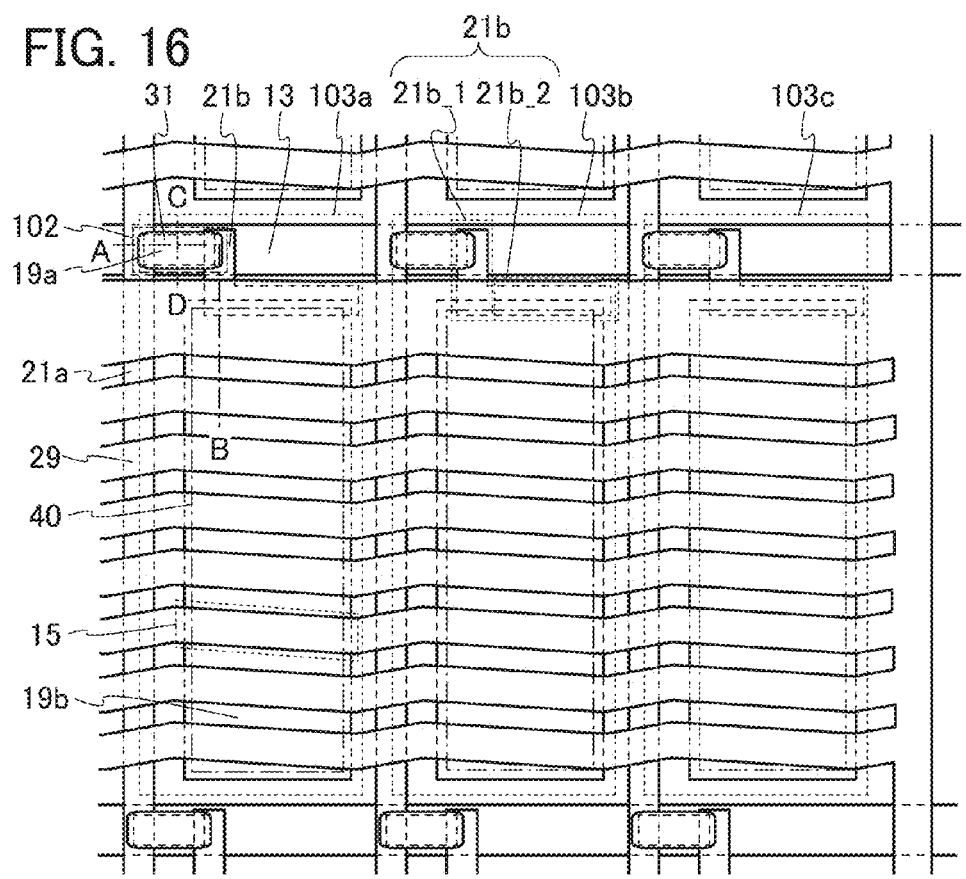
FIG. 16 is a top view illustrating one embodiment of a display device.

Note that the conductive film 21b and the common electrode 29 may overlap with each other. The overlapping region can function as a capacitor. Therefore, with this structure, the capacitance of the capacitor can be increased. FIG. 16 illustrates an example of this case.

MODIFICATION EXAMPLE 3

This modification example is different from Embodiment 2 in that a high resolution display device includes a common electrode capable of reducing light leakage.

Figure 17:
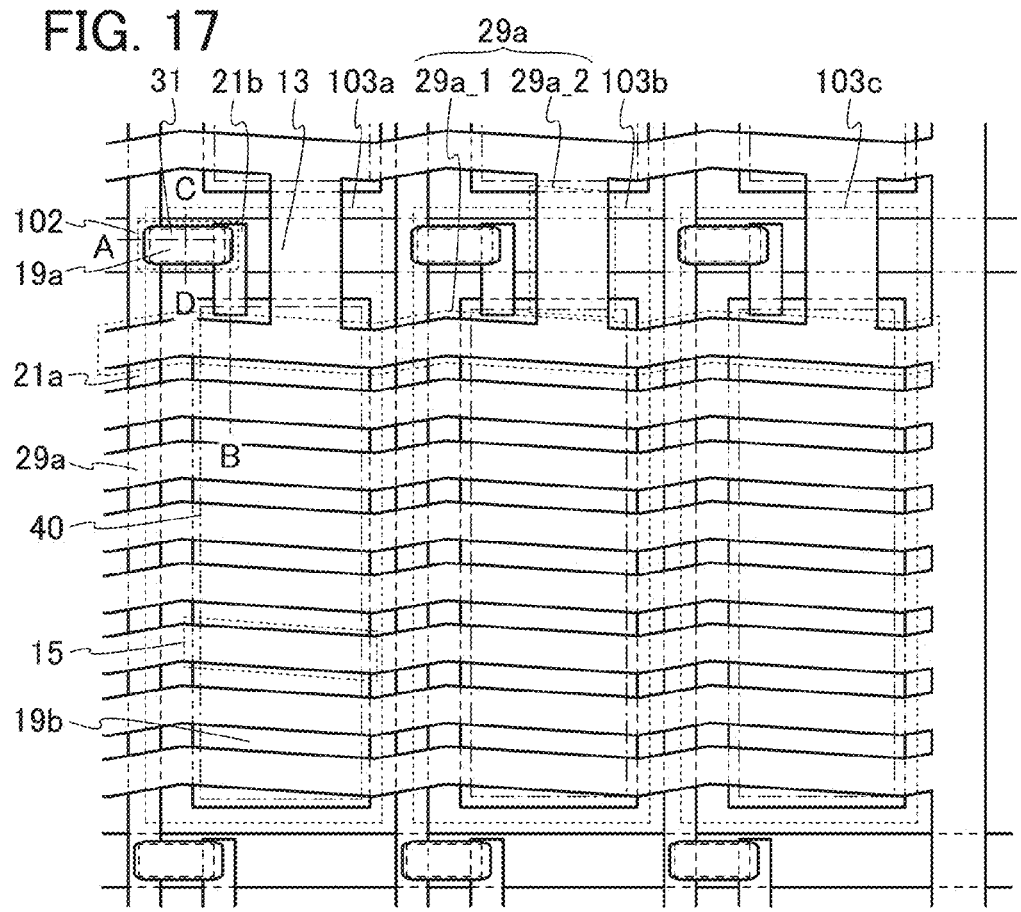
FIG. 17 is a top view illustrating one embodiment of a display device.

FIG. 17 is a top view of the display device described in this embodiment. A common electrode 29a includes a stripe region 29a_1 extending in a direction intersecting with the conductive film 21a functioning as a signal line and a region 29a_2 which is connected to the stripe region and overlaps with the conductive film 13 functioning as a scan line.

Since the area of a pixel is reduced in a high resolution display device, the distance between the pixel electrode 19b and the conductive film 13 functioning as a scan line is reduced. When voltage is applied to the conductive film 13 functioning as a scan line, an electric field is generated between the conductive film 13 and the pixel electrode 19b. As a result, a liquid crystal molecule rotates in an unintended direction, causing light leakage.

However, the display device described in this embodiment includes the common electrode 29a including the region 29a_2 intersecting with the conductive film 13 functioning as a scan line. Therefore, an electric field is generated between the conductive film 13 and the common electrode 29a, a liquid crystal molecule rotates due to an electric field being generated between the pixel electrode 19b and the conductive film 13 functioning as a scan line can be suppressed, leading to a reduction in light leakage.

Figure 18:
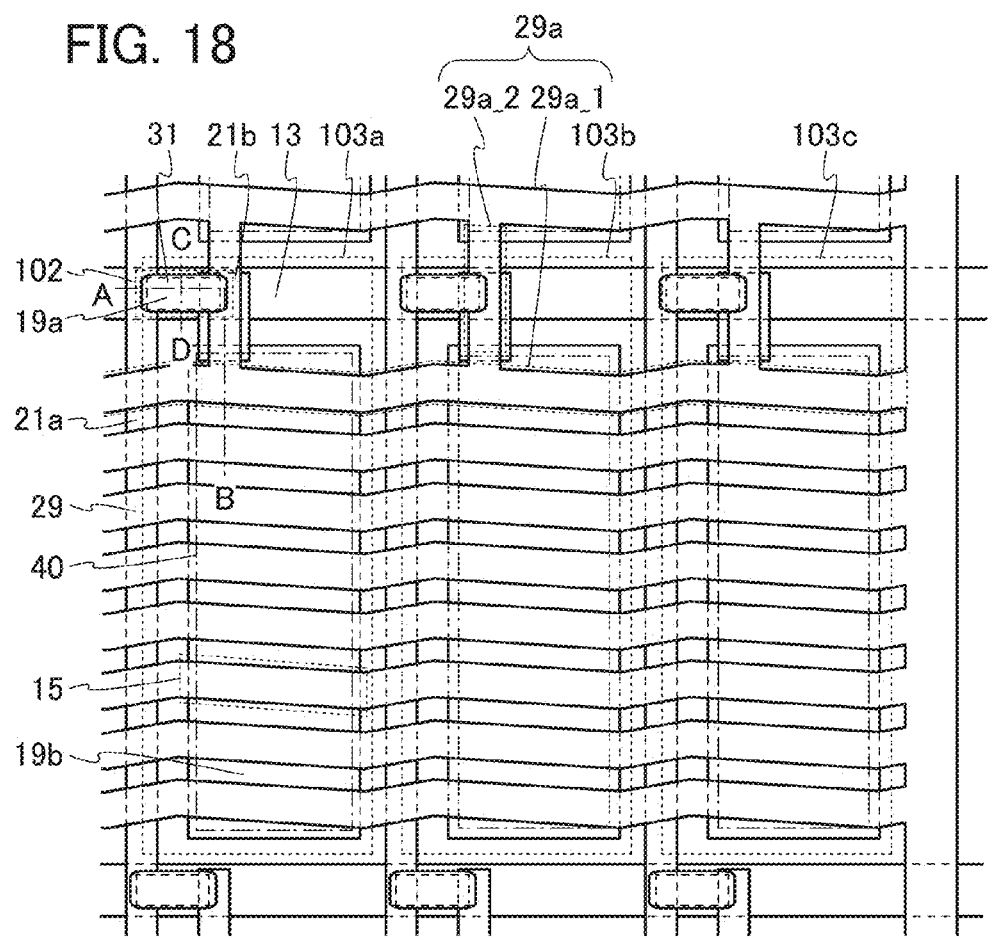
FIG. 18 is a top view illustrating one embodiment of a display device.

Note that the conductive film 21b and the common electrode 29a may overlap with each other. The overlapping region can function as a capacitor. Therefore, with this structure, the capacitance of the capacitor can be increased. FIG. 18 illustrates an example of this case.

Note that the structures, methods, and the like described in this embodiment can be used as appropriate in combination with any of the structures, methods, and the like described in the other embodiments.

[Embodiment 3]

In this embodiment, as an example of a display device, a liquid crystal display device driven in a vertical alignment (VA) mode will be described. First, a top view of a plurality of pixels 103 included in the liquid crystal display device is shown in FIG. 19.

Figure 19:
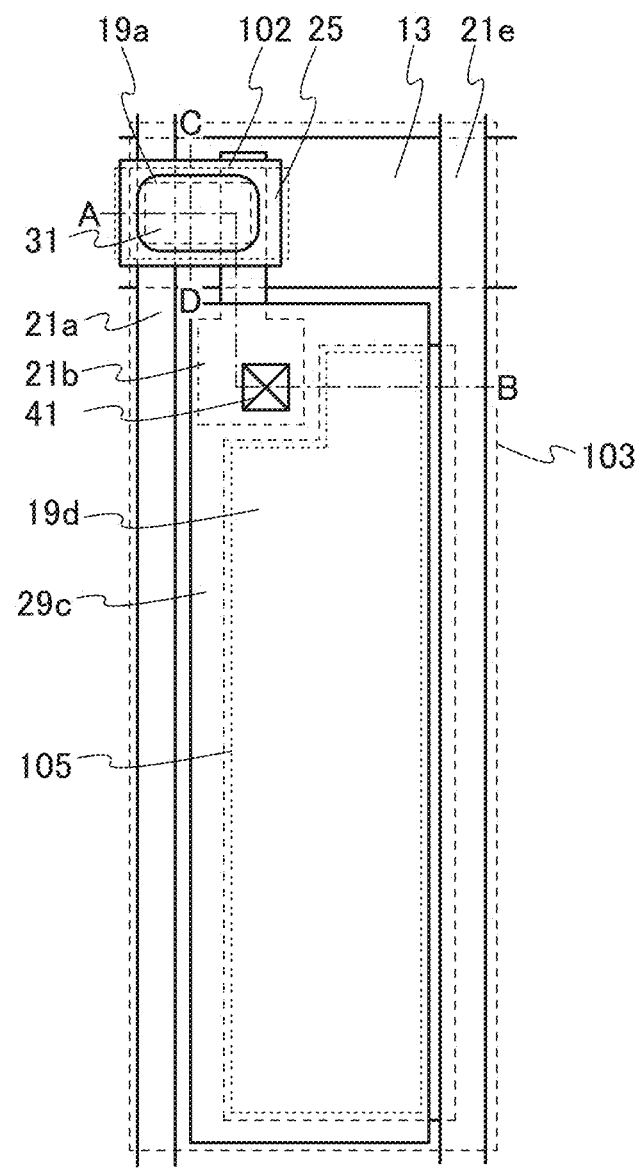
FIG. 19 is a top view illustrating one embodiment of a display device.

In FIG. 19, a conductive film 13 functioning as a scan line extends in a direction substantially perpendicularly to a conductive film functioning as a signal line (in the lateral direction in the drawing). The conductive film 21a functioning as a signal line extends in a direction substantially perpendicularly to the conductive film functioning as a scan line (in the longitudinal direction in the drawing). A conductive film 21e functioning as a capacitor line extends in a direction parallel to the signal line. Note that the conductive film 13 functioning as a scan line is electrically connected to the scan line driver circuit 104 (see FIGS. 1A to 1E), and the conductive film 21a functioning as a signal line and the conductive film 21e functioning as a capacitor line is electrically connected to the signal line driver circuit 106 (see FIGS. 1A to 1E).

The transistor 102 is provided in a region where the conductive film functioning as a scan line and the conductive film functioning as a signal line intersect with each other. The transistor 102 includes the conductive film 13 functioning as a gate electrode; a gate insulating film (not illustrated in FIG. 19); the oxide semiconductor film 19a where a channel region is formed, over the gate insulating film; and the conductive films 21a and 21b functioning as a pair of electrodes. The conductive film 13 also functions as a scan line, and a region of the conductive film 13 that overlaps with the oxide semiconductor film 19a functions as the gate electrode of the transistor 102. In addition, the conductive film 21a also functions as a signal line, and a region of the conductive film 21a that overlaps with the oxide semiconductor film 19a functions as the source electrode or the drain electrode of the transistor 102. Furthermore, in the top view of FIG. 19, an end portion of the conductive film functioning as a scan line is positioned on an outer side of an end portion of the oxide semiconductor film 19a. Thus, the conductive film functioning as a scan line functions as a light-blocking film for blocking light from a light source such as a backlight. For this reason, the oxide semiconductor film 19a included in the transistor is not irradiated with light, so that a variation in the electrical characteristics of the transistor can be suppressed.

In addition, the transistor 102 includes the organic insulating film 31 overlapping with the oxide semiconductor film 19a in a manner similar to that in Embodiment 1. The organic insulating film 31 overlaps with the oxide semiconductor film 19a (in particular, a region of the oxide semiconductor film 19a which is between the conductive films 21a and 21b) with an inorganic insulating film (not illustrated in FIG. 19) provided therebetween.

The conductive film 21b is electrically connected to a light-transmitting conductive film 29c that functions as a pixel electrode in an opening 41.

The capacitor 105 is connected to the conductive film 21e functioning as a capacitor line. The capacitor 105 includes a film 19d having conductivity formed over the gate insulating film, a dielectric film formed over the transistor 102, and the light-transmitting conductive film 29c functioning as a pixel electrode. The dielectric film is formed using an oxygen barrier film. The film 19d having conductivity formed over the gate insulating film has a light-transmitting property. That is, the capacitor 105 has a light-transmitting property.

Owing to the light-transmitting property of the capacitor 105, the capacitor 105 can be formed large (in a large area) in the pixel 103. Thus, a display device with a large-capacitance capacitor as well as an aperture ratio increased to typically 55% or more, preferably 60% or more can be provided. For example, in a high-resolution display device such as a liquid crystal display device, the area of a pixel is small and accordingly the area of a capacitor is also small. For this reason, the amount of charges accumulated in the capacitor is small in the high-resolution display device. However, since the capacitor 105 of this embodiment has a light-transmitting property, when the capacitor 105 is provided in a pixel, sufficient capacitance can be obtained in the pixel and the aperture ratio can be improved. Typically, the capacitor 105 can be favorably used for a high-resolution display device with a pixel density of 200 pixels per inch (ppi) or more, 300 ppi or more, or furthermore, 500 ppi or more.

Furthermore, according to one embodiment of the present invention, the aperture ratio can be improved even in a high-resolution display device, which makes it possible to use light from a light source such as a backlight efficiently, so that power consumption of the display device can be reduced.

Next, FIG. 20 is a cross-sectional view taken along dashed-dotted lines A-B and C-D in FIG. 19. The transistor 102 illustrated in FIG. 19 is a channel-etched transistor. Note that the transistor 102 in the channel length direction, a connection portion between the transistor 102 and the conductive film 29c functioning as a pixel electrode, and the capacitor 105 are illustrated in the cross-sectional view taken along dashed-dotted line A-B, and the transistor 102 in the channel width direction is illustrated in the cross-sectional view taken along dashed-dotted line C-D.

Since the liquid crystal display device described in this embodiment is driven in a VA mode, a liquid crystal element 322a includes the conductive film 29c functioning as a pixel electrode included in the element layer of the first substrate 11, the conductive film 350 included in the element layer of the second substrate 342, and the liquid crystal layer 320.

In addition, the transistor 102 in FIG. 20 has a structure similar to that of the transistor 102 in Embodiment 1. The conductive film 29c functioning as a pixel electrode connected to one of the conductive films 21a and 21b functioning as a source electrode and a drain electrode (here, connected to the conductive film 21b) is formed over the nitride insulating film 27. In the opening 41 of the nitride insulating film 27, the conductive film 21b is connected to the conductive film 29c functioning as a pixel electrode.

The conductive film 29c functioning as a pixel electrode can be formed using as appropriate a material and a manufacturing method similar to those of the common electrode 29 in Embodiment 2.

The capacitor 105 in FIG. 20 includes the film 19d having conductivity formed over the oxide insulating film 17, the nitride insulating film 27, and the conductive film 29c functioning as a pixel electrode.

Over the transistor 102 in this embodiment, the oxide insulating films 23 and 25 which are isolated from each other are formed. The oxide insulating films 23 and 25 which are isolated from each other overlap with the oxide semiconductor film 19a.

In addition, the organic insulating film 31 overlapping with the oxide semiconductor film 19a is provided over the nitride insulating film 27. The organic insulating film 31 overlapping with the oxide semiconductor film 19a is provided over the transistor 102, whereby the surface of the oxide semiconductor film 19a can be made apart from the surface of the organic insulating film 31. Thus, the surface of the oxide semiconductor film 19a is not affected by the electric field of positively charged particles adsorbed on the surface of the organic insulating film 31 and therefore the reliability of the transistor 102 can be improved.

In the capacitor 105, the film 19d having conductivity is different from that in Embodiment 2 and is not connected to the conductive film 21b. In contrast, the film 19d having conductivity is in contact with a conductive film 21d. The conductive film 21d functions as a capacitor line. The film 19d having conductivity can be formed using a metal oxide film similar to that used for the pixel electrode 19b in Embodiment 2. In other words, the film 19d having conductivity is a metal oxide film containing the same metal element as the oxide semiconductor film 19a. Moreover, a formation method similar to that of the pixel electrode 19b in Embodiment 2 can be used as appropriate for the film 19d having conductivity.

Next, a method for manufacturing the transistor 102 and the capacitor 105 in FIG. 20 is described with reference to FIGS. 21A to 21C and FIGS. 22A to 22C.

A conductive film is formed over the first substrate 11 and then etched using a mask formed through a first photolithography process in Embodiment 2, whereby the conductive film 13 functioning as a gate electrode is formed over the first substrate 11 (see FIG. 21A).

Next, the nitride insulating film 15 and the oxide insulating film 16 are formed over the first substrate 11 and the conductive film 13 functioning as a gate electrode. Next, an oxide semiconductor film is formed over the oxide insulating film 16 and then etched using a mask formed through a second photolithography process in Embodiment 2, whereby the oxide semiconductor films 19a and 19c are formed (see FIG. 21B).

Next, a conductive film is formed over the oxide insulating film 16 and the oxide semiconductor films 19a and 19c and then etched using a mask formed through a third photolithography process in Embodiment 2, whereby the conductive films 21a, 21b, and 21d are formed (see FIG. 21C). At this time, the conductive film 21b is formed so as not to be in contact with the oxide semiconductor film 19c. The conductive film 21d is formed so as to be in contact with the oxide semiconductor film 19c.

Next, an oxide insulating film is formed over the oxide insulating film 16, the oxide semiconductor films 19a and 19c, and the conductive films 21a, 21b, and 21d and then etched using a mask formed through a fourth photolithography process in Embodiment 2, whereby the oxide insulating films 23 and 25 are formed (see FIG. 22A).

Next, a nitride insulating film is formed over the oxide insulating film 17, the oxide semiconductor films 19a and 19c, the conductive films 21a, 21b, and 21d, and the oxide insulating films 23 and 25 and then etched using a mask formed through a fifth photolithography process in Embodiment 2, whereby the nitride insulating film 27 having the opening 41 through which part of the conductive film 21b is exposed is formed (see FIG. 22B).

Through the above steps, the oxide semiconductor film 19c becomes the film 19d having conductivity. When a silicon nitride film is formed later by a plasma CVD method as the nitride insulating film 27, hydrogen contained in the silicon nitride film is diffused to the oxide semiconductor film 19c; thus, the conductivity of the film 19d having conductivity can be enhanced.

Next, a conductive film is formed over the conductive film 21b and the nitride insulating film 27 and then etched using a mask formed through a sixth photolithography process in Embodiment 2, whereby the conductive film 29c connected to the conductive film 21b is formed (see FIG. 22C).

From the above, as for a semiconductor device including an oxide semiconductor film, a semiconductor device with improved electrical characteristics can be obtained.

On an element substrate of the semiconductor device described in this embodiment, one electrode of the capacitor is formed at the same time as the oxide semiconductor film of the transistor. In addition, the conductive film functioning as a pixel electrode is used as the other electrode of the capacitor. Thus, a step of forming another conductive film is not needed to form the capacitor, and the number of steps of manufacturing the display device can be reduced. Furthermore, since the pair of electrodes has a light-transmitting property, the capacitor has a light-transmitting property. As a result, the area occupied by the capacitor can be increased and the aperture ratio in a pixel can be increased.

MODIFICATION EXAMPLE 1

In this embodiment, a display device that can be manufactured with a small number of masks as compared with that of the semiconductor device described in any of Embodiments 1 to 4 is described with reference to FIG. 23.

Figure 23:
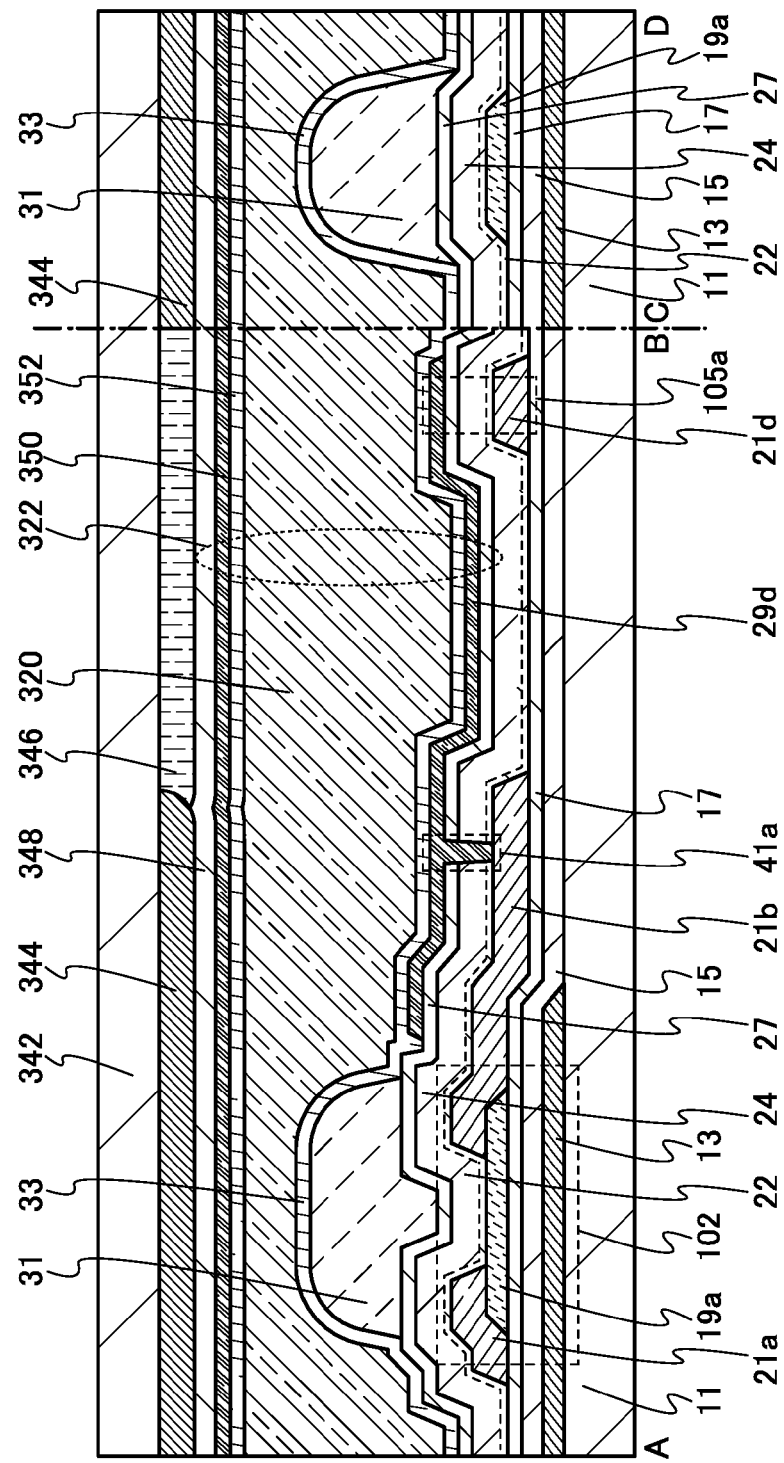
FIG. 23 is a cross-sectional view illustrating one embodiment of a display device.

In the display device illustrated in FIG. 23, the number of masks can be reduced by not etching the oxide insulating film 22 and the oxide insulating film 24 formed over the transistor 102. In addition, the nitride insulating film 27 is formed over the oxide insulating film 24, and an opening 41a through which part of the conductive film 21b is exposed is formed in the oxide insulating films 22 and 24 and the nitride insulating film 27. A conductive film 29d functioning as a pixel electrode, which is connected to the conductive film 21b in the opening 41a, is formed over the nitride insulating film 27.

The conductive film 21d is formed over the oxide insulating film 17. Since the conductive film 21d is formed at the same time as the conductive films 21a and 21b are formed, an additional photomask is not needed to form the conductive film 21d. The conductive film 21d functions as a capacitor line. That is, a capacitor 105a includes the conductive film 21d, the oxide insulating film 22, the oxide insulating film 24, the nitride insulating film 27, and the conductive film 29d functioning as a pixel electrode.

Note that the structures, methods, and the like described in this embodiment can be used as appropriate in combination with any of the structures, methods, and the like described in the other embodiments.

[Embodiment 4]

In this embodiment, a display device which is different from the display devices in Embodiment 2 and a manufacturing method thereof are described with reference to drawings. This embodiment is different from Embodiment 2 in that the transistor has a structure in which an oxide semiconductor film is provided between different gate electrodes, that is, a dual-gate structure. Note that the structures similar to those in Embodiment 2 are not described repeatedly here.

A specific structure of an element layer formed over the first substrate 11 included in the display device is described. The transistor provided in the display device of this embodiment is different from that in Embodiment 2 in that a conductive film 29b functioning as a gate electrode and overlapping part of or the whole of each of the conductive film 13 functioning as a gate electrode, the oxide semiconductor film 19a, the conductive films 21a and 21b, and the oxide insulating film 25 is provided. The conductive film 29b functioning as a gate electrode is connected to the conductive film 13 functioning as a gate electrode in the opening 41a, 41b.

Figure 24:
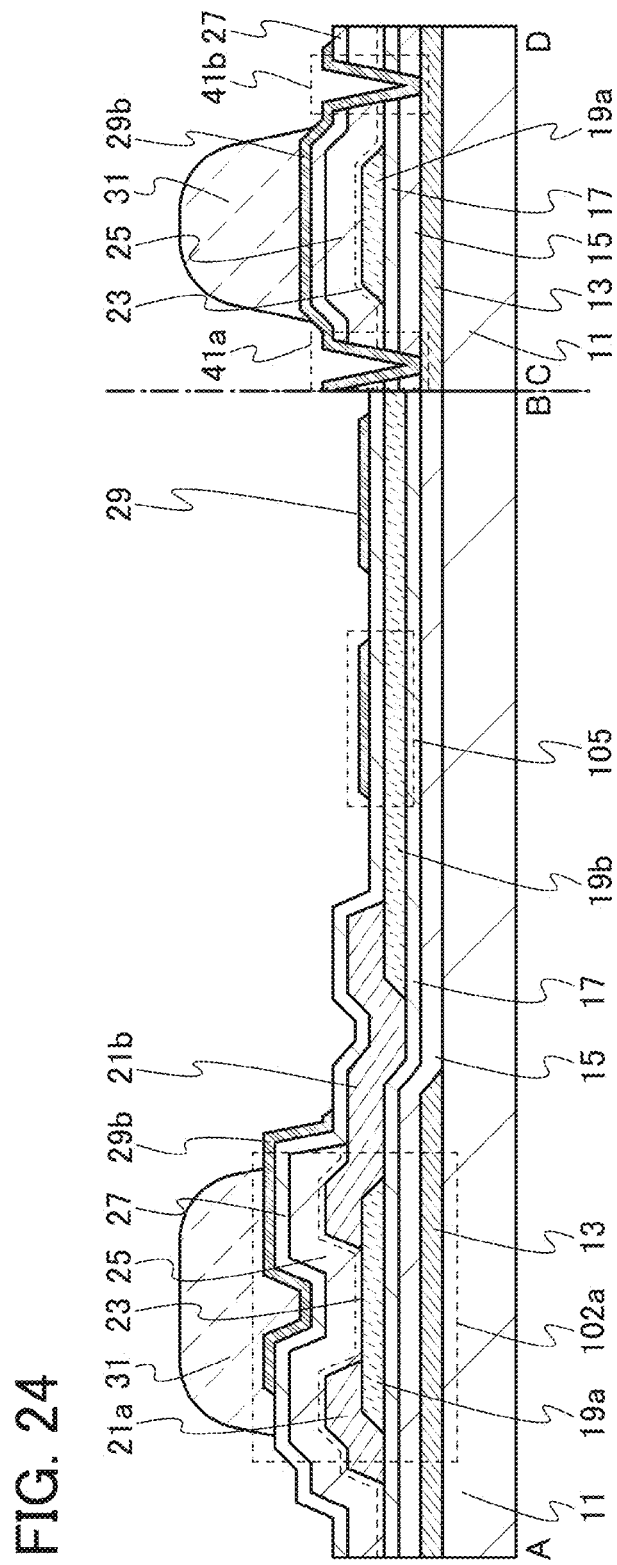
FIG. 24 is a cross-sectional view illustrating one embodiment of a display device.

A transistor 102a illustrated in FIG. 24 is a channel-etched transistor. Note that the transistor 102a in the channel length direction and a capacitor 105 are illustrated in a cross-sectional view in a portion A-B, and the transistor 102a in the channel width direction and a connection portion between the conductive film 13 functioning as a gate electrode and the conductive film 29b functioning as a gate electrode are illustrated in a cross-sectional view in a portion C-D.

The transistor 102a in FIG. 24 has a dual-gate structure and includes the conductive film 13 functioning as a gate electrode over the first substrate 11. In addition, the transistor 102a includes the nitride insulating film 15 formed over the first substrate 11 and the conductive film 13 functioning as a gate electrode, the oxide insulating film 17 formed over the nitride insulating film 15, the oxide semiconductor film 19a overlapping with the conductive film 13 functioning as a gate electrode with the nitride insulating film 15 and the oxide insulating film 17 provided therebetween, and the conductive films 21a and 21b functioning as a source electrode and a drain electrode which are in contact with the oxide semiconductor film 19a. Moreover, the oxide insulating film 23 is formed over the oxide insulating film 17, the oxide semiconductor film 19a, and the conductive films 21a and 21b functioning as a source electrode and a drain electrode, and the oxide insulating film 25 is formed over the oxide insulating film 23. The nitride insulating film 27 is formed over the nitride insulating film 15, the oxide insulating film 23, the oxide insulating film 25, and the conductive film 21b. The pixel electrode 19b is formed over the oxide insulating film 17. The pixel electrode 19b is connected to one of the conductive films 21a and 21b functioning as a source electrode and a drain electrode, here, connected to the conductive film 21b. The common electrode 29 and the conductive film 29b functioning as a gate electrode are formed over the nitride insulating film 27.

As illustrated in the cross-sectional view in a portion C-D, the conductive film 29b functioning as a gate electrode is connected to the conductive film 13 functioning as a gate electrode in the opening 41a, 41b provided in the nitride insulating film 15, the oxide insulating film 17, the oxide insulating film 23, the oxide insulating film 25, and the nitride insulating film 27. That is, the conductive film 13 functioning as a gate electrode and the conductive film 29b functioning as a gate electrode have the same potential.

Thus, by applying voltage at the same potential to each gate electrode of the transistor 102a, variation in the initial characteristics can be reduced, and degradation of the transistor 102a after the −GBT stress test and a change in the rising voltage of on-state current at different drain voltages can be suppressed. In addition, a region where carriers flow in the oxide semiconductor film 19a becomes larger in the film thickness direction, so that the amount of carrier movement is increased. As a result, the on-state current of the transistor 102a is increased, and the field-effect mobility is increased. Typically, the field-effect mobility is greater than or equal to 20 cm$^2$/V·s.

Over the transistor 102a in this embodiment, the oxide insulating films 23 and 25 are formed. The oxide insulating films 23 and 25 overlap with the oxide semiconductor film 19a. In the cross-sectional view in the channel width direction, end portions of the oxide insulating films 23 and 25 are positioned on an outer side of an end portion of the oxide semiconductor film 19a. Furthermore, in the channel width direction in FIG. 24, the conductive film 29b functioning as a gate electrode is positioned at end portions of the oxide insulating films 23 and 25.

An end portion processed by etching or the like of the oxide semiconductor film is damaged by processing, to produce defects and also contaminated by the attachment of an impurity, or the like. Thus, the end portion of the oxide semiconductor film is easily activated by application of a stress such as an electric field, thereby easily becoming n-type (having a low resistance). Therefore, the end portion of the oxide semiconductor film 19a overlapping with the conductive film 13 functioning as a gate electrode easily becomes n-type. When the end portion which becomes n-type is provided between the conductive films 21a and 21b functioning as a source electrode and a drain electrode, the region which becomes n-type functions as a carrier path, resulting in a parasitic channel. However, as illustrated in the cross-sectional view in a portion C-D, when the conductive film 29b functioning as a gate electrode faces a side surface of the oxide semiconductor film 19a with the oxide insulating films 23 and 25 provided therebetween in the channel width direction, due to the electric field of the conductive film 29b functioning as a gate electrode, generation of a parasitic channel on the side surface of the oxide semiconductor film 19a or in a region including the side surface and the vicinity of the side surface is suppressed. As a result, a transistor which has excellent electrical characteristics such as a sharp increase in the drain current at the threshold voltage is obtained.

In the capacitor 105a, the pixel electrode 19b is formed at the same time as the oxide semiconductor film 19a and has increased conductivity by containing an impurity. Alternatively, the pixel electrode 19b is formed at the same time as the oxide semiconductor film 19a, and has increased conductivity by containing oxygen vacancies generated by plasma damage or the like. Alternatively, the pixel electrode 19b is formed at the same time as the oxide semiconductor film 19a, and has increased conductivity by containing impurities and oxygen vacancies generated by plasma damage or the like.

On an element substrate of the display device described in this embodiment, the pixel electrode is formed at the same time as the oxide semiconductor film of the transistor. The pixel electrode also functions as one of electrodes of the capacitor. The common electrode also functions as the other of electrodes of the capacitor. Thus, a step of forming another conductive film is not needed to form the capacitor, and the number of steps of manufacturing the semiconductor device can be reduced. The capacitor has a light-transmitting property. As a result, the area occupied by the capacitor can be increased and the aperture ratio in a pixel can be increased.

Details of the transistor 102a are described below. Note that the components with the same reference numerals as those in Embodiment 2 are not described here.

The conductive film 29b functioning as a gate electrode can be formed using a material similar to that of the common electrode 29 in Embodiment 2.

Next, a method for manufacturing the transistor 102a and the capacitor 105a in FIG. 24 is described with reference to FIGS. 10A to 10D, FIGS. 11A to 11D, FIG. 12A, and FIGS. 25A to 25C.

As in Embodiment 2, through the steps illustrated in FIGS. 10A to 12A, the conductive film 13 functioning as a gate electrode, the nitride insulating film 15, the oxide insulating film 16, the oxide semiconductor film 19a, the pixel electrode 19b, the conductive films 21a and 21b functioning as a source electrode and a drain electrode, the oxide insulating film 22, the oxide insulating film 24, and the nitride insulating film 26 are formed over the first substrate 11. In these steps, photography processes using the first photomask to the fourth photomask are performed.

Next, a mask is formed over the nitride insulating film 26 through a photolithography process using a fifth photomask, and then part of the nitride insulating film 26 is etched using the mask; thus, the nitride insulating film 27 having the opening 41a, 41b is formed as illustrated in FIG. 25A.

Next, as illustrated in FIG. 25B, the conductive film 28 to be the common electrode 29 and the conductive film 29b functioning as a gate electrode is formed over the conductive film 13 functioning as a gate electrode, and the nitride insulating film 27.

Then, a mask is formed over the conductive film 28 by a photolithography process using a sixth photomask. Next, as illustrated in FIG. 25C, part of the conductive film 28 is etched with the use of the mask to form the common electrode 29 and the conductive film 29b functioning as a gate electrode. After that, the mask is removed.

Through the above process, the transistor 102a is manufactured and the capacitor 105a can also be manufactured.

In the transistor described in this embodiment, when the conductive film 29b functioning as a gate electrode faces a side surface of the oxide semiconductor film 19a with the oxide insulating films 23 and 25 provided therebetween in the channel width direction, due to the electric field of the conductive film 29b functioning as a gate electrode, generation of a parasitic channel on the side surface of the oxide semiconductor film 19a or in a region including the side surface and the vicinity of the side surface is suppressed. As a result, a transistor which has excellent electrical characteristics such as a sharp increase in the drain current at the threshold voltage is obtained.

The element substrate of the display device of this embodiment is provided with a common electrode including a stripe region extending in a direction intersecting with a signal line. Therefore, the display device can have excellent contrast.

On an element substrate of the display device described in this embodiment, the pixel electrode is formed at the same time as the oxide semiconductor film of the transistor. The pixel electrode functions as the one of electrodes of the capacitor. The common electrode also functions as the other of electrodes of the capacitor. Thus, a step of forming another conductive film is not needed to form the capacitor, and the number of steps of manufacturing the display device can be reduced. The capacitor has a light-transmitting property. As a result, the area occupied by the capacitor can be increased and the aperture ratio in a pixel can be increased.

Note that the structures, methods, and the like described in this embodiment can be used as appropriate in combination with any of the structures, methods, and the like described in the other embodiments.

[Embodiment 5]

In this embodiment, a display device including a transistor in which the number of defects in an oxide semiconductor film can be further reduced as compared with the above embodiments is described with reference to drawings. The transistor described in this embodiment is different from any of the transistors in Embodiments 2 to 4 in that a multilayer film including a plurality of oxide semiconductor films is provided. Here, details are described using the transistor in Embodiment 2.

FIGS. 26A and 26B each illustrate a cross-sectional view of an element substrate included in a display device. FIGS. 26A and 26B are cross-sectional views taken along dashed-dotted lines A-B and C-D in FIG. 4.

A transistor 102b in FIG. 26A includes a multilayer film 37a overlapping with the conductive film 13 functioning as a gate electrode with the nitride insulating film 15 and the oxide insulating film 17 provided therebetween, and the conductive films 21a and 21b functioning as a source electrode and a drain electrode in contact with the multilayer film 37a. The oxide insulating film 23, the oxide insulating film 25, and the nitride insulating film 27 are formed over the nitride insulating film 15, the oxide insulating film 17, the multilayer film 37a, and the conductive films 21a and 21b functioning as a source electrode and a drain electrode.

The capacitor 105b in FIG. 26A includes a multilayer film 37b formed over the oxide insulating film 17, the nitride insulating film 27 in contact with the multilayer film 37b, and the common electrode 29 in contact with the nitride insulating film 27. The multilayer film 37b functions as a pixel electrode.

In the transistor 102b described in this embodiment, the multilayer film 37a includes the oxide semiconductor film 19a and an oxide semiconductor film 39a. That is, the multilayer film 37a has a two-layer structure. In addition, part of the oxide semiconductor film 19a functions as a channel region. Moreover, the oxide insulating film 23 is formed in contact with the multilayer film 37a, and the oxide insulating film 25 is formed in contact with the oxide insulating film 23. That is, the oxide semiconductor film 39a is provided between the oxide semiconductor film 19a and the oxide insulating film 23.

The oxide semiconductor film 39a is an oxide film containing one or more elements that constitute the oxide semiconductor film 19a. Thus, interface scattering is unlikely to occur at the interface between the oxide semiconductor films 19a and 39a. Thus, the transistor can have high field-effect mobility because the movement of carriers is not hindered at the interface.

The oxide semiconductor film 39a is typically an In—Ga oxide film, an In—Zn oxide film, or an In-M-Zn oxide film (M represents Al, Ga, Y, Zr, Sn, La, Ce, or Nd). The energy at the conduction band bottom of the oxide semiconductor film 39a is closer to a vacuum level than that of the oxide semiconductor film 19a is, and typically, the difference between the energy at the conduction band bottom of the oxide semiconductor film 39a and the energy at the conduction band bottom of the oxide semiconductor film 19a is any one of 0.05 eV or more, 0.07 eV or more, 0.1 eV or more, or 0.15 eV or more, and any one of 2 eV or less, 1 eV or less, 0.5 eV or less, or 0.4 eV or less. That is, the difference between the electron affinity of the oxide semiconductor film 39a and the electron affinity of the oxide semiconductor film 19a is any one of 0.05 eV or more, 0.07 eV or more, 0.1 eV or more, or 0.15 eV or more, and any one of 2 eV or less, 1 eV or less, 0.5 eV or less, or 0.4 eV or less.

The oxide semiconductor film 39a preferably contains In because carrier mobility (electron mobility) can be increased.

When the oxide semiconductor film 39a contains a larger amount of Al, Ga, Y, Zr, Sn, La, Ce, or Nd in an atomic ratio than the amount of In in an atomic ratio, any of the following effects may be obtained: (1) the energy gap of the oxide semiconductor film 39a is widened; (2) the electron affinity of the oxide semiconductor films film 39a is reduced; (3) scattering of impurities from the outside is reduced; (4) an insulating property increases as compared to the oxide semiconductor film 19a; and (5) oxygen vacancies are less likely to be generated because Al, Ga, Y, Zr, Sn, La, Ce, or Nd is a metal element strongly bonded to oxygen.

In the case where the oxide semiconductor film 39a is an In-M-Zn oxide film, the proportions of In and M when the summation of In and M is assumed to be 100 atomic % are preferably as follows: the atomic percentage of In is less than 50 atomic % and the atomic percentage of M is more than 50 atomic %; further preferably, the atomic percentage of In is less than 25 atomic % and the atomic percentage of M is more than 75 atomic %.

Furthermore, in the case where each of the oxide semiconductor films 19a and 39a is an In-M-Zn oxide film (M represents Al, Ga, Y, Zr, Sn, La, Ce, or Nd), the proportion of M atoms (M represents Al, Ga, Y, Zr, Sn, La, Ce, or Nd) in the oxide semiconductor film 39a is higher than that in the oxide semiconductor film 19a. As a typical example, the proportion of M in the oxide semiconductor film 39a is 1.5 times or more, preferably twice or more, further preferably three times or more as high as that in the oxide semiconductor film 19a.

Furthermore, in the case where each of the oxide semiconductor film 19a and the oxide semiconductor film 39a is an In-M-Zn oxide film (M represents Al, Ga, Y, Zr, Sn, La, Ce, or Nd), when In:M:Zn=$x_1$:$y_1$:$z_1$ [atomic ratio] is satisfied in the oxide semiconductor film 39a and In:M:Zn=$x_2$:$y_2$:$z_2$ [atomic ratio] is satisfied in the oxide semiconductor film 19a, $y_1/x_1$ is higher than $y_2/x_2$. Preferably, $y_1/x_1$ is 1.5 times or more as high as $y_2/x_2$. Further preferably, $y_1/x_1$ is twice or more as high as $y_2/x_2$. Still further preferably, $y_1/x_1$ is three times or more as high as $y_2/x_2$.

In the case where the oxide semiconductor film 19a is an In-M-Zn oxide film (M is Al, Ga, Y, Zr, Sn, La, Ce, or Nd) and a target having the atomic ratio of metal elements of In:M:Zn=$x_1$:$y_1$:$z_1$ is used for forming the oxide semiconductor film 19a, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film to be described later as the oxide semiconductor film 19a is easily formed. Typical examples of the atomic ratio of the metal elements of the target are In:M:Zn=1:1:1, In:M:Zn=1:1:1.2, and In:M:Zn=3:1:2.

In the case where the oxide semiconductor film 39a is an In-M-Zn oxide film (M is Al, Ga, Y, Zr, Sn, La, Ce, or Nd) and a target having the atomic ratio of metal elements of In:M:Zn=$x_2$:$y_2$:$z_2$ is used for forming the oxide semiconductor film 39a, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, a CAAC-OS film to be described later as the oxide semiconductor film 39a is easily formed. Typical examples of the atomic ratio of the metal elements of the target are In:M:Zn=1:3:2, In:M:Zn=1:3:4, In:M:Zn=1:3:6, In:M:Zn=1:3:8, In:M:Zn=1:4:4, In:M:Zn=1:4:5, and In:M:Zn=1:6:8.

Note that the proportion of each metal element in the atomic ratio of each of the oxide semiconductor films 19a and the oxide semiconductor film 39a varies within a range of ±40% of that in the above atomic ratio as an error.

The oxide semiconductor film 39a also functions as a film that relieves damage to the oxide semiconductor film 19a at the time of forming the oxide insulating film 25 later.

The thickness of the oxide semiconductor film 39a is greater than or equal to 3 nm and less than or equal to 100 nm, preferably greater than or equal to 3 nm and less than or equal to 50 nm.

The oxide semiconductor film 39a may have a non-single-crystal structure, for example, like the oxide semiconductor film 19a. The non-single-crystal structure includes a c-axis aligned crystalline oxide semiconductor (CAAC-OS) which is described later, a polycrystalline structure, a microcrystalline structure which is described later, or an amorphous structure, for example.

The oxide semiconductor film 39a may have an amorphous structure, for example. The oxide semiconductor films having the amorphous structure each have disordered atomic arrangement and no crystalline component, for example.

Note that the oxide semiconductor films 19a and 39a may each be a mixed film including two or more of the following: a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, in some cases, the mixed film has a stacked-layer structure in which two or more of the following regions are stacked: a region having an amorphous structure, a region having a microcrystalline structure, a region having a polycrystalline structure, a CAAC-OS region, and a region having a single-crystal structure.

Here, the oxide semiconductor film 39a is formed between the oxide semiconductor film 19a and the oxide insulating film 23. Thus, if carrier traps are formed between the oxide semiconductor film 39a and the oxide insulating film 23 by impurities and defects, electrons flowing in the oxide semiconductor film 19a are less likely to be captured by the carrier traps because there is a distance between the carrier traps and the oxide semiconductor film 19a. Accordingly, the amount of on-state current of the transistor can be increased, and the field-effect mobility can be increased. When the electrons are captured by the carrier traps, the electrons become negative fixed charges. As a result, a threshold voltage of the transistor changes. However, by the distance between the oxide semiconductor film 19a and the carrier traps, capture of electrons by the carrier traps can be reduced, and accordingly, the amount of change in the threshold voltage can be reduced.

Impurities from the outside can be blocked by the oxide semiconductor film 39a, and accordingly, the amount of impurities that are transferred from the outside to the oxide semiconductor film 19a can be reduced. Furthermore, an oxygen vacancy is less likely to be formed in the oxide semiconductor film 39a. Consequently, the impurity concentration and the number of oxygen vacancies in the oxide semiconductor film 19a can be reduced.

Note that the oxide semiconductor films 19a and 39a are not only formed by simply stacking each film, but also are formed to have a continuous junction (here, in particular, a structure in which the energy of the bottom of the conduction band is changed continuously between each film). In other words, a stacked-layer structure in which there exist no impurity that forms a defect level such as a trap center or a recombination center at the interface between the films is provided. If an impurity exists between the oxide semiconductor films 19a and 39a which are stacked, a continuity of the energy band is damaged, and the carrier is captured or recombined at the interface and then disappears.

In order to form such a continuous energy band, it is necessary to form films continuously without being exposed to air, with use of a multi-chamber deposition apparatus (sputtering apparatus) including a load lock chamber. Each chamber in the sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

As in a transistor 102c in FIG. 26B, a multilayer film 38a may be provided instead of the multilayer film 37a.

In addition, as in a capacitor 105c in FIG. 26B, a multilayer film 38b may be provided instead of the multilayer film 37b.

The multilayer film 38a includes an oxide semiconductor film 49a, the oxide semiconductor film 19a, and the oxide semiconductor film 39a. That is, the multilayer film 38a has a three-layer structure. Furthermore, the oxide semiconductor film 19a functions as a channel region.

The oxide semiconductor film 49a can be formed using a material and a formation method similar to those of the oxide semiconductor film 39a.

The multilayer film 38b includes an oxide semiconductor film 49b, an oxide semiconductor film 19f, and an oxide semiconductor film 39b. In other words, the multilayer film 38b has a three-layer structure. The multilayer film 38b functions as a pixel electrode.

The oxide semiconductor film 19f can be formed using a material and a formation method similar to those of the pixel electrode 19b as appropriate. The oxide semiconductor film 49b can be formed using a material and a formation method similar to those of the oxide semiconductor film 39b as appropriate.

In addition, the oxide insulating film 17 and the oxide semiconductor film 49a are in contact with each other. That is, the oxide semiconductor film 49a is provided between the oxide insulating film 17 and the oxide semiconductor film 19a.

The multilayer film 38a and the oxide insulating film 23 are in contact with each other. In addition, the oxide semiconductor film 39a and the oxide insulating film 23 are in contact with each other. That is, the oxide semiconductor film 39a is provided between the oxide semiconductor film 19a and the oxide insulating film 23.

It is preferable that the thickness of the oxide semiconductor film 49a be smaller than that of the oxide semiconductor film 19a. When the thickness of the oxide semiconductor film 49a is greater than or equal to 1 nm and less than or equal to 5 nm, preferably greater than or equal to 1 nm and less than or equal to 3 nm, the amount of change in the threshold voltage of the transistor can be reduced.

In the transistor described in this embodiment, the oxide semiconductor film 39a is provided between the oxide semiconductor film 19a and the oxide insulating film 23. Thus, if carrier traps are formed between the oxide semiconductor film 39a and the oxide insulating film 23 by impurities and defects, electrons flowing in the oxide semiconductor film 19a are less likely to be captured by the carrier traps because there is a distance between the carrier traps and the oxide semiconductor film 19a. Accordingly, the amount of on-state current of the transistor can be increased, and the field-effect mobility can be increased. When the electrons are captured by the carrier traps, the electrons become negative fixed charges. As a result, a threshold voltage of the transistor changes. However, by the distance between the oxide semiconductor film 19a and the carrier traps, capture of electrons by the carrier traps can be reduced, and accordingly, the amount of change in the threshold voltage can be reduced.

Impurities from the outside can be blocked by the oxide semiconductor film 39a, and accordingly, the amount of impurities that are transferred from the outside to the oxide semiconductor film 19a can be reduced. Furthermore, an oxygen vacancy is less likely to be formed in the oxide semiconductor film 39a. Consequently, the impurity concentration and the number of oxygen vacancies in the oxide semiconductor film 19a can be reduced.

Furthermore, the oxide semiconductor film 49a is provided between the oxide insulating film 17 and the oxide semiconductor film 19a, and the oxide semiconductor film 39a is provided between the oxide semiconductor film 19a and the oxide insulating film 23. Thus, it is possible to reduce the concentration of silicon or carbon in the vicinity of the interface between the oxide semiconductor film 49a and the oxide semiconductor film 19a, the concentration of silicon or carbon in the oxide semiconductor film 19a, or the concentration of silicon or carbon in the vicinity of the interface between the oxide semiconductor film 39a and the oxide semiconductor film 19a. Consequently, in the multilayer film 38a, the absorption coefficient derived from a constant photocurrent method is lower than $1 \times 10^{-3}$/cm, preferably lower than $1 \times 10^{-4}$/cm, and thus density of localized levels is extremely low.

The transistor 102c having such a structure includes very few defects in the multilayer film 38a including the oxide semiconductor film 19a; thus, the electrical characteristics of the transistor can be improved, and typically, the on-state current can be increased and the field-effect mobility can be improved. Moreover, in a BT stress test and a BT photostress test which are examples of a stress test, the amount of change in threshold voltage is small, and thus, reliability is high.

Note that the structures, methods, and the like described in this embodiment can be used as appropriate in combination with any of the structures, methods, and the like described in the other embodiments.

[Embodiment 6]

In this embodiment, one embodiment that can be applied to the oxide semiconductor film in the transistor included in the display device described in the above embodiment is described.

An oxide semiconductor film is classified into, for example, a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

The oxide semiconductor film may include one or more of the following: an oxide semiconductor having a single-crystal structure (hereinafter referred to as a single-crystal oxide semiconductor); an oxide semiconductor having a polycrystalline structure (hereinafter referred to as a polycrystalline oxide semiconductor); an oxide semiconductor having a microcrystalline structure (hereinafter referred to as a microcrystalline oxide semiconductor); and an oxide semiconductor having an amorphous structure (hereinafter referred to as an amorphous oxide semiconductor). Furthermore, the oxide semiconductor film may include a CAAC-OS film. Furthermore, the oxide semiconductor film may include an amorphous oxide semiconductor and an oxide semiconductor having a crystal grain. Described below are a CAAC-OS and a microcrystalline oxide semiconductor as typical examples.

<CAAC-OS>

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, a boundary between crystal parts, that is, a grain boundary is not clearly observed even in the high-resolution TEM image. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer has a morphology that reflects a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

Figure 27A:
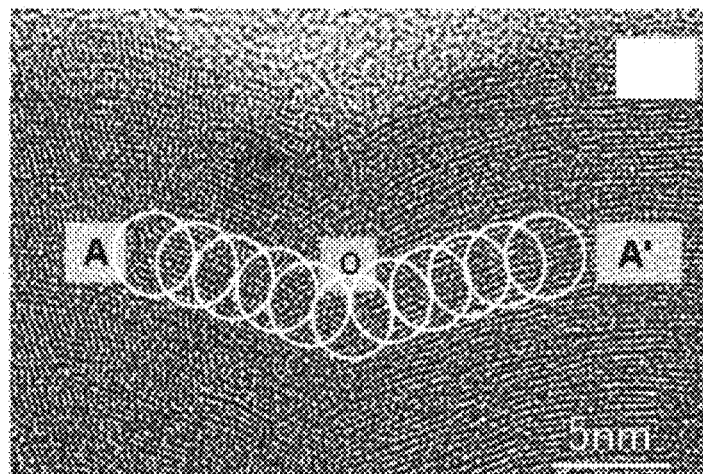
FIGS. 27A to 27C are cross-sectional TEM images and a local Fourier transform image of an oxide semiconductor.
Figure 27B:
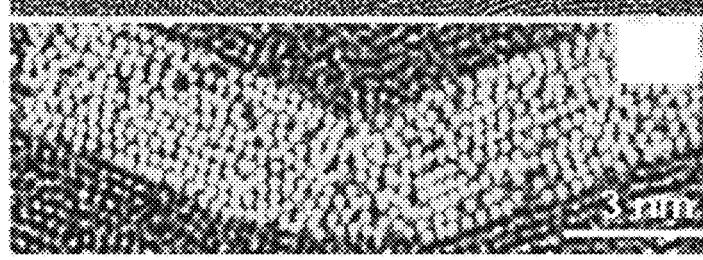

FIG. 27A is a high-resolution cross-sectional TEM image of a CAAC-OS film. FIG. 27B is a high-resolution cross-sectional TEM image obtained by enlarging the image of FIG. 27A. In FIG. 27B, atomic arrangement is highlighted for easy understanding.

Figure 27C:
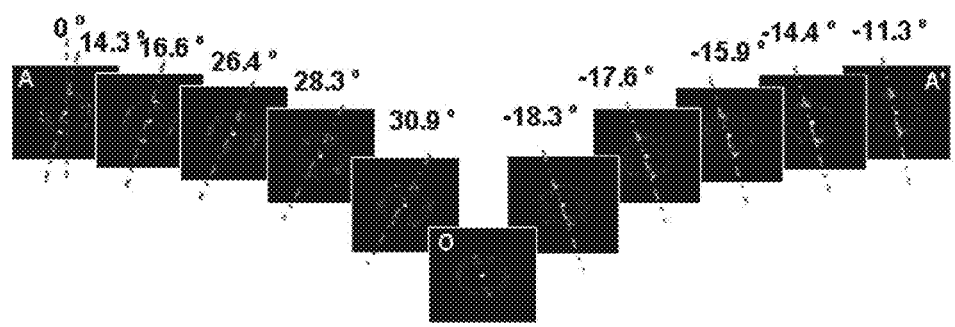

FIG. 27C is Fourier transform images of regions each surrounded by a circle (the diameter is about 4 nm) between A and O and between O and A' in FIG. 27A. C-axis alignment can be observed in each region in FIG. 27C. The c-axis direction between A and O is different from that between O and A', which indicates that a grain in the region between A and O is different from that between O and A'. In addition, between A and O, the angle of the c-axis continuously and gradually changes from 14.3°, 16.6° to 26.4°. Similarly, between O and A', the angle of the c-axis continuously changes from −18.3°, −17.6°, to −15.9°.

Figure 28A:
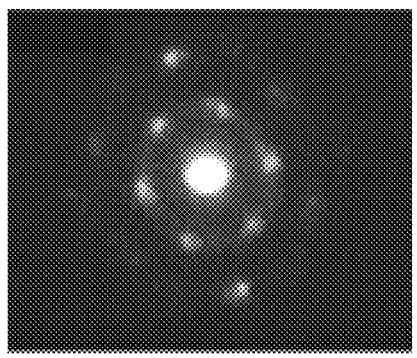
FIGS. 28A and 28B show nanobeam electron diffraction patterns of oxide semiconductor films and FIGS. 28C and 28D illustrate an example of a transmission electron diffraction measurement apparatus.

Note that in an electron diffraction pattern of the CAAC-OS film, spots (bright spots) having alignment are shown. Meanwhile, spots are shown in a nanobeam electron diffraction pattern of the top surface of the CAAC-OS film obtained by using an electron beam having a probe diameter ranging from 1 nm to 30 nm, for example (see FIG. 28A).

From the results of the high-resolution cross-sectional TEM image and the high-resolution plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm or more, 5 µm² or more, or 1000 µm² or more is observed in some cases in the plan high-resolution TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Furthermore, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Furthermore, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. In addition, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might function as a carrier trap or a carrier generation source.

The CAAC-OS film is an oxide semiconductor film having a low density of defect states. In some cases, oxygen vacancies in the oxide semiconductor film function as carrier traps or function as carrier generation sources when hydrogen is captured therein.

The state in which impurity concentration is low and density of defect states is low (the amount of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

<Microcrystalline Oxide Semiconductor>

Next, a microcrystalline oxide semiconductor film is described.

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image of the nc-OS film observed with a TEM, for example, a grain boundary is not easily and clearly observed in some cases.

Figure 28B:
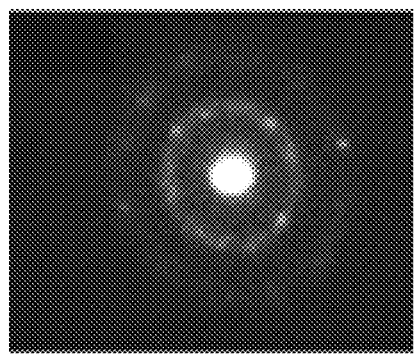

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in a selected-area electron diffraction pattern of the nc-OS film obtained by using an electron beam having a probe diameter (e.g., larger than or equal to 50 nm) larger than a diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are observed in some cases. Moreover, in a nanobeam electron diffraction pattern of the nc-OS film, a plurality of spots are shown in a ring-like region in some cases (see FIG. 28B).

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Accordingly, the amorphous oxide semiconductor film has a much higher carrier density than the nc-OS film. Therefore, a transistor including the amorphous oxide semiconductor film tends to be normally on. Thus, in some cases, such an amorphous oxide semiconductor film can be applied to a transistor which needs to be normally on. Since the amorphous oxide semiconductor film has a high density of defect states, carrier traps might be increased. Consequently, a transistor including the amorphous oxide semiconductor film has larger variation in electrical characteristics and lower reliability than a transistor including the CAAC-OS film or the nc-OS film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS) film.

In a high-resolution TEM image of the amorphous-like OS film, a void may be observed. Furthermore, in the high-resolution TEM image, there are a region where a crystal part is clearly observed and a region where a crystal part is not observed. In the amorphous-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the amorphous-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes in which the spacing therebetween is from 0.28 nm to 0.30 nm is regarded to correspond to the a-b plane of the $InGaZnO_4$ crystal, focusing on the lattice fringes in the high-resolution TEM image. Let the maximum length in the region in which the lattice fringes are observed be the size of crystal part of the amorphous-like OS film and the nc-OS film. Note that the crystal part whose size is 0.8 nm or larger is selectively evaluated.

Figure 35:
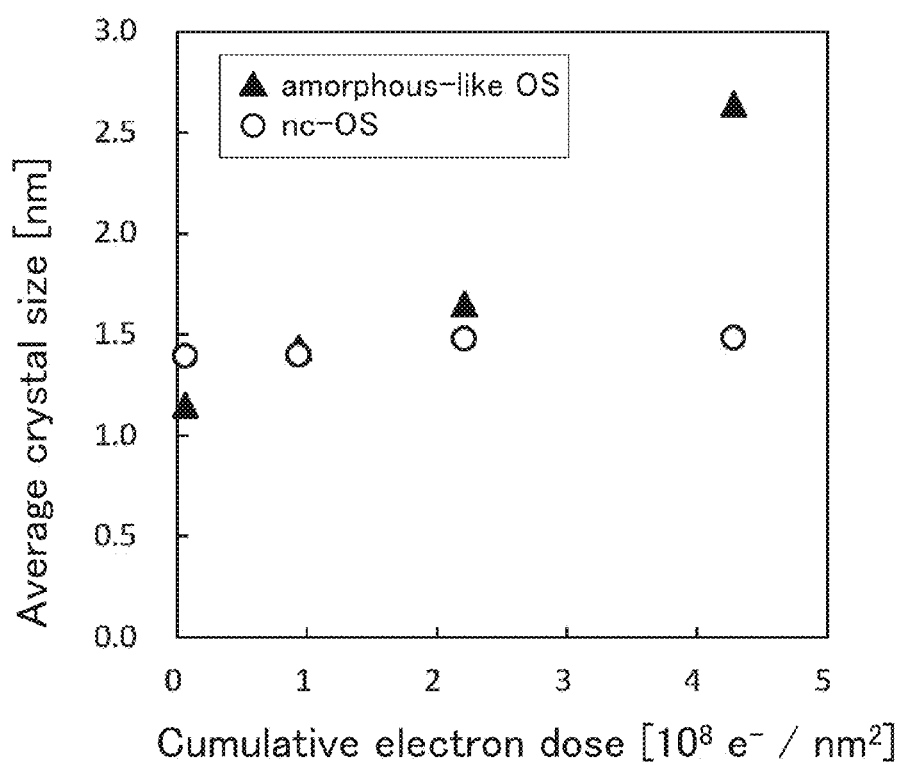
FIG. 35 shows a change in crystal parts by electron beam irradiation.

FIG. 35 shows examination results of change in average size of crystal parts (20-40 points) in the amorphous-like OS film and the nc-OS film using the high-resolution TEM images. As in FIG. 35, the crystal part size in the amorphous-like OS film increases with an increase of the total amount of electron irradiation. Specifically, the crystal part of approximately 1.2 nm at the start of TEM observation grows to a size of approximately 2.6 nm at the total amount of electron irradiation of $4.2 \times 10^8$ $e^-/nm^2$. In contrast, the crystal part size in the good-quality nc-OS film shows a little change from the start of electron irradiation to the total amount of electron irradiation of $4.2 \times 10^8$ $e^-/nm^2$ regardless of the amount of electron irradiation.

Furthermore, in FIG. 35, by linear approximation of the change in the crystal part size in the amorphous-like OS film and the nc-OS film and extrapolation to the total amount of electron irradiation of 0 $e^-/nm^2$, the average size of the crystal part is found to be a positive value. This means that the crystal parts exist in the amorphous-like OS film and the nc-OS film before TEM observation.

Note that an oxide semiconductor film may be a stacked film including two or more kinds of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 28C:
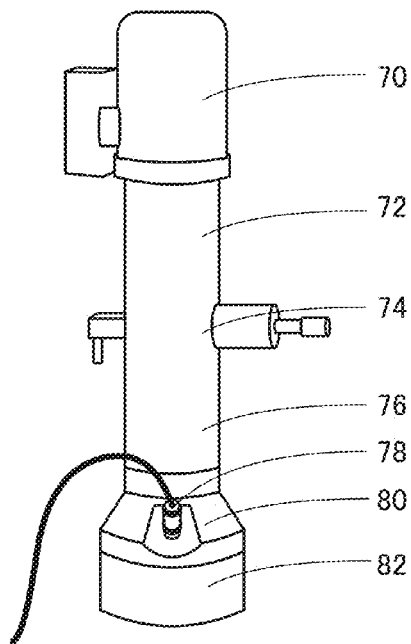

FIG. 28C illustrates a transmission electron diffraction measurement apparatus which includes an electron gun chamber 70, an optical system 72 below the electron gun chamber 70, a sample chamber 74 below the optical system 72, an optical system 76 below the sample chamber 74, an observation chamber 80 below the optical system 76, a camera 78 installed in the observation chamber 80, and a film chamber 82 below the observation chamber 80. The camera 78 is provided to face toward the inside of the observation chamber 80. Note that the film chamber 82 is not necessarily provided.

Figure 28D:
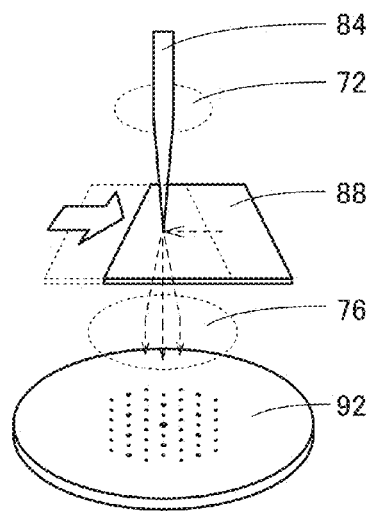

FIG. 28D illustrates an internal structure of the transmission electron diffraction measurement apparatus illustrated in FIG. 28C. In the transmission electron diffraction measurement apparatus, a substance 88 which is positioned in the sample chamber 74 is irradiated with electrons emitted from an electron gun installed in the electron gun chamber 70 through the optical system 72. The electrons which have passed through the substance 88 enter a fluorescent plate 92 which is installed in the observation chamber 80 through the optical system 76. A pattern which depends on the intensity of the incident electrons appears in the fluorescent plate 92, so that the transmitted electron diffraction pattern can be measured.

The camera 78 is installed so as to face the fluorescent plate 92 and can take a picture of a pattern appearing in the fluorescent plate 92. An angle formed by a straight line which passes through the center of a lens of the camera 78 and the center of the fluorescent plate 92 and an upper surface of the fluorescent plate 92 is, for example, 15° or more and 80° or less, 30° or more and 75° or less, or 45° or more and 70° or less. As the angle is reduced, distortion of the transmission electron diffraction pattern taken by the camera 78 becomes larger. Note that if the angle is obtained in advance, the distortion of an obtained transmission electron diffraction pattern can be corrected. Note that the film chamber 82 may be provided with the camera 78. For example, the camera 78 may be set in the film chamber 82 so as to be opposite to the incident direction of electrons 84. In this case, a transmission electron diffraction pattern with less distortion can be taken from the rear surface of the fluorescent plate 92.

A holder for fixing the substance 88 that is a sample is provided in the sample chamber 74. The holder transmits electrons passing through the substance 88. The holder may have, for example, a function of moving the substance 88 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 µm. The range is preferably determined to be an optimal range for the structure of the substance 88.

Then, a method for measuring a transmission electron diffraction pattern of a substance by the transmission electron diffraction measurement apparatus described above is described.

For example, changes in the structure of a substance can be observed by changing (scanning) the irradiation position of the electrons 84 that are a nanobeam in the substance, as illustrated in FIG. 28D. At this time, when the substance 88 is a CAAC-OS film, a diffraction pattern shown in FIG. 28A can be observed. When the substance 88 is an nc-OS film, a diffraction pattern shown in FIG. 28B can be observed.

Even when the substance 88 is a CAAC-OS film, a diffraction pattern similar to that of an nc-OS film or the like is partly observed in some cases. Therefore, whether or not a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 29A:
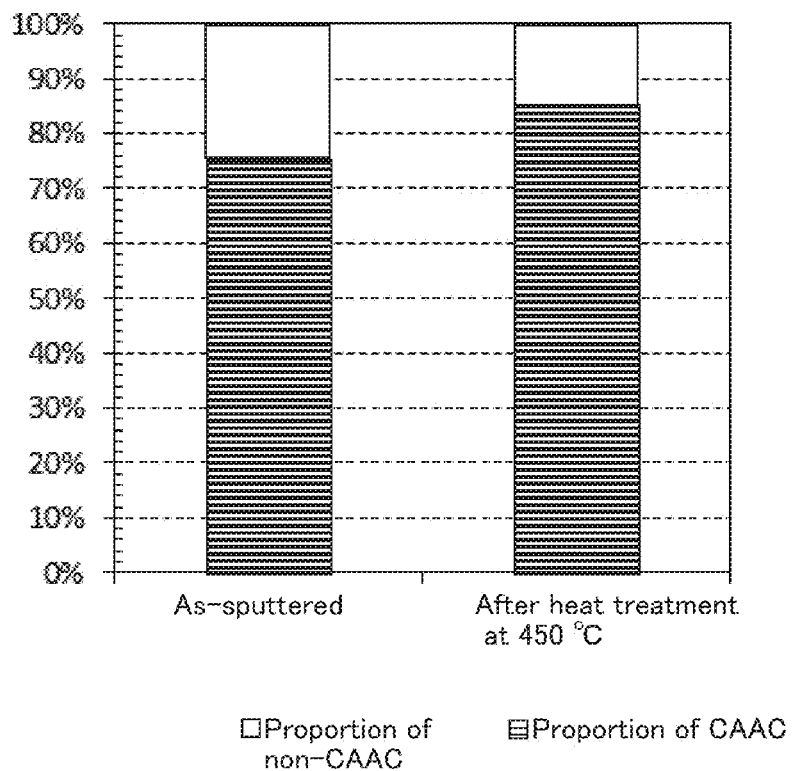
FIG. 29A shows an example of structural analysis by transmission electron diffraction measurement and FIGS. 29B and 29C show plan-view TEM images.

FIG. 29A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 29B:
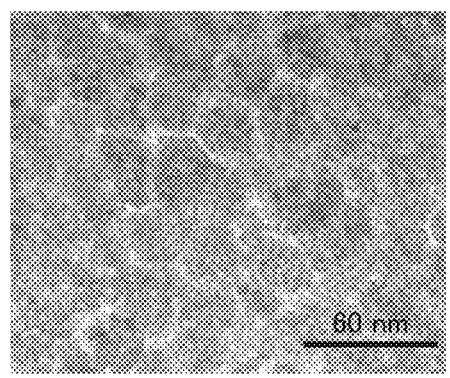
Figure 29C:
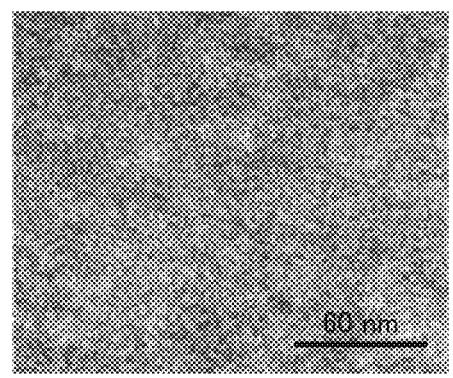

FIGS. 29B and 29C are high-resolution planar TEM images of the CAAC-OS film obtained just after the deposition and the CAAC-OS film subjected to the heat treatment at 450° C., respectively. Comparison between FIGS. 29B and 29C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

<Oxide Semiconductor Film and Oxide Conductor Film>

Figure 34:
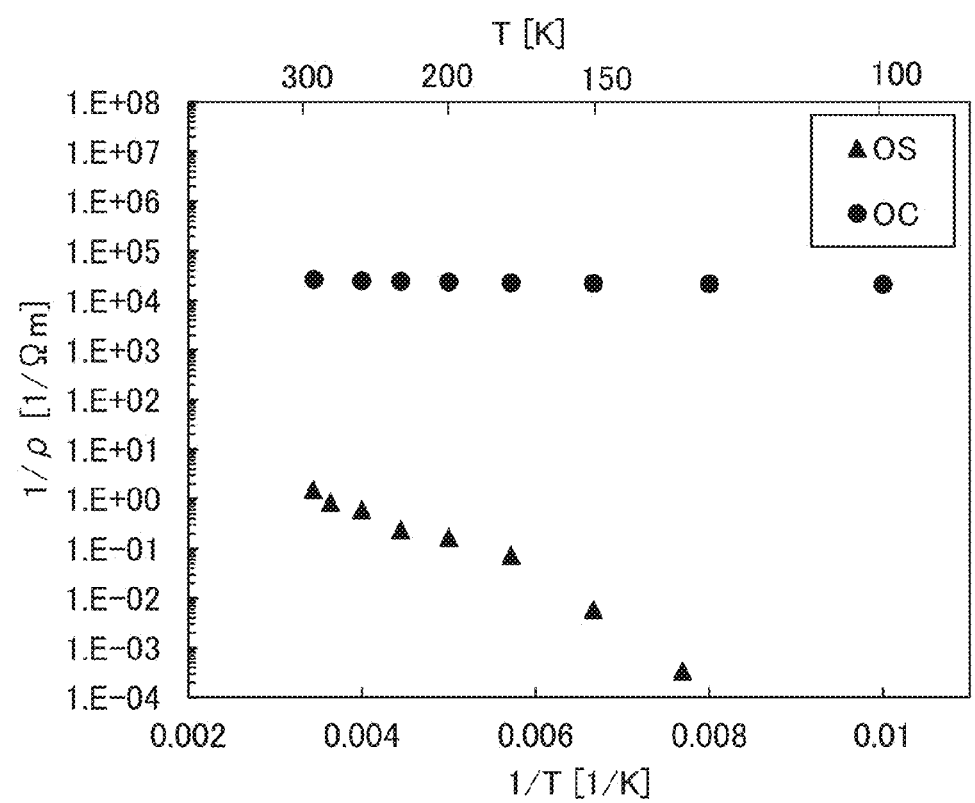
FIG. 34 is a graph showing temperature dependence of conductivity.

Next, the temperature dependence of conductivity of a film formed with an oxide semiconductor (hereinafter referred to as an oxide semiconductor film (OS)) and that of a film formed with an oxide conductor (hereinafter referred to as an oxide conductor film (OC)), which can be used for the pixel electrode 19b, is described with reference to FIG. 34. In FIG. 34, the horizontal axes represent measurement temperature (the lower horizontal axis represents 1/T and the upper horizontal axis represents T), and the vertical axis represents conductivity (1/ρ). Measurement results of the oxide semiconductor film (OS) are plotted as triangles, and measurement results of the oxide conductor film (OC) are plotted as circles.

Note that a sample including the oxide semiconductor film (OS) was prepared by forming a 35-nm-thick In—Ga—Zn oxide film over a glass substrate by a sputtering method using a sputtering target with an atomic ratio of In:Ga:Zn=1:1:1.2, forming a 20-nm-thick In—Ga—Zn oxide film over the 35-nm-thick In—Ga—Zn oxide film by a sputtering method using a sputtering target with an atomic ratio of In:Ga:Zn=1:4:5, performing heat treatment at 450° C. in a nitrogen atmosphere and then performing heat treatment at 450° C. in an atmosphere of a mixed gas of nitrogen and oxygen, and forming a silicon oxynitride film over the oxide films by a plasma CVD method.

A sample including the oxide conductor film (OC) is prepared by forming a 100-nm-thick In—Ga—Zn oxide film over a glass substrate by a sputtering method using a sputtering target with an atomic ratio of In:Ga:Zn=1:1:1, performing heat treatment at 450° C. in a nitrogen atmosphere and then performing heat treatment at 450° C. in an atmosphere of a mixed gas of nitrogen and oxygen, and forming a silicon nitride film over the oxide film by a plasma CVD method.

As can be seen from FIG. 34, the temperature dependence of conductivity of the oxide conductor film (OC) is lower than the temperature dependence of conductivity of the oxide semiconductor film (OS). Typically, the range of variation of conductivity of the oxide conductor film (OC) at temperatures from 80 K to 290 K is from more than −20% to less than +20%. Alternatively, the range of variation of conductivity at temperatures from 150 K to 250 K is from more than −10% to less than +10%. In other words, the oxide conductor is a degenerate semiconductor and it is suggested that the conduction band edge agrees with or substantially agrees with the Fermi level. Therefore, the oxide conductor film (OC) can be used for a resistor, a wiring, an electrode, a pixel electrode, a common electrode, or the like.

Note that the structures, methods, and the like described in this embodiment can be used as appropriate in combination with any of the structures, methods, and the like described in the other embodiments.

[Embodiment 7]

In the transistor using an oxide semiconductor film, the current in an off state (off-state current) can be made low, as described in Embodiment 2. Accordingly, an electric signal such as a video signal can be held for a longer period and a writing interval can be set longer.

With the use of a transistor with a low off-state current, the liquid crystal display device in this embodiment can display images by at least two driving methods (modes). The first driving mode is a conventional driving method of a liquid crystal display device, in which data is rewritten sequentially every frame. The second driving mode is a driving method in which data rewriting is stopped after data writing is executed, i.e., a driving mode with a reduced refresh rate.

Moving images are displayed in the first driving mode. A still image can be displayed without change in image data every frame; thus, it is not necessary to rewrite data every frame. When the liquid crystal display device is driven in the second driving mode in displaying still images, power consumption can be reduced with fewer screen flickers.

A liquid crystal element used in the liquid crystal display device in this embodiment has a large-area capacitor that can accumulate a large capacitance. Thus, it is possible to make the retention period of potentials on the pixel electrode longer and to apply such a driving mode with a reduced refresh rate. In addition, a change in voltage applied to the liquid crystal layer can be suppressed for a long time even when the liquid crystal display device is used in the driving mode with a reduced refresh rate. This makes it possible to prevent screen flickers from being perceived by a user more effectively. Accordingly, the power consumption can be reduced and the display quality can be improved.

An effect of reducing the refresh rate will be described here.

The eye strain is divided into two categories: nerve strain and muscle strain. The nerve strain is caused by prolonged looking at light emitted from a liquid crystal display device or blinking images. This is because the brightness stimulates and fatigues the retina and nerve of the eye and the brain. The muscle strain is caused by overuse of a ciliary muscle which works for adjusting the focus.

Figure 30A:
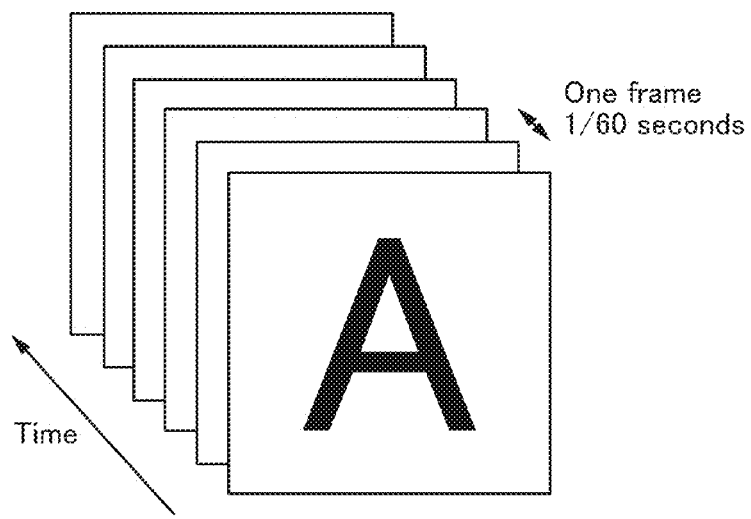
FIGS. 30A and 30B are conceptual diagrams illustrating examples of a driving method of a display device.

FIG. 30A is a schematic diagram illustrating display of a conventional liquid crystal display device. As shown in FIG. 30A, for the display of the conventional liquid crystal display device, image rewriting is performed 60 times per second. A prolonged looking at such a screen might stimulate a retina, optic nerves, and a brain of a user and lead to eye strain.

In one embodiment of the present invention, a transistor with an extremely low off-state current (e.g., a transistor using an oxide semiconductor) is used in a pixel portion of a liquid crystal display device. In addition, the liquid crystal element has a large-area capacitor. With these components, leakage of electrical charges accumulated on the capacitor can be suppressed, whereby the luminance of a liquid crystal display device can be kept even at a lower frame frequency.

Figure 30B:
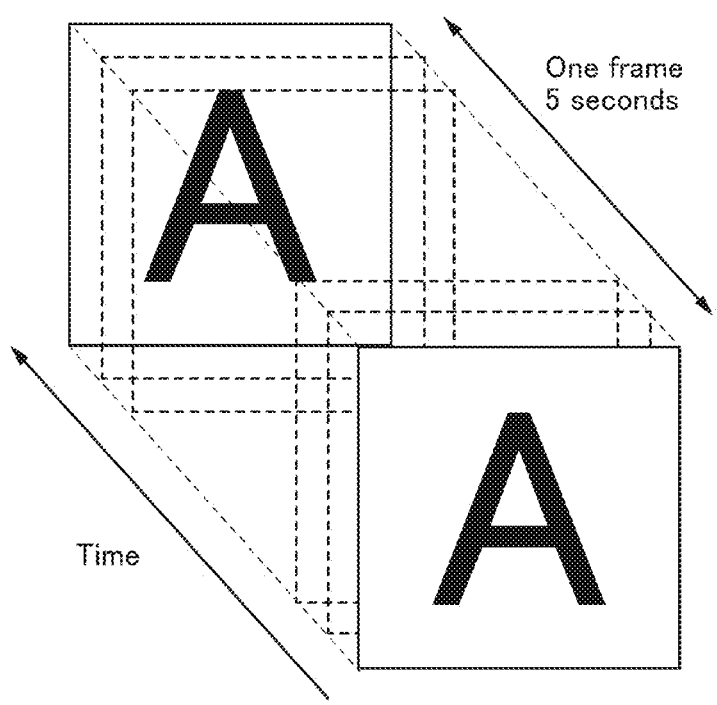

That is, as shown in FIG. 30B, an image can be rewritten as less frequently as once every five seconds, for example. This enables the user to see the same one image as long as possible, so that flickers on the screen recognized by the user are reduced. Consequently, a stimulus to the retina or the nerve of an eye or the brain of the user is relieved, resulting in less nervous fatigue.

One embodiment of the present invention can provide an eye-friendly liquid crystal display device.

Note that the structures, methods, and the like described in this embodiment can be used as appropriate in combination with any of the structures, methods, and the like described in the other embodiments.

[Embodiment 8]

In this embodiment, structural examples of electronic devices each using a display device of one embodiment of the present invention will be described. In addition, in this embodiment, a display module using a display device of one embodiment of the present invention will be described with reference to FIG. 31.

Figure 31:
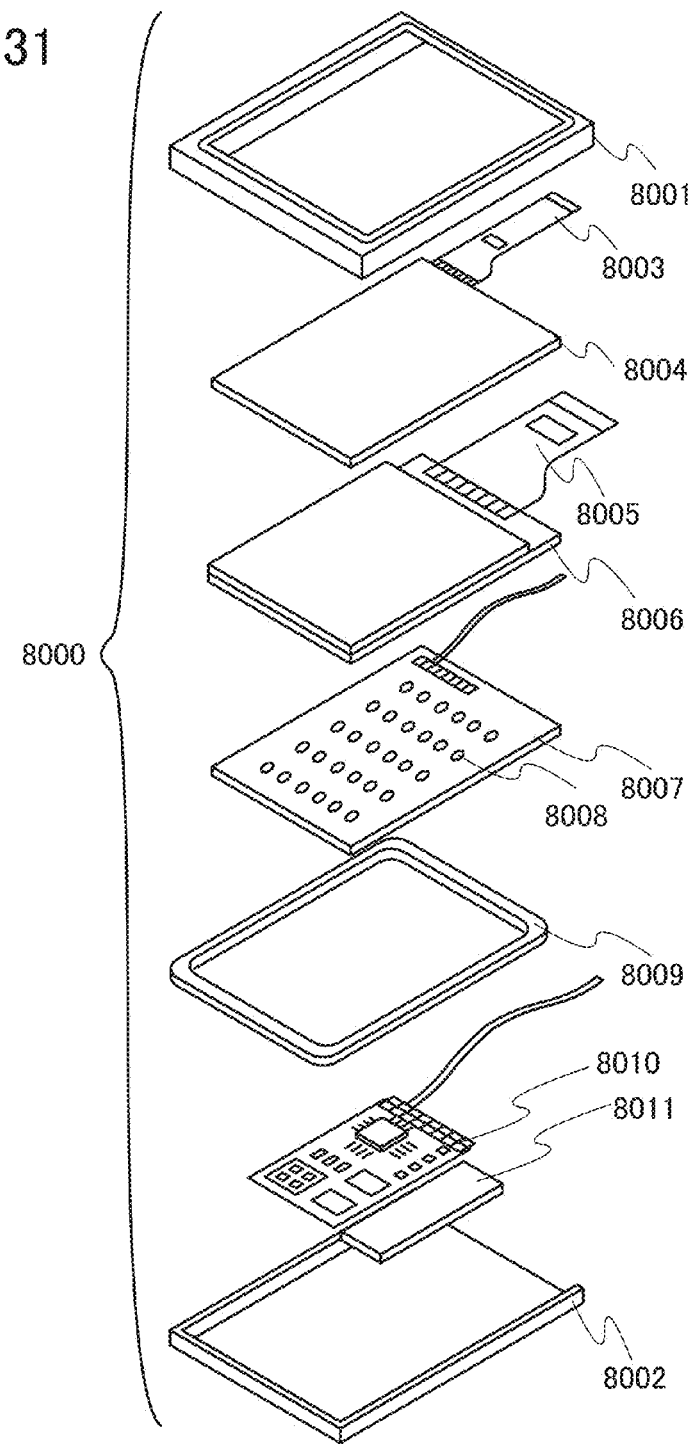
FIG. 31 illustrates a display module.

In a display module 8000 in FIG. 31, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The display device of one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed so as to overlap with the display panel 8006. A counter substrate (sealing substrate) of the display panel 8006 can have a touch panel function. A photosensor may be provided in each pixel of the display panel 8006 to form an optical touch panel. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 can function as a radiator plate too.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 32A to 32D are each an external view of an electronic device including a display device of one embodiment of the present invention.

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

Figure 32A:
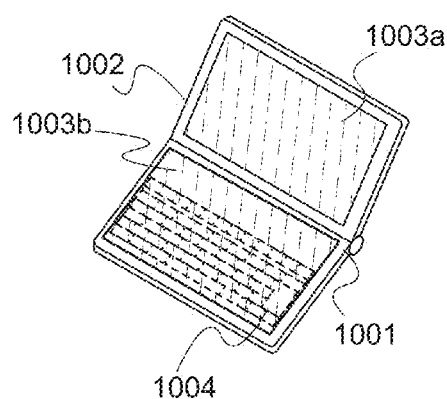
FIGS. 32A to 32D are external views each illustrating one mode of an electronic device.

FIG. 32A illustrates a portable information terminal including a main body 1001, a housing 1002, display portions 1003*a* and 1003*b*, and the like. The display portion 1003*b* is a touch panel. By touching a keyboard button 1004 displayed on the display portion 1003*b*, a screen can be operated, and text can be input. It is needless to say that the display portion 1003*a* may be a touch panel. A liquid crystal panel or an organic light-emitting panel is fabricated using any of the transistors described in the above embodiments as a switching element and used in the display portion 1003*a* or 1003*b*, whereby a highly reliable portable information terminal can be provided.

The portable information terminal illustrated in FIG. 32A can have a function of displaying a variety of information (e.g., a still image, a moving image, and a text image); a function of displaying a calendar, a date, the time, and the like on the display portion; a function of operating or editing the information displayed on the display portion; a function of controlling processing by various kinds of software (programs); and the like. Furthermore, an external connection terminal (an earphone terminal, a USB terminal, or the like), a recording medium insertion portion, and the like may be provided on the back surface or the side surface of the housing.

The portable information terminal illustrated in FIG. 32A may transmit and receive data wirelessly. Through wireless communication, desired book data or the like can be purchased and downloaded from an e-book server.

Figure 32B:
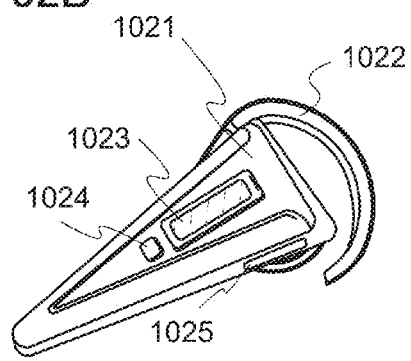

FIG. 32B illustrates a portable music player including, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is fabricated using any of the transistors described in the above embodiments as a switching element and used in the display portion 1023, whereby a highly reliable portable music player can be provided.

Furthermore, when the portable music player illustrated in FIG. 32B has an antenna, a microphone function, or a wireless communication function and is used with a mobile phone, a user can talk on the phone wirelessly in a hands-free way while driving a car or the like.

Figure 32C:
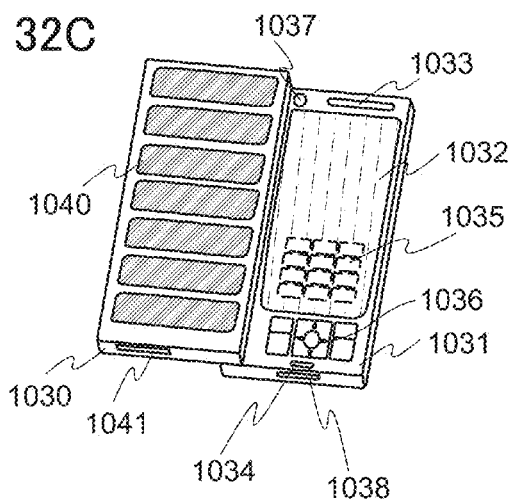

FIG. 32C illustrates a mobile phone, which includes two housings, a housing 1030 and a housing 1031. The housing 1031 includes a display panel 1032, a speaker 1033, a microphone 1034, a pointing device 1036, a camera 1037, an external connection terminal 1038, and the like. The housing 1030 is provided with a solar cell 1040 for charging the mobile phone, an external memory slot 1041, and the like. In addition, an antenna is incorporated in the housing 1031. Any of the transistors described in the above embodiments is used in the display panel 1032, whereby a highly reliable mobile phone can be provided.

Furthermore, the display panel 1032 includes a touch panel. A plurality of operation keys 1035 that are displayed as images are indicated by dotted lines in FIG. 32C. Note that a boosting circuit by which voltage output from the solar cell 1040 is increased to be sufficiently high for each circuit is also included.

In the display panel 1032, the direction of display is changed as appropriate depending on the application mode. In addition, the mobile phone has the camera 1037 and the display panel 1032 on the same surface side, and thus it can be used as a video phone. The speaker 1033 and the microphone 1034 can be used for videophone calls, recording, and playing sound, etc., as well as voice calls. Moreover, the housings 1030 and 1031 in a state where they are developed as illustrated in FIG. 32C can shift, to a state where one is lapped over the other by sliding. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. Furthermore by inserting a recording medium into the external memory slot 1041, a larger amount of data can be stored and moved.

In addition, in addition to the above functions, an infrared communication function, a television reception function, or the like may be provided.

Figure 32D:
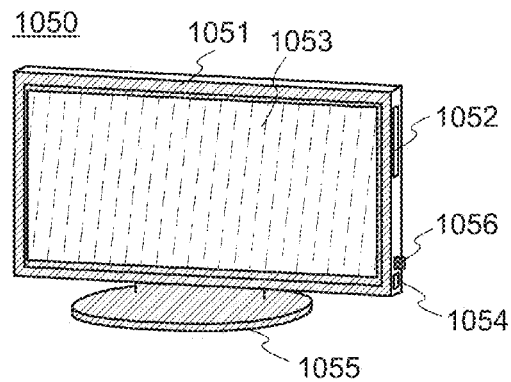

FIG. 32D illustrates an example of a television set. In a television set 1050, a display portion 1053 is incorporated in a housing 1051. Images can be displayed on the display portion 1053. Moreover, a CPU is incorporated in a stand 1055 supporting the housing 1051. Any of the transistors described in the above embodiments is used in the display portion 1053 and the CPU, whereby the television set 1050 can have high reliability.

The television set 1050 can be operated with an operation switch of the housing 1051 or a separate remote controller. In addition, the remote controller may be provided with a display portion for displaying data output from the remote controller.

Note that the television set 1050 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Furthermore, the television set 1050 is provided with an external connection terminal 1054, a storage medium recording and reproducing portion 1052, and an external memory slot. The external connection terminal 1054 can be connected to various types of cables such as a USB cable, and data communication with a personal computer or the like is possible. A disk storage medium is inserted into the storage medium recording and reproducing portion 1052, and reading data stored in the storage medium and writing data to the storage medium can be performed. In addition, an image, a video, or the like stored as data in an external memory 1056 inserted into the external memory slot can be displayed on the display portion 1053.

Furthermore, in the case where the off-state leakage current of the transistor described in the above embodiments is extremely small, when the transistor is used in the external memory 1056 or the CPU, the television set 1050 can have high reliability and sufficiently reduced power consumption.

Note that the structures, methods, and the like described in this embodiment can be used as appropriate in combination with any of the structures, methods, and the like described in the other embodiments.

REFERENCE NUMERALS

10: transistor, 10a: transistor, 10b: transistor, 11: substrate, 12: conductive film, 13: conductive film, 14: gate insulating film, 15: nitride insulating film, 16: oxide insulating film, 17: oxide insulating film, 18: oxide semiconductor film, 19a: oxide semiconductor film, 19b: pixel electrode, 19c: oxide semiconductor film, 19d: film, 19f: oxide semiconductor film, 19g: oxide semiconductor film, 20: conductive film, 21a: conductive film, 21b: conductive film, 21b_1: region, 21b_2: region, 21c: common line, 21d: conductive film, 21e: conductive film, 21f: conductive film, 21g: conductive film, 21h: conductive film, 21i: conductive film, 22: oxide insulating film, 23: oxide insulating film, 24: oxide insulating film, 25: oxide insulating film, 26: nitride insulating film, 27: nitride insulating film, 28: conductive film, 29: common electrode, 29a: common electrode, 29a_1: region, 29a_2: region, 29b: conductive film, 29c: conductive film, 29d: conductive film, 30: inorganic insulating film, 30a: inorganic insulating film, 31: organic insulating film, 31a: organic insulating film, 31b: organic insulating film, 31c: organic insulating film, 33: alignment film, 37a: multilayer film, 37b: multilayer film, 38a: multilayer film, 38b: multilayer film, 39a: oxide semiconductor film, 39b: oxide semiconductor film, 40: opening, 41: opening, 41a: opening, 42: opening, 49a: oxide semiconductor film, 49b: oxide semiconductor film, 70: electron gun chamber, 72: optical system, 74: sample chamber, 76: optical system, 78: camera, 80: observation chamber, 82: film chamber, 84: electron, 88: substance, 92: fluorescent plate, 101: pixel portion, 102: transistor, 102a: transistor, 102b: transistor, 102c: transistor, 103: pixel, 103a: pixel, 103b: pixel, 103c: pixel, 104: scan line driver circuit, 105: capacitor, 105a: capacitor, 105b: capacitor, 105c: capacitor, 106: signal line driver circuit, 107: scan line, 109: signal line, 115: capacitor line, 121: liquid crystal element, 131: light-emitting element, 133: transistor, 135: transistor, 137: wiring, 139: wiring, 141: wiring, 320: liquid crystal layer, 322: liquid crystal element, 322a: liquid crystal element, 342: substrate, 344: light-blocking film, 346: coloring film, 348: insulating film, 350: conductive film, 352: alignment film, 1001: main body, 1002: housing, 1003a: display portion, 1003b: display portion, 1004: keyboard button, 1021: main body, 1022: fixing portion, 1023: display portion, 1024: operation button, 1025: external memory slot, 1030: housing, 1031: housing, 1032: display panel, 1033: speaker, 1034: microphone, 1035: operation key, 1036: pointing device, 1037: camera, 1038: external connection terminal, 1040: solar cell, 1041: external memory slot, 1050: television set, 1051: housing, 1052: storage medium recording and reproducing portion, 1053: display portion, 1054: external connection terminal, 1055: stand, 1056: external memory, 8000: display module, 8001: upper cover, 8002: lower cover, 8003: FPC, 8004: touch panel, 8005: FPC, 8006: display panel, 8007: backlight unit, 8008: light source, 8009: frame, 8010, printed board, and 8011: battery.

This application is based on Japanese Patent Application serial no. 2013-219516 filed with Japan Patent Office on Oct. 22, 2013 and Japanese Patent Application serial no. 2014-047260 filed with Japan Patent Office on Mar. 11, 2014, the entire contents of which are hereby incorporated by reference.

The invention claimed is:

1. A display device comprising:
   a transistor over a first substrate;
   an inorganic insulating film over the transistor;
   an organic insulating film on and in contact with the inorganic insulating film; and
   a pixel electrode on and in contact with the inorganic insulating film, the pixel electrode electrically connected to the transistor,
   wherein the transistor comprises:
      a gate electrode over the first substrate;
      an oxide semiconductor film over the gate electrode; and
      a gate insulating film between the gate electrode and the oxide semiconductor film,
   wherein an upper surface of the oxide semiconductor film is in contact with the inorganic insulating film,
   wherein the organic insulating film overlaps with the oxide semiconductor film with the inorganic insulating film provided therebetween, and
   wherein an end portion of the gate electrode is positioned on an outer side of an end portion of the organic insulating film.

2. The display device according to claim 1, further comprising:
   a second substrate overlapping with the first substrate; and
   a liquid crystal layer between the organic insulating film and the second substrate,
   wherein the transistor and the organic insulating film are provided between the first substrate and the second substrate.

3. The display device according to claim 1, further comprising:
   a second substrate overlapping with the first substrate; and
   a liquid crystal layer between the pixel electrode and the second substrate,
   wherein the transistor and the organic insulating film are provided between the first substrate and the second substrate, and
   wherein the liquid crystal layer is not provided between the organic insulating film and the second substrate.

4. The display device according to claim 1,
wherein a thickness of the organic insulating film is greater than or equal to 500 nm and less than or equal to 10 μm.

5. The display device according to claim 1,
wherein the inorganic insulating film comprises an oxide insulating film in contact with the upper surface of the oxide semiconductor film and a nitride insulating film on and in contact with the oxide insulating film.

6. The display device according to claim 1,
wherein, in a plan view, the organic insulating film completely overlaps with the oxide semiconductor film.

7. A display device comprising:
a transistor over a first substrate;
an inorganic insulating film over the transistor;
an organic insulating film on and in contact with the inorganic insulating film;
a pixel electrode electrically connected to the transistor; and
a capacitor electrically connected to the transistor,
wherein the transistor comprises:
  a gate electrode over the first substrate;
  an oxide semiconductor film over the gate electrode; and
  a gate insulating film between the gate electrode and the oxide semiconductor film,
wherein an upper surface of the oxide semiconductor film is in contact with the inorganic insulating film,
wherein the organic insulating film overlaps with the oxide semiconductor film with the inorganic insulating film provided therebetween,
wherein an end portion of the gate electrode is positioned on an outer side of an end portion of the organic insulating film,
wherein the capacitor comprises the pixel electrode, the inorganic insulating film and a metal oxide film,
wherein the pixel electrode comprises a light-transmitting conductive material and the pixel electrode overlaps with the metal oxide film with the inorganic insulating film provided therebetween, and
wherein the metal oxide film contains the same metal element as the oxide semiconductor film and an upper surface of the metal oxide film is in contact with the inorganic insulating film.

8. The display device according to claim 7, further comprising:
a second substrate overlapping with the first substrate; and
a liquid crystal layer between the organic insulating film and the second substrate,
wherein the transistor and the organic insulating film are provided between the first substrate and the second substrate.

9. The display device according to claim 7, further comprising:
a second substrate overlapping with the first substrate; and
a liquid crystal layer between the pixel electrode and the second substrate,
wherein the transistor and the organic insulating film are provided between the first substrate and the second substrate, and
wherein the liquid crystal layer is not provided between the organic insulating film and the second substrate.

10. The display device according to claim 7, wherein a thickness of the organic insulating film is greater than or equal to 500 nm and less than or equal to 10 μm.

11. The display device according to claim 7,
wherein the inorganic insulating film comprises an oxide insulating film in contact with the upper surface of the oxide semiconductor film and a nitride insulating film on and in contact with the oxide insulating film.

12. The display device according to claim 7,
wherein, in a plan view, the organic insulating film completely overlaps with the oxide semiconductor film.

13. The display device according to claim 7, further comprising,
a pair of electrodes in contact with the oxide semiconductor film,
wherein one of the pair of electrodes electrically connected to the pixel electrode.

14. A display device comprising:
a transistor over a first substrate;
an inorganic insulating film over the transistor;
an organic insulating film on and in contact with the inorganic insulating film;
a pixel electrode electrically connected to the transistor;
a capacitor electrically connected to the transistor,
wherein the transistor comprises:
  a gate electrode over the first substrate;
  an oxide semiconductor film over the gate electrode; and
  a gate insulating film between the gate electrode and the oxide semiconductor film,
wherein an upper surface of the oxide semiconductor film is in contact with the inorganic insulating film,
wherein the organic insulating film overlaps with the oxide semiconductor film with the inorganic insulating film provided therebetween,
wherein an end portion of the gate electrode is positioned on an outer side of an end portion of the organic insulating film,
wherein the capacitor comprises the pixel electrode, the inorganic insulating film and a light-transmitting conductive film,
wherein the pixel electrode is provided over the gate insulating film and contains the same metal element as the oxide semiconductor film, and
wherein the light-transmitting conductive film overlaps with the pixel electrode with the inorganic insulating film provided therebetween and the light-transmitting conductive film functions as a common electrode.

15. The display device according to claim 14, further comprising:
a second substrate overlapping with the first substrate; and
a liquid crystal layer between the organic insulating film and the second substrate,
wherein the transistor and the organic insulating film are provided between the first substrate and the second substrate.

16. The display device according to claim 14, further comprising:
a second substrate overlapping with the first substrate; and
a liquid crystal layer between the pixel electrode and the second substrate,
wherein the transistor and the organic insulating film are provided between the first substrate and the second substrate, and
wherein the liquid crystal layer is not provided between the organic insulating film and the second substrate.

17. The display device according to claim 14 wherein a thickness of the organic insulating film is greater than or equal to 500 nm and less than or equal to 10 μm.

18. The display device according to claim 14,
wherein the inorganic insulating film comprises an oxide insulating film in contact with the upper surface of the oxide semiconductor film and a nitride insulating film on and in contact with the oxide insulating film.

19. The display device according to claim 14,
wherein, in a plan view, the organic insulating film completely overlaps with the oxide semiconductor film.

20. The display device according to claim 14, further comprising,
a pair of electrodes in contact with the oxide semiconductor film,
wherein one of the pair of electrodes electrically connected to the pixel electrode.

* * * * *